(12) United States Patent
Yamazaki

(10) Patent No.: US 8,513,678 B2
(45) Date of Patent: Aug. 20, 2013

(54) LIGHT-EMITTING DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/149,979

(22) Filed: May 12, 2008

(65) Prior Publication Data

US 2009/0114926 A1    May 7, 2009

(30) Foreign Application Priority Data

May 18, 2007  (JP) ................................. 2007-132803

(51) Int. Cl.
*H01L 33/00* (2010.01)

(52) U.S. Cl.
USPC .................. 257/79; 257/88; 257/40; 257/103

(58) Field of Classification Search
USPC .................................. 257/79, 40, 88, 98, 103
See application file for complete search history.

(56) References Cited

U.S. PATENT DOCUMENTS

| | | | |
|---|---|---|---|
| 5,374,564 A | 12/1994 | Bruel | |
| 5,663,077 A | 9/1997 | Adachi et al. | |
| 5,966,594 A | 10/1999 | Adachi et al. | |
| 6,013,563 A | 1/2000 | Henley et al. | |
| 6,107,116 A * | 8/2000 | Kariya et al. | 438/87 |
| 6,210,997 B1 | 4/2001 | Adachi et al. | |
| 6,242,320 B1 | 6/2001 | So | |
| 6,271,101 B1 | 8/2001 | Fukunaga | |
| 6,312,797 B1 | 11/2001 | Yokokawa et al. | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,465,284 B1 | 10/2002 | Adachi et al. | |
| 6,541,130 B2 | 4/2003 | Fukuda | |
| 6,583,440 B2 | 6/2003 | Yasukawa | |

(Continued)

FOREIGN PATENT DOCUMENTS

| | | |
|---|---|---|
| EP | 1052708 A | 11/2000 |
| JP | 07-066426 A | 3/1995 |

(Continued)

OTHER PUBLICATIONS

Lu, F et al., "Ion-Cutting of Si Onto Glass by Pulsed and Direct-Current Plasma Immersion Ion Implantation," J. Vac. Sci. Technol. B (Journal of Vacuum Science & Technology B), 2003, vol. 21, No. 5, pp. 2109-2113.

*Primary Examiner* — Marcos D. Pizarro
*Assistant Examiner* — Tifney L Skyles
(74) *Attorney, Agent, or Firm* — Eric J. Robinson; Robinson Intellectual Property Law Offie, P.C.

(57) ABSTRACT

A light-emitting device includes a pixel having a transistor provided over a substrate, and a light-emitting element. The transistor includes a single-crystal semiconductor layer which forms a channel formation region, a silicon oxide layer is provided between the substrate and the single-crystal semiconductor layer, a source or a drain of the transistor is electrically connected to an electrode of the light-emitting element, and the transistor is operated in a saturation region when the light-emitting element emits light. Further, in the light-emitting device, a gray scale of the light-emitting element is displayed by changing a potential applied to the gate of the transistor.

27 Claims, 40 Drawing Sheets

(56) References Cited

U.S. PATENT DOCUMENTS

| | | |
|---|---|---|
| 6,803,264 B2 | 10/2004 | Yamazaki et al. |
| 6,811,808 B2 | 11/2004 | Ohshita et al. |
| 6,818,921 B2 | 11/2004 | Yasukawa |
| 6,879,110 B2 | 4/2005 | Koyama |
| 6,963,173 B2 | 11/2005 | Kawachi et al. |
| 7,112,514 B2 | 9/2006 | Yasukawa |
| 7,119,365 B2 | 10/2006 | Takafuji et al. |
| 7,158,104 B2 | 1/2007 | Koyama |
| 7,176,528 B2 | 2/2007 | Couillard et al. |
| 7,187,120 B2 | 3/2007 | Ohshita et al. |
| 7,224,333 B2 | 5/2007 | Yamazaki et al. |
| 7,229,703 B2 | 6/2007 | Kawashima et al. |
| 7,442,428 B2 | 10/2008 | Kawashima et al. |
| 7,470,933 B2 | 12/2008 | Lee et al. |
| 7,473,592 B2 | 1/2009 | Yamazaki et al. |
| 7,473,971 B2 | 1/2009 | Yamazaki et al. |
| 7,476,576 B2 | 1/2009 | Yamazaki et al. |
| 7,518,146 B2 | 4/2009 | Yamazaki et al. |
| 7,601,988 B2 | 10/2009 | Seo et al. |
| 7,632,739 B2 | 12/2009 | Hebras |
| 7,638,805 B2 | 12/2009 | Yamazaki et al. |
| 7,642,598 B2 | 1/2010 | Yamazaki et al. |
| 7,875,893 B2 | 1/2011 | Seo et al. |
| RE42,097 E | 2/2011 | Yamazaki et al. |
| RE42,139 E | 2/2011 | Yamazaki et al. |
| RE42,241 E | 3/2011 | Yamazaki et al. |
| 8,035,583 B2 | 10/2011 | Koyama |
| 8,188,491 B2 | 5/2012 | Seo et al. |
| 2003/0185970 A1 | 10/2003 | Ohshita et al. |
| 2005/0139839 A1* | 6/2005 | Park .................................. 257/79 |
| 2005/0173709 A1* | 8/2005 | Lee et al. ........................ 257/79 |
| 2006/0038228 A1 | 2/2006 | Aitken et al. |
| 2006/0099773 A1 | 5/2006 | Maa et al. |
| 2006/0110899 A1 | 5/2006 | Bourdelle et al. |
| 2007/0002084 A1* | 1/2007 | Kimura et al. ................ 345/694 |
| 2007/0020947 A1 | 1/2007 | Daval et al. |
| 2007/0154735 A1 | 7/2007 | Nakayama |
| 2008/0054269 A1 | 3/2008 | Yamazaki et al. |
| 2008/0070335 A1 | 3/2008 | Yamazaki et al. |
| 2008/0246109 A1 | 10/2008 | Ohnuma et al. |
| 2009/0051674 A1 | 2/2009 | Kimura et al. |
| 2009/0236698 A1 | 9/2009 | Yamazaki et al. |
| 2009/0267076 A1 | 10/2009 | Yamazaki et al. |
| 2012/0092236 A1 | 4/2012 | Koyama |
| 2012/0205688 A1 | 8/2012 | Seo et al. |

FOREIGN PATENT DOCUMENTS

| | | |
|---|---|---|
| JP | 2000-150905 A | 5/2000 |
| JP | 2000-323277 A | 11/2000 |
| JP | 2001-077044 A | 3/2001 |
| JP | 2001-237068 A | 8/2001 |
| JP | 2002-108285 A | 4/2002 |
| JP | 2003-172950 A | 6/2003 |
| JP | 2003-280587 | 10/2003 |
| JP | 2004-303562 A | 10/2004 |
| JP | 2005-004183 A | 1/2005 |
| JP | 2005-209421 A | 8/2005 |
| JP | 2005-252244 A | 9/2005 |
| JP | 2006-005328 A | 1/2006 |
| JP | 2006-156344 A | 6/2006 |
| JP | 2006-269670 A | 10/2006 |
| WO | WO-2006/033472 | 3/2006 |

* cited by examiner

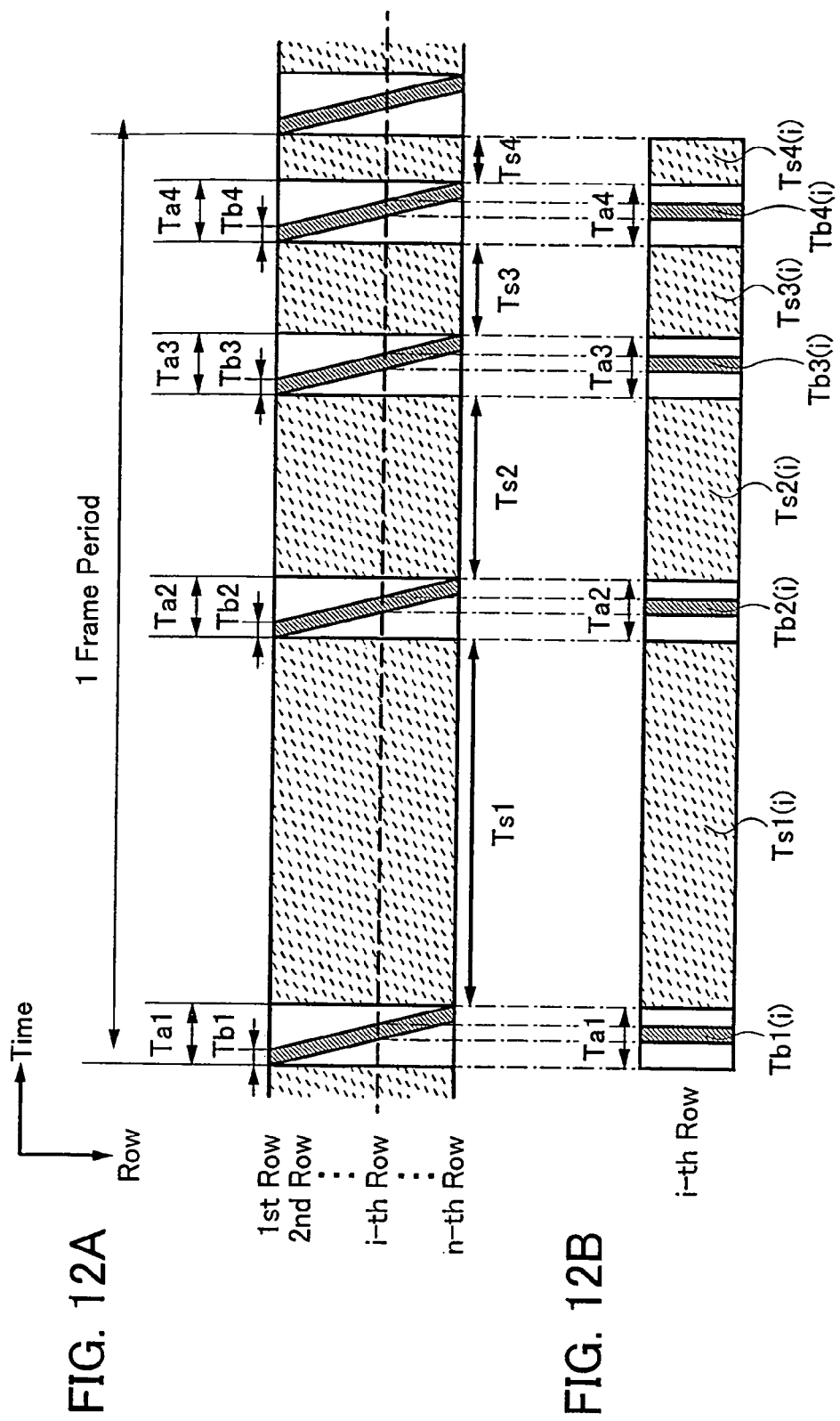

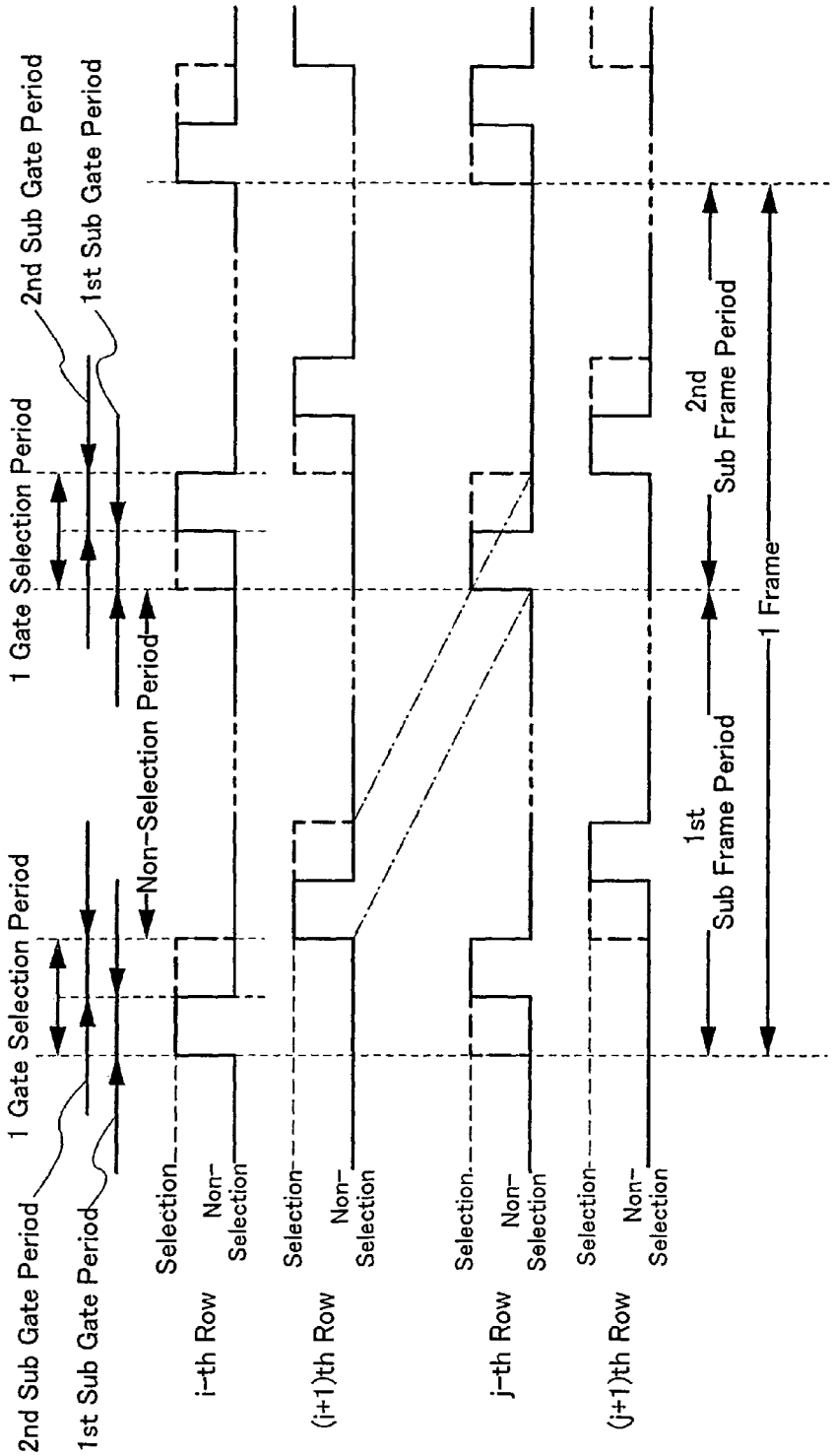

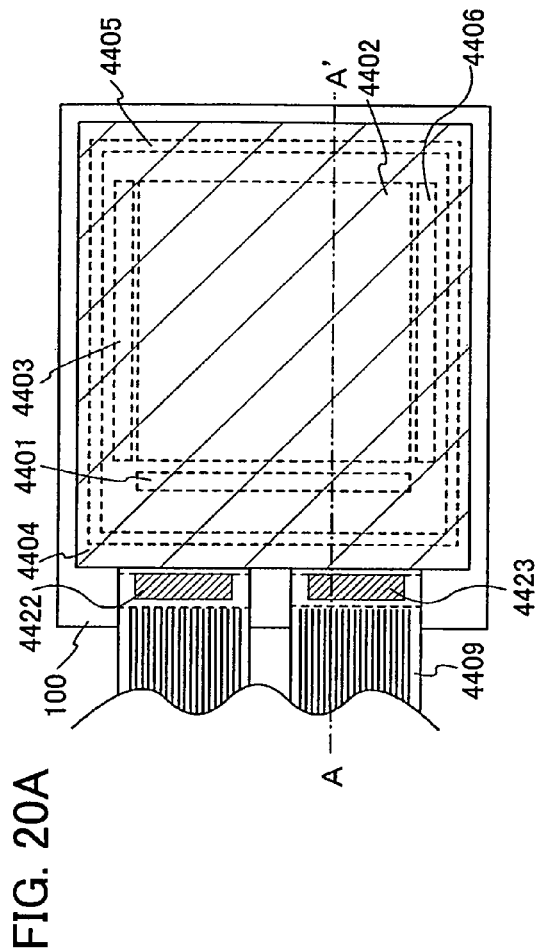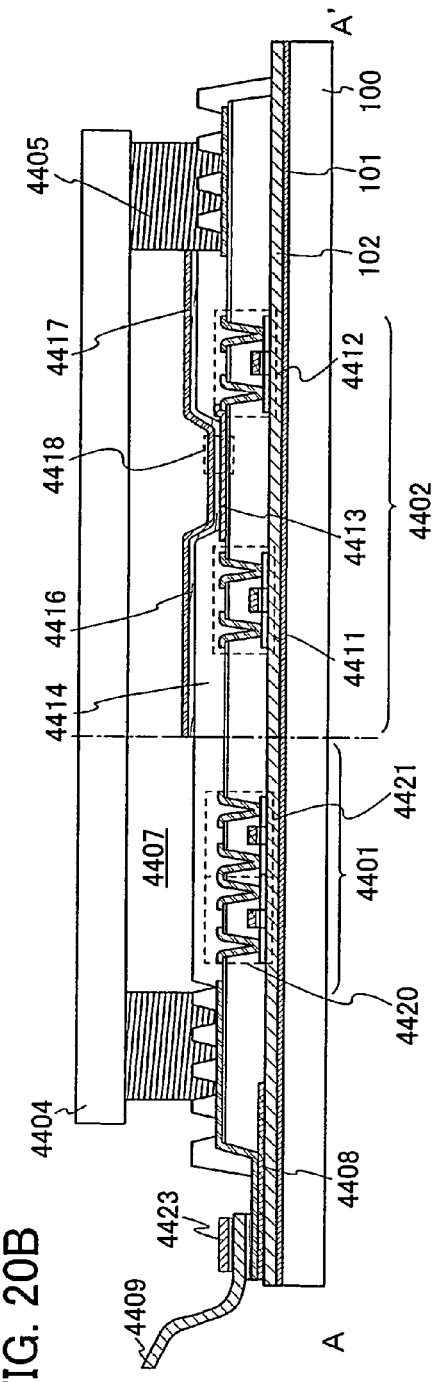
FIG. 20A
FIG. 20B

Fig. 40

| Accelerating Voltage | Hydrogen Atom (H) Ratios (X : Y) | Hydrogen Ion Species Ratios (X : Y/3) |
|---|---|---|
| 80 k V | 1 : 44.1 | 1 : 14.7 |
| 60 k V | 1 : 42.5 | 1 : 14.2 |
| 40 k V | 1 : 43.5 | 1 : 14.5 |

LIGHT-EMITTING DEVICE

BACKGROUND OF THE INVENTION

1. Field of the Invention

The present invention relates to a light-emitting device. In specific, the present invention relates to a light-emitting device in which a transistor included in a pixel uses a single-crystal semiconductor layer as a channel formation region.

2. Description of the Related Art

In recent years, technology to form a TFT over a substrate has greatly progressed, and application development for an active matrix display device has been promoted. In particular, since the field effect mobility (also called mobility) of a TFT using a polysilicon film is higher than that of a TFT using a conventional amorphous silicon film, high speed operation is possible. Therefore, development for controlling each pixel by providing a driver circuit including a TFT formed using a polysilicon film over the same substrate as the pixel is actively carried out. It is expected that, in an active matrix display device in which a driver circuit is provided over the same substrate as the pixel, various advantages can be obtained such as reduction in manufacturing cost and the size of the display device, increase in yield, and reduction in throughput.

On the other hand, TFTs formed using polysilicon have a problem that electric characteristics are likely to vary between the TFTs due to defects at crystal grain boundaries. If characteristics such as mobility or threshold values of TFTs included in pixels vary between each pixel, the amount of drain current of the TFTs varies between each pixel in accordance with the variation even when the same video signal is input. Thus, luminance of light-emitting elements also varies, resulting in display unevenness in a light-emitting device.

In order to solve such a problem, a driving method has been proposed in which the amount of current passing through an EL element can be controlled without depending on characteristics of a TFT. For example, a driving method is proposed in Reference 1 (Japanese Published Patent Application No. 2003-280587) in which constant-current driving and constant-voltage driving are switched in accordance with display.

However, as described above, there is a problem in that variation in characteristics of TFTs adversely affects display of the light-emitting device in the case where constant-current driving is performed using a TFT formed using polysilicon. In constant-voltage driving, current passing through a light-emitting element changes in accordance with a change in electric resistance of the light-emitting element which accompanies temperature change or deterioration of the light-emitting element. There is a problem in that luminance changes in accordance with a change in current since luminance of the light-emitting element is proportional to current.

SUMMARY OF THE INVENTION

It is an object of the present invention to provide a light-emitting device which suppresses display unevenness. It is another object of the present invention to provide a light-emitting device in which variation in characteristics of transistors between different pixels is reduced. It is still another object of the present invention to provide a light-emitting device which suppresses decrease in luminance which accompanies deterioration of a light-emitting element or the like.

One aspect of the present invention includes a light-emitting device having a pixel having a transistor provided over a substrate, and a light-emitting element. In the light-emitting device, the transistor includes a single-crystal semiconductor layer which forms a channel formation region, a silicon oxide layer is provided between the substrate and the single-crystal semiconductor layer, a source or a drain of the transistor is electrically connected to an electrode of the light-emitting element, and the transistor operates in a saturation region when the light-emitting element emits light. Further, in the light-emitting device, a gray scale of the light-emitting element is displayed by changing a potential applied to the gate of the transistor.

Another aspect of the present invention includes a light-emitting device having a scanning line, a signal line, a power supply line, and a pixel. In the light-emitting device, the pixel includes a first transistor and a second transistor which are provided over a substrate, and a light-emitting element. A gate electrode of the first transistor is electrically connected to the scanning line, one of a source and a drain of the first transistor is electrically connected to a signal line, and the other of the source and the drain of the first transistor is electrically connected to a gate of the second transistor. A gate electrode of the second transistor is electrically connected to the other of the source and the drain of the first transistor, one of a source and a drain of the second transistor is electrically connected to the power supply line, and the other of the source and the drain of the second transistor is connected to an electrode of the light-emitting element. In the light-emitting device, the first transistor and the second transistor each include a single-crystal semiconductor layer which forms a channel formation region, a silicon oxide layer is provided between the substrate and the single-crystal semiconductor layer, and the second transistor operates in a saturation region when the light-emitting element emits light. Further, in the light-emitting device, a gray scale of the light-emitting element is displayed by changing a potential applied to the gate of the second transistor.

In the above-described structure of the light-emitting device of the present invention, a nitrogen-containing layer is provided between the silicon oxide layer and the single-crystal semiconductor layer.

In the above-described structure of the light-emitting device of the present invention, the silicon oxide layer is deposited using organosilane as a source gas by a chemical vapor deposition method.

When a channel formation region of the transistor provided in the pixel is formed using a single-crystal semiconductor layer, a light-emitting device can be provided in which variation in characteristics of transistors between different pixels is reduced and thus display unevenness is suppressed. In the pixel, a channel formation region of the transistor connected to the light-emitting element is formed using a single-crystal semiconductor layer and the transistor is operated in the saturation region when the light-emitting element emits light. Accordingly, change in luminance which accompanies deterioration of the light-emitting element or the like can be suppressed.

BRIEF DESCRIPTION OF THE DRAWINGS

In the accompanying drawings:

FIGS. 12A and 12B are views illustrating an operation of a light-emitting device of the present invention;

FIG. 17 is a view illustrating an operation of a light-emitting device of the present invention;

FIGS. 20A and 20B are a top view and a cross-sectional view, respectively, which show an example of a structure of a light-emitting device of the present invention;

FIG. 40 is a list of ratios of fitting parameters (hydrogen atom ratios and hydrogen ion species ratios).

DETAILED DESCRIPTION OF THE INVENTION

Embodiment Mode

Figure 1A:
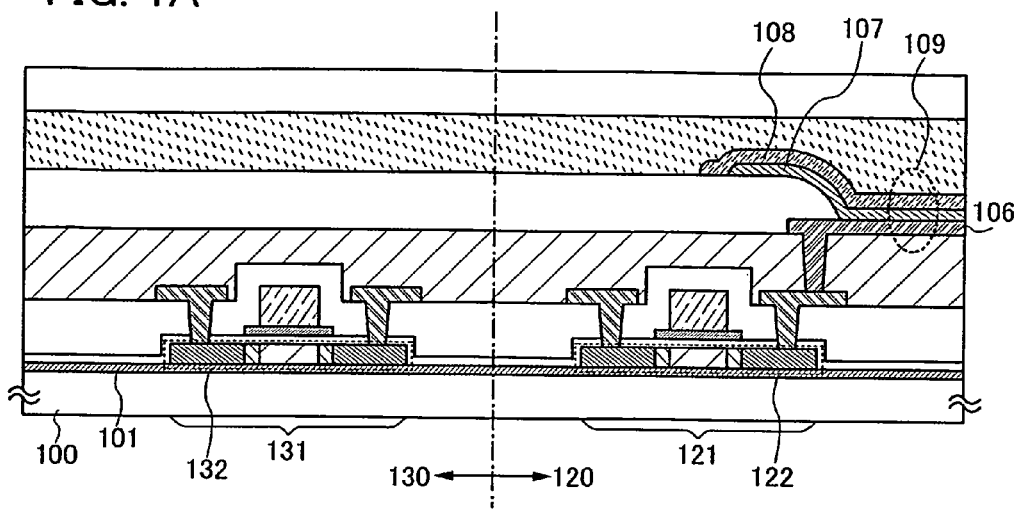
FIGS. 1A and 1B are cross-sectional views each showing an example of a structure of a light-emitting device of the present invention.

Embodiment modes of the present invention will be described below with reference to the drawings. However, the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of the embodiment modes given below. It is to be noted that the same portion or a portion having the same function is denoted by the same reference numeral in all drawings of this specification, and the repetitive explanation thereof may be omitted.

Embodiment Mode 1

This embodiment mode describes an example of the structure of a light-emitting device and a method for manufacturing the light-emitting device with reference to the drawings. A light-emitting device described in this embodiment mode uses an SOI (silicon on insulator) substrate. The SOI substrate can be formed by a bonding SOI technique. A light-emitting device manufactured using an SOI substrate in which a single-crystal semiconductor layer is bonded to a substrate having an insulating surface, such as glass, is described with reference to the drawings.

Figure 1B:
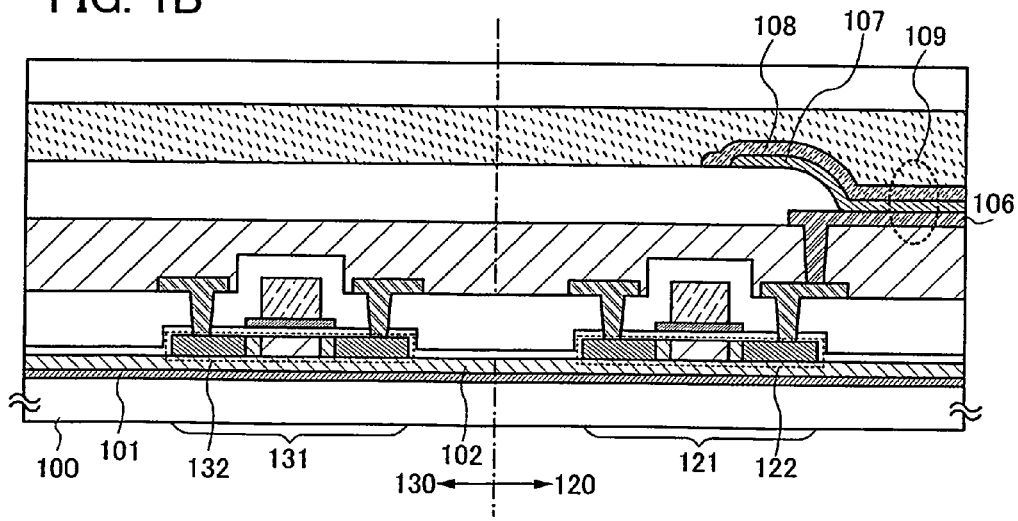

The structures of light-emitting devices in this embodiment mode are described with reference to FIGS. 1A and 1B. FIGS. 1A and 1B each show a pixel portion of a light-emitting device and a driver circuit portion which controls operation of the pixel portion.

A light-emitting device shown in FIG. 1A is provided with a transistor 121 included in a pixel portion 120 and a transistor 131 included in a driver circuit portion 130 over a substrate 100. The pixel portion 120 is provided with a light-emitting element 109 including a pixel electrode 106, a layer 107 including an organic compound (also referred to as an organic thin film or an organic EL layer), and a counter electrode 108. The pixel electrode 106 is provided to be electrically connected to a source or a drain of the transistor 121, and the layer 107 including an organic compound is provided between the pixel electrode 106 and the counter electrode 108.

In the light-emitting device shown in FIG. 1A, the transistor 121 provided in the pixel portion 120 includes a single-crystal semiconductor layer 122 which forms a channel formation region, and the transistor 131 provided in the driver circuit portion 130 includes a single-crystal semiconductor layer 132 which forms a channel formation region. That is, a light-emitting device described in this embodiment mode is driven by a transistor in which a single-crystal semiconductor layer is used as a channel formation region.

In order to bond the substrate 100 and the single-crystal semiconductor layer 122 to each other, at least an insulating layer (hereinafter referred to as a "bonding layer 101") is provided between the substrate 100 and the single-crystal semiconductor layer 122. Further, in order to bond the substrate 100 and the single-crystal semiconductor layer 132 to each other, at least the bonding layer 101 is provided between the substrate 100 and the single-crystal semiconductor layer 132.

A substrate having an insulating surface is used as the substrate 100. In specific, any of a variety of glass substrates that are used in the electronics industry, such as aluminosilicate glass substrates, aluminoborosilicate glass substrates, and barium borosilicate glass substrates; quartz substrates, ceramic substrates, or sapphire substrates can be used for the substrate 100. As the substrate 100, a glass substrate is preferably used. For example, a large-area mother glass substrate which is called a sixth generation substrate (1500 mm×1850 mm), a seventh generation substrate (1870 mm×2200 mm), or an eighth generation substrate (2200 mm×2400 mm) is used, whereby productivity can be improved.

The bonding layer 101 may have a single layer structure or a stacked structure, and an insulating layer in which a surface which forms a bond with the substrate 100 (hereinafter also referred to as a "bonding surface") has a smooth surface and becomes a hydrophilic surface is preferably used. A silicon oxide layer is suitable for the insulating layer which has a smooth surface and can form a hydrophilic surface. In particular, a silicon oxide layer manufactured using organosilane by a chemical vapor deposition method is preferable. When the silicon oxide layer formed using organosilane is used, a bond between the substrate 100 and the single-crystal semiconductor layer 122 and between the substrate 100 and the single-crystal semiconductor layer 132 can be made strong. Accordingly, separation between the substrate 100 and the single-crystal semiconductor layer 122 and between the substrate 100 and the single-crystal semiconductor layer 132 can be suppressed.

Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

Single-crystal silicon can be typically used for the single-crystal semiconductor layers 122 and 132. Alternatively, a crystalline semiconductor layer of germanium or a compound semiconductor such as gallium arsenide or indium phosphide can be used.

The light-emitting device described in this embodiment mode preferably has a structure provided with an insulating layer including nitrogen (hereinafter referred to as a "nitrogen-containing layer 102") between the bonding layer 101 and the single-crystal semiconductor layer 122 and between the bonding layer 101 and the single-crystal semiconductor layer 132, as shown in FIG. 1B. The nitrogen-containing layer 102 can serve as a barrier layer for preventing impurities such as mobile ions or moisture included in the substrate 100 from diffusing into the single-crystal semiconductor layers included in the transistors 121 and 131. For example, in the case of using a glass substrate as the substrate 100, an alkali metal such as sodium or an alkaline-earth metal which is included in glass may be mixed into the single-crystal semiconductor layers 122 and 132, which may have an adverse effect on the characteristics of the transistors 121 and 131. However, the adverse effect can be prevented by provision of the nitrogen-containing layer 102.

The structure shown in FIG. 1B can be obtained as follows: the nitrogen-containing layer 102 and the bonding layer 101 are stacked over a surface of a single-crystal semiconductor substrate in advance, the bonding layer 101 and the substrate 100 are bonded to each other, and then the single-crystal semiconductor layers are separated from the single-crystal semiconductor substrate.

The nitrogen-containing layer 102 is formed to have a single layer structure or a stacked structure using a silicon nitride layer, a silicon nitride oxide layer, or a silicon oxynitride layer. For example, a silicon nitride oxide layer and a silicon oxynitride layer are stacked from the bonding layer 101 side, whereby the nitrogen-containing layer 102 can be obtained. The bonding layer 101 is provided in order to form a bond between the substrate 100 and the single-crystal semiconductor layer 122 and between the substrate 100 and the single-crystal semiconductor layer 132, whereas the nitrogen-containing layer 102 is provided in order to prevent impurities such as mobile ions or moisture which are included in the substrate 100 from diffusing into the single-crystal semiconductor layers 122 and 132.

It is to be noted that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. It is to be noted that percentages of nitrogen, oxygen, silicon, and hydrogen fall within the ranges given above, where the total number of atoms contained in the silicon oxynitride layer or the silicon nitride oxide layer is defined as 100 at. %.

Figure 2:
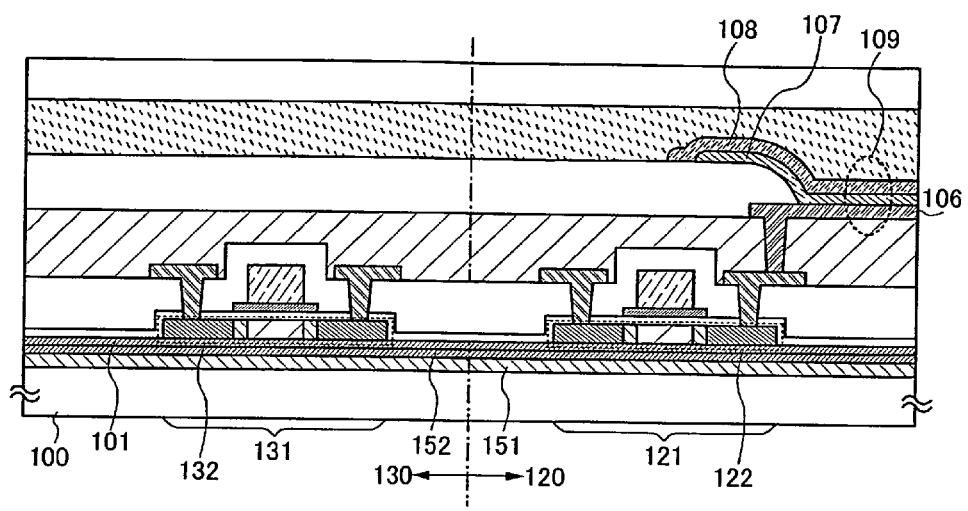
FIG. 2 is a cross-sectional view showing one example of a structure of a light-emitting device of the present invention.

The light-emitting device shown in FIG. 2 has a structure provided with a stacked structure of a nitrogen-containing layer 151, a bonding layer 152, and the bonding layer 101 between the substrate 100 and the single-crystal semiconductor layer 122 and between the substrate 100 and the single-crystal semiconductor layer 132. In this case, the bonding layer 101 is formed over a surface of a single-crystal semiconductor substrate in advance and the nitrogen-containing layer 151 and the bonding layer 152 are formed over a surface of the substrate 100 in advance, and the bonding layers 101 and 152 are bonded to each other; then, the single-crystal semiconductor layers are separated from the single-crystal semiconductor substrate, and then, a light-emitting device is manufactured using the single-crystal semiconductor layers formed over the substrate 100.

In this case, as the bonding layer 101 provided over the surface of the single-crystal semiconductor substrate, a silicon oxide layer formed by a thermal oxidation method may be used. Alternatively, as the bonding layer 101, a silicon oxide layer formed using chemical oxide may be used. Chemical oxide may be obtained by treating a surface of the single-crystal semiconductor substrate using water containing ozone, for example. A silicon oxide layer obtained by use of a chemical oxide reflects flatness of the single-crystal semiconductor substrate; accordingly, a flat silicon oxide layer can be formed with the use of a single-crystal semiconductor substrate with a flat surface.

By bonding of the bonding layers to each other in bonding the substrate 100 and the single-crystal semiconductor layers in this manner, a stronger bond between the substrate 100 and the single-crystal semiconductor layers can be formed.

The nitrogen-containing layer 151 may be formed using an insulating layer including nitrogen. For example, the nitrogen-containing layer 151 is formed to have a single layer structure or a stacked structure using a silicon nitride layer, a silicon nitride oxide layer, or a silicon oxynitride layer.

The bonding layer 152 can be formed using a silicon oxide layer. In particular, the bonding layer 152 is preferably formed using a silicon oxide layer formed using organosilane by a chemical vapor deposition method.

In the light-emitting devices shown in FIGS. 1A and 1B and FIG. 2, the structures of the transistors 121 and 131 can have various modes without limitation to certain structures. For example, a multi-gate structure having two or more gate electrodes may be used. When the multi-gate structure is used, a structure where a plurality of transistors is connected in series is provided because channel formation regions are connected in series. With the use of the multi-gate structure, off-current can be reduced and the withstand voltage of the transistor can be increased to improve reliability. Further, with the multi-gate structure, drain-source current does not change so much even if drain-source voltage changes when the transistor operates in the saturation region, so that characteristics can be obtained in which a slope of voltage-current characteristics is flat. By utilizing the characteristics in which a slope of voltage-current characteristics is flat, an ideal current source circuit or an active load having extremely high resistance can be realized. Accordingly, a differential circuit or a current mirror circuit which has excellent properties can be realized. In addition, a structure where gate electrodes are disposed above and below a channel may be used. With the use of the structure where gate electrodes are disposed above and below the channel, a channel region is enlarged, so that the amount of current passing therethrough can be increased or a depletion layer can be easily formed to decrease an S swing. When the gate electrodes are provided above and below the channel, a structure where a plurality of transistors is connected in parallel is provided.

Further, a source electrode or a drain electrode may overlap with a channel formation region (or part of it). With the use of the structure where the source electrode or the drain electrode overlaps with the channel formation region (or part of it), unstable operation due to accumulation of charges in part of the channel formation region can be prevented. Further, an LDD region may be provided. When the LDD region is provided, off-current can be reduced or the withstand voltage of the transistor can be increased to improve reliability. Alternatively, when the LDD region is provided, drain-source current does not change so much even if drain-source voltage changes when the transistor operates in the saturation region, so that characteristics can be obtained in which a slope of voltage-current characteristics is flat.

The light-emitting device described in this embodiment mode uses a single-crystal semiconductor layer as a semiconductor layer serving as a channel formation region of a transistor. Therefore, as compared to the case where a transistor is formed using polycrystalline silicon (polysilicon (p-Si)), characteristics of transistors included in pixels, such as mobility or a threshold value, can be prevented from varying between each pixel. Consequently, even in the case where the light-emitting device is driven by constant-current driving as described later, display unevenness of the light-emitting device which accompanies characteristics of a transistor can be suppressed.

Next, a method for manufacturing the above-described light-emitting device is described with reference to the drawings. Here, a method for manufacturing the light-emitting device having the structure shown in FIG. 1B is described with reference to FIGS. 3A to 7B.

First, a method for manufacturing an SOI substrate used in the light-emitting device is described.

Figure 3A:
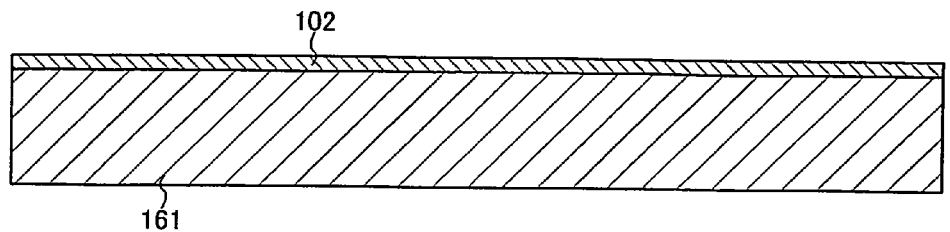
FIGS. 3A to 3D are cross-sectional views showing an example of a method for manufacturing a light-emitting device of the present invention.

A semiconductor substrate 161 is prepared, and a nitrogen-containing layer 102 is formed over a surface of the semiconductor substrate 161 (see FIG. 3A).

As the semiconductor substrate 161, a commercial semiconductor substrate can be used; for example, a single-crystal silicon substrate, a single-crystal germanium substrate, and a compound semiconductor substrate of gallium arsenide, indium phosphide, and the like can be used. As commercial silicon substrates, typically, substrates which are 5 inches in diameter (125 mm), 6 inches in diameter (150 mm), 8 inches in diameter (200 mm), and 12 inches in diameter (300 mm) are given, which are generally circular. In addition, the thickness of the silicon substrate can be selected from up to about 1.5 mm as appropriate.

The nitrogen-containing layer 102 is formed to have a single layer structure or a stacked structure using a silicon nitride layer, a silicon nitride oxide layer, or a silicon oxynitride layer by a CVD method, a sputtering method, or the like. The nitrogen-containing layer 102 is preferably formed to a thickness of 50 to 200 nm. For example, a silicon oxynitride layer and a silicon nitride oxide layer are stacked from the single-crystal semiconductor substrate 161 side, so that the nitrogen-containing layer 102 can be obtained.

Figure 3B:
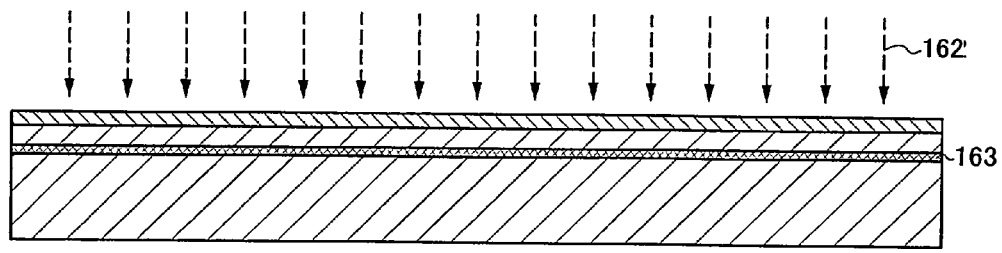

The semiconductor substrate 161 is irradiated with ions 162 accelerated by an electric field from the surface side of the semiconductor substrate 161 to form a separation layer 163 (see FIG. 3B). The irradiation with the ions 162 is performed in consideration of the thickness of the single-crystal semiconductor layer which is separated from the semiconductor substrate 161 and transferred to another substrate later. The irradiation with the ions 162 is performed so that the single-crystal semiconductor layer is preferably formed to a thickness of 5 to 500 nm, more preferably 10 to 200 nm. Accelerating voltage at the time of irradiation with ions and a dosage of ions are selected as appropriate in consideration of the thickness of the single-crystal semiconductor layer which is transferred.

As the ions 162, ions of hydrogen, helium, or halogen such as fluorine can be used. The semiconductor substrate 161 is preferably irradiated with ion species of one atom or a plurality of atoms of the same kind, which are produced by excitation of a source gas selected from hydrogen, helium, or a halogen element by plasma. In the case of performing irradiation with hydrogen ions, an ion doping method is preferably used in which irradiation with a plurality of ion species, which is produced in such a way that a source gas is made into plasma, is performed without mass separation. In this case, the hydrogen ions preferably include $H^+$, $H_2^+$, and $H_3^+$ ions with a high proportion of $H_3^+$ ions, whereby the irradiation efficiency of ions can be increased and the time for irradiation can be shortened. With such a structure, the single-crystal semiconductor layer can be easily separated from the semiconductor substrate 161.

A method of irradiation with hydrogen ions, and an operation and an effect thereof are described below with reference to the drawings.

In this embodiment mode, a single-crystal semiconductor substrate is irradiated with ions that are derived from hydrogen (H) (hereinafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 33:
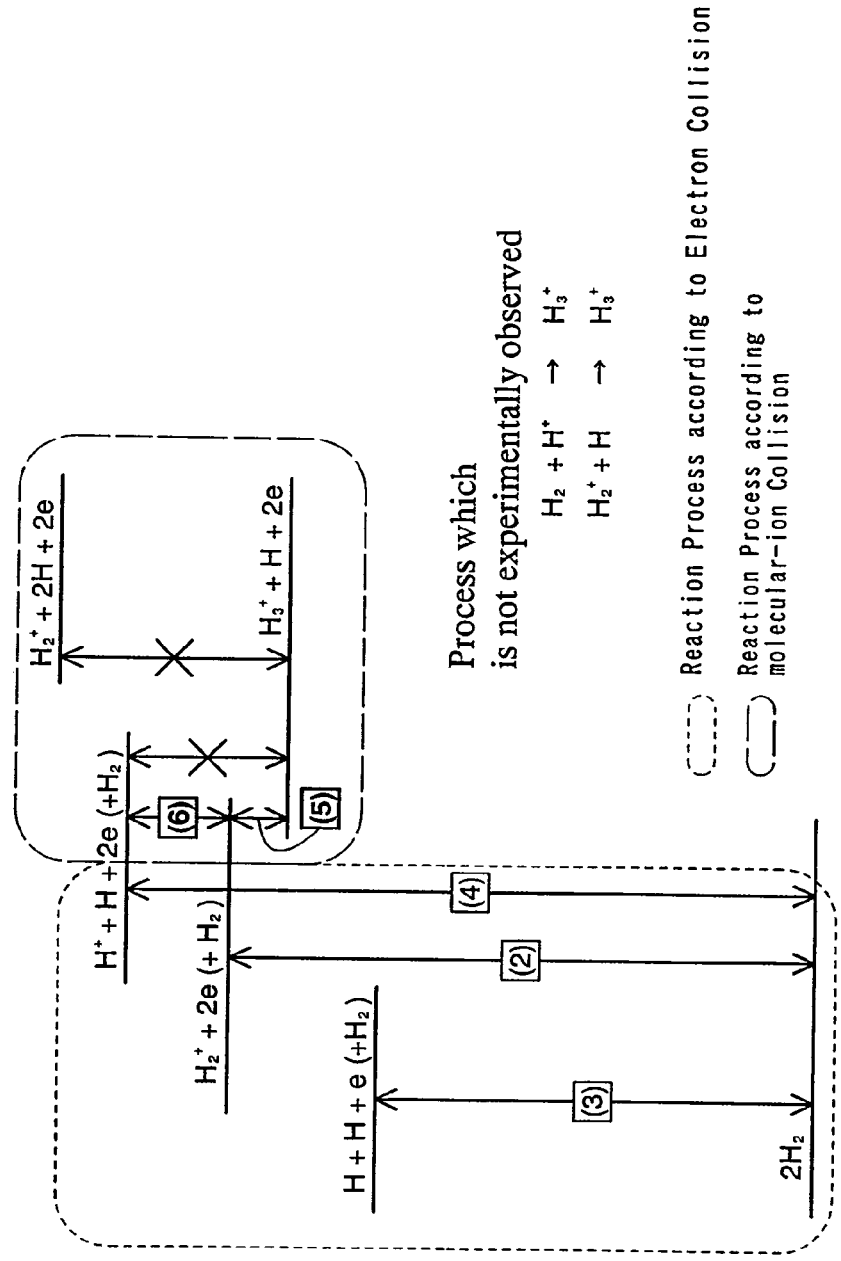
FIG. 33 is an energy diagram of hydrogen ion species.

FIG. 33 is an energy diagram which schematically shows some of the above reactions. It is to be noted that the energy diagram shown in FIG. 33 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (it is to be noted that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 34:
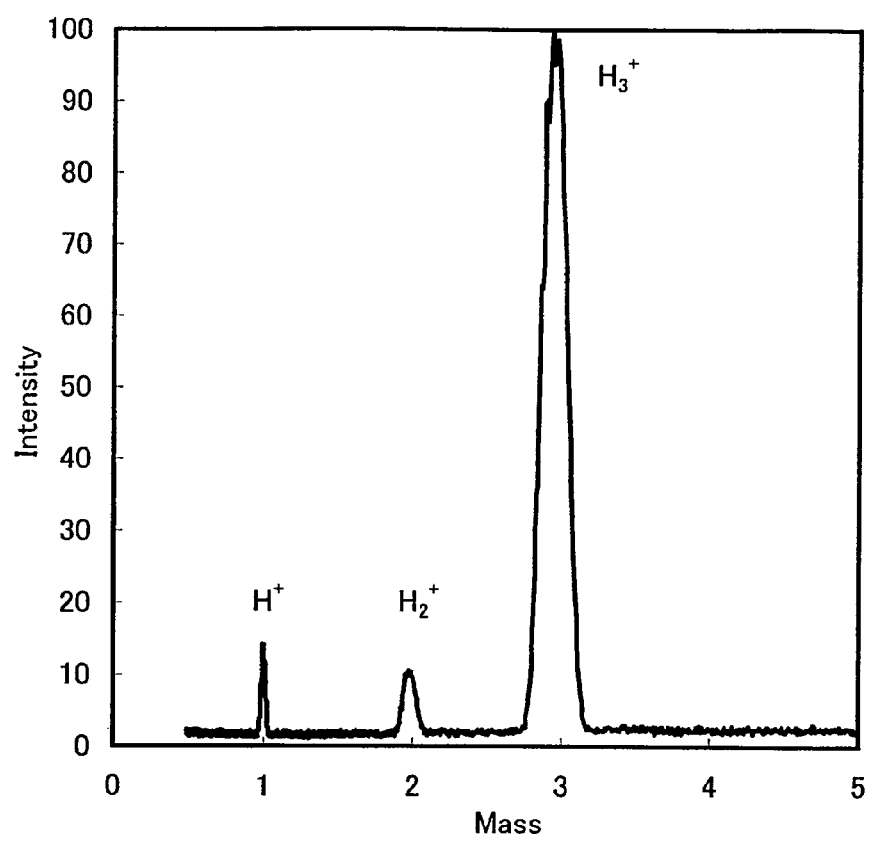
FIG. 34 is a diagram showing the results of ion mass spectrometry.

Here, an example, in which the proportions of ion species (particularly, the proportion of $H_3^+$) are different, is described. FIG. 34 is a graph showing the results of mass spectrometry of ions that are generated from a 100% hydrogen gas (with the pressure of an ion source of $4.7 \times 10^{-2}$ Pa). It is to be noted that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 34, the number of ions with different masses is expressed as a relative proportion where the number of ions with a mass of 3 is defined as 100. It can be seen from FIG. 34 that the ratio between ion species that are generated from the ion source, i.e., the ratio between $H^+$, $H_2^+$, and $H_3^+$, is about 1:1:8. It is to be noted that ions at such a ratio can also be generated by an ion doping apparatus which has a plasma source portion (ion source) that generates a plasma, an extraction electrode that extracts an ion beam from the plasma, and the like.

Figure 35:
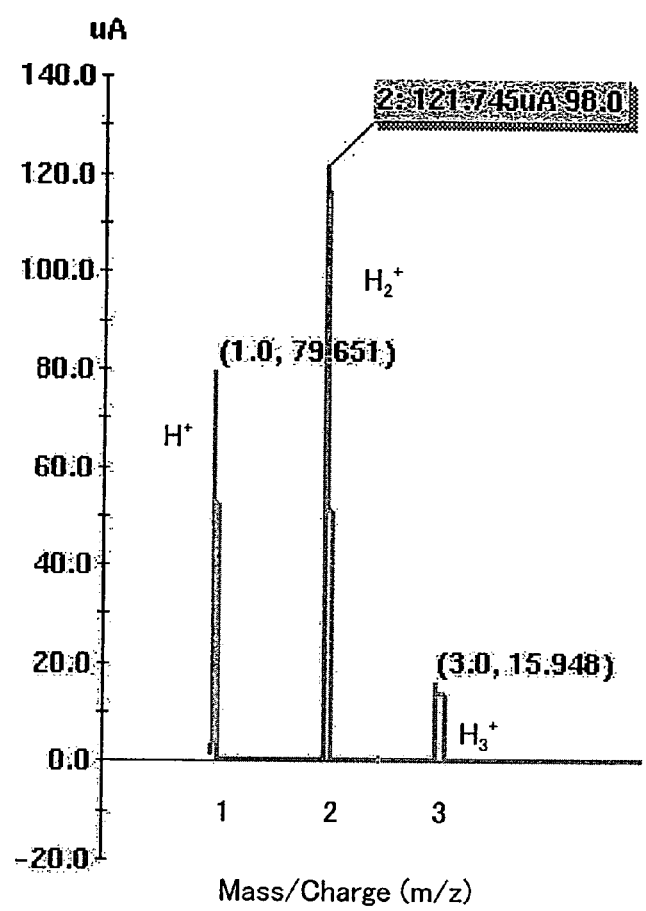
FIG. 35 is a diagram showing the results of ion mass spectrometry.

FIG. 35 is a graph showing the results of mass spectrometry of ions that are generated from $PH_3$ when an ion source different from that for the case of FIG. 34 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 34, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 35 that the ratio between ion species in a plasma, i.e., the ratio between $H^+$, $H_2^+$, and $H_3^+$, is about 37:56:7. It is to be noted that, although FIG. 35 shows the data obtained when the source gas is $PH_3$, the ratio between the hydrogen ion species is about the same when a 100% hydrogen gas is used as a source gas, as well.

In the case of the ion source from which the data shown in FIG. 35 is obtained, $H_3^+$, of $H^+$, $H_2^+$, and $H_3^+$, is generated at a proportion of only about 7%. On the other hand, in the case of the ion source from which the data shown in FIG. 34 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 34 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. It is to be noted that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

It is to be noted that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 36:
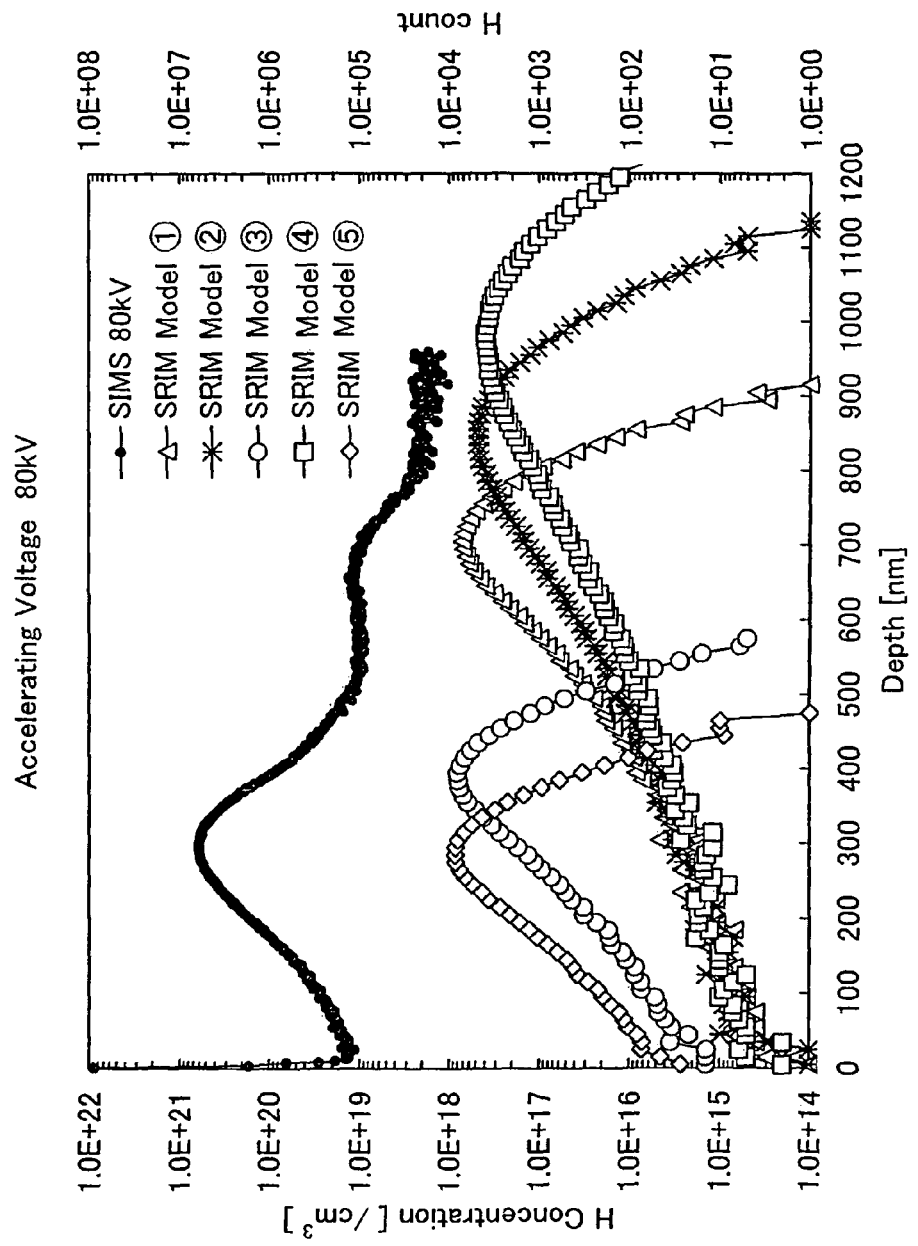
FIG. 36 is a diagram showing the profile (measured values and calculated values) of hydrogen in the depth direction when the accelerating voltage is 80 kV.

FIG. 36 shows the calculation results obtained when irradiation with the hydrogen ion species (irradiation with 100,000 atoms for H) is performed using Models 1 to 5. FIG. 36 also shows the hydrogen concentration (secondary ion mass spectrometry (SIMS) data) in an Si substrate irradiated with the hydrogen ion species of FIG. 34. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 37:
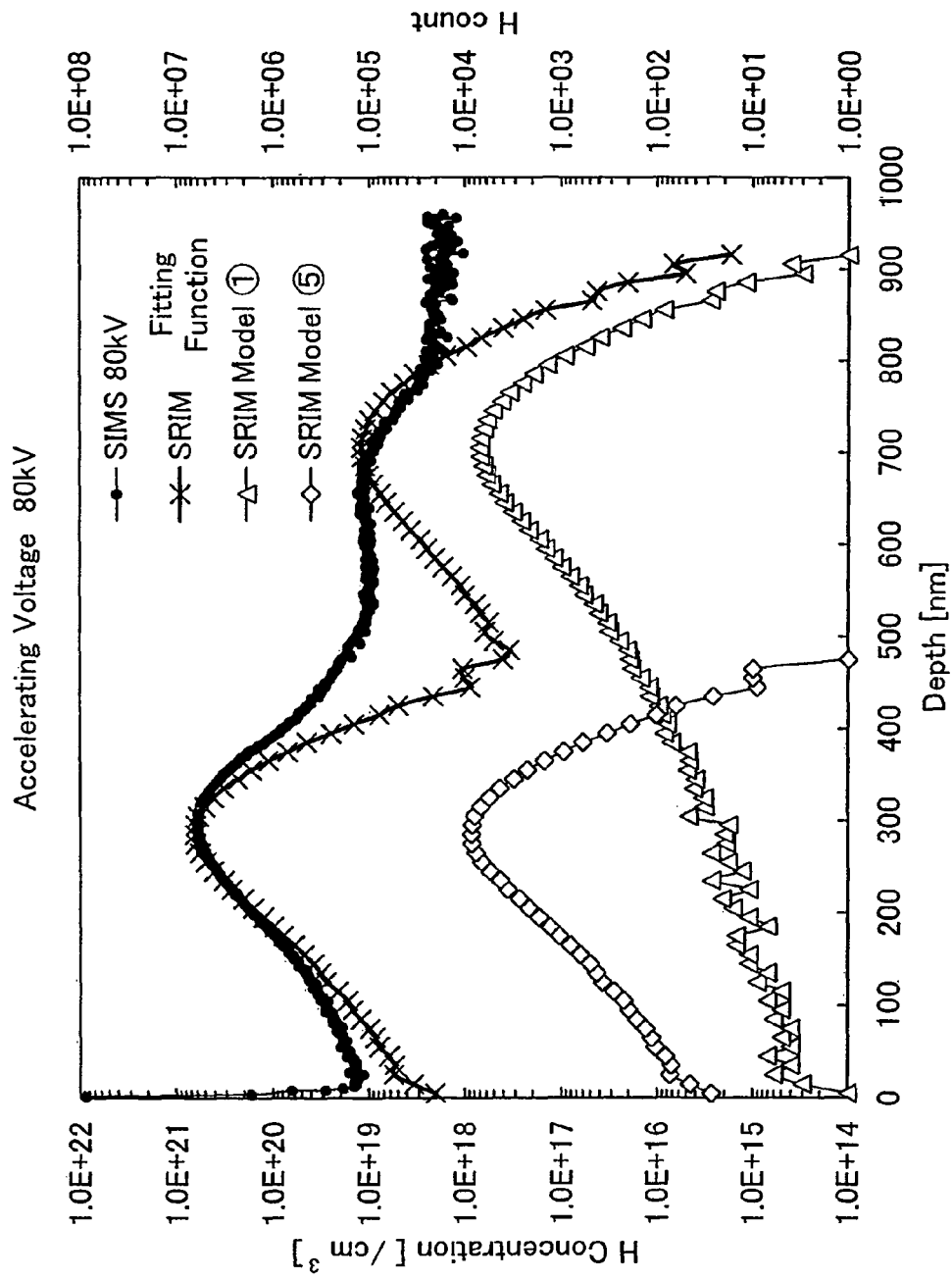
FIG. 37 is a diagram showing the profile (measured values, calculated values, and fitting function) of hydrogen in the depth direction when the accelerating voltage is 80 kV.
Figure 38:
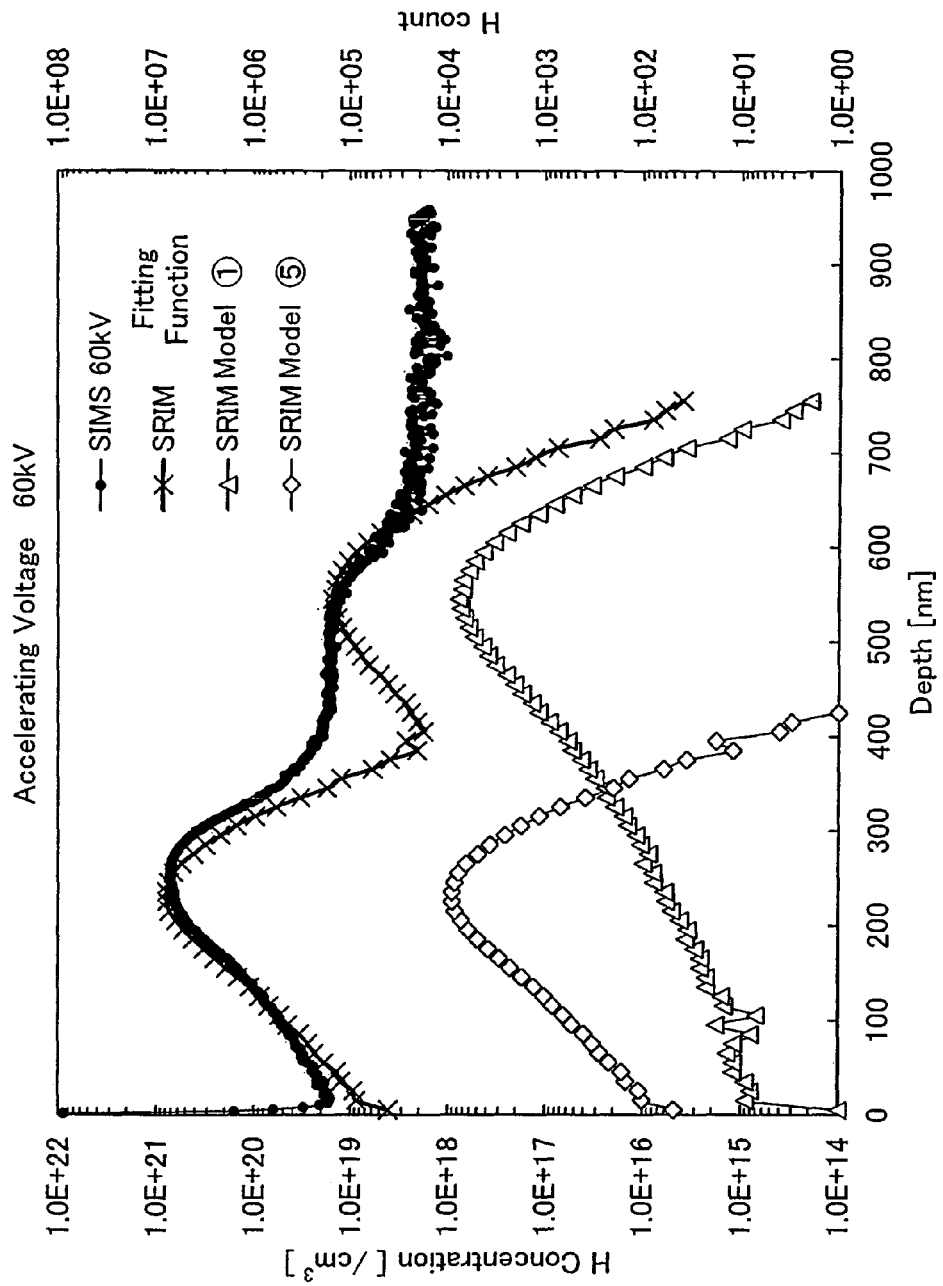
FIG. 38 is a diagram showing the profile (measured values, calculated values, and fitting function) of hydrogen in the depth direction when the accelerating voltage is 60 kV.
Figure 39:
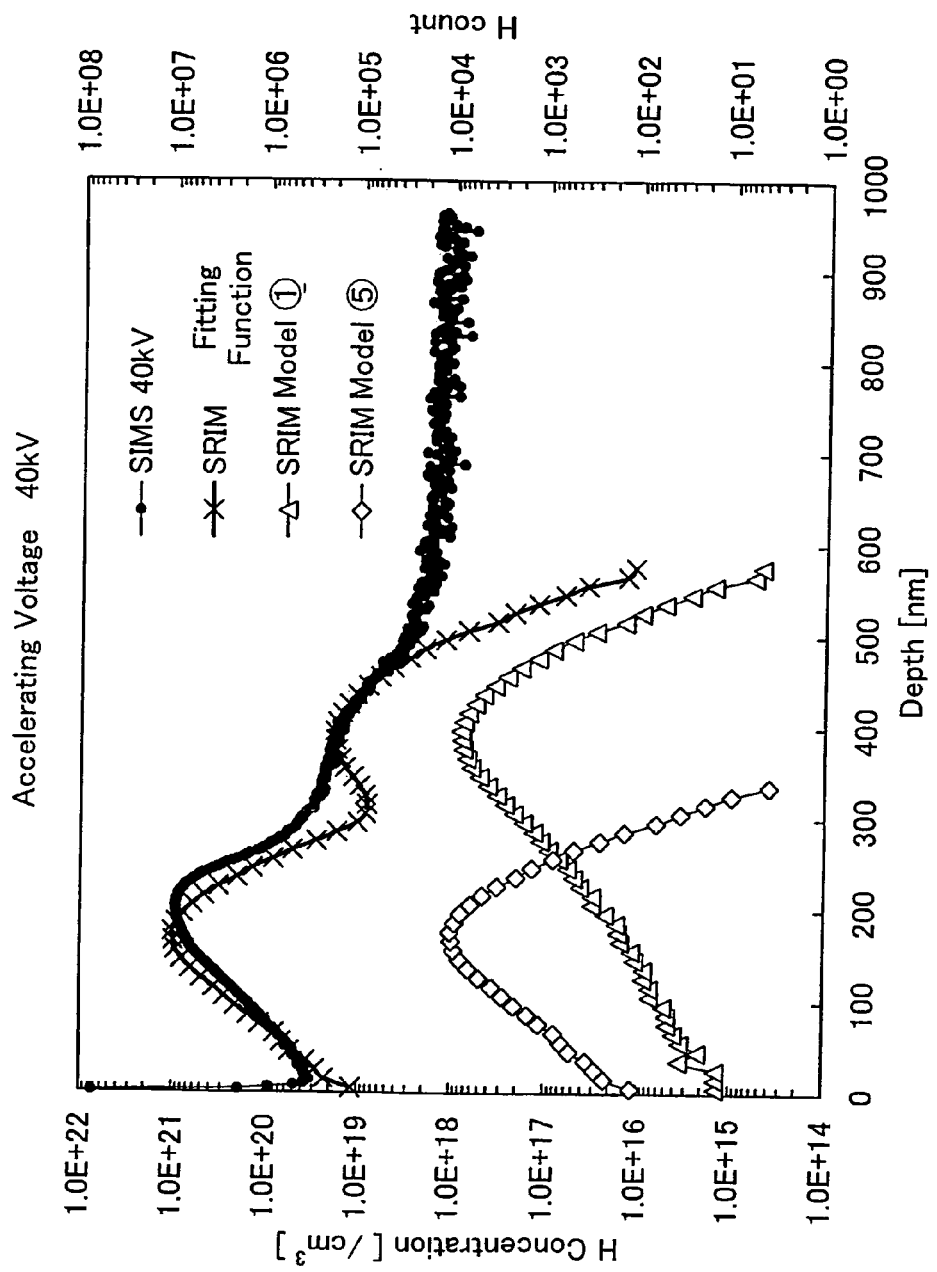
FIG. 39 is a diagram showing the profile (measured values, calculated values, and fitting function) of hydrogen in the depth direction when the accelerating voltage is 40 kV.

Accordingly, Models 2 to 4 will not be considered hereinafter. FIGS. 37 to 39 each show the calculation results obtained when irradiation with the hydrogen ion species (irradiation with 100,000 atoms for H) is performed using Models 1 and 5. FIGS. 37 to 39 also each show the hydrogen concentration (SIMS data) in an Si substrate irradiated with the hydrogen ion species of FIG. 34, and the simulation results fitted to the SIMS data (hereinafter referred to as a fitting function). Here, FIG. 37 shows the case where the accelerating voltage is 80 kV; FIG. 38, the case where the accelerating voltage is 60 kV; and FIG. 39, the case where the accelerating voltage is 40 kV. It is to be noted that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. It is to be noted that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 40 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 34. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

It is to be noted that, in this specification, a method is described in which an ion doping apparatus that is capable of irradiation with the hydrogen ion species as shown in FIG. 34 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

Figure 3C:
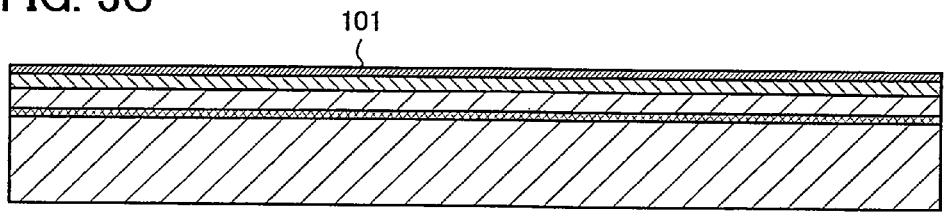

A bonding layer 101 is formed over the semiconductor substrate 161 with the nitrogen-containing layer 102 interposed therebetween (see FIG. 3C).

The bonding layer 101 is formed over a surface that is to form a bond between the semiconductor substrate 161 and the substrate. As the bonding layer 101 formed here, a silicon oxide layer is preferably used which is deposited using organosilane as a source gas by a chemical vapor deposition method. Alternatively, a silicon oxide layer can be used which is deposited using silane as a source gas by a chemical vapor deposition method. Deposition by a chemical vapor deposition method is performed at a temperature low enough to keep from degassing of the separation layer 163 formed in the semiconductor substrate 161. For example, the deposition temperature is preferably less than or equal to 350° C. It is to be noted that as a temperature of heat treatment by which the single-crystal semiconductor layer is separated from the semiconductor substrate, a temperature is used which is higher than a temperature of deposition by a chemical vapor deposition method.

Figure 3D:
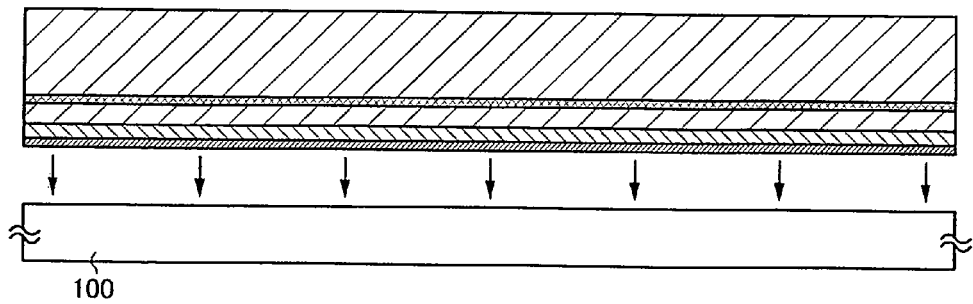

The semiconductor substrate 161 and the substrate 100 serving as a base are bonded to each other (see FIG. 3D). A surface of the bonding layer 101 formed over the semiconductor substrate 161 is disposed in contact with a surface of the substrate 100 to form a bond. This bond is formed under the action of a van der Waals force, and by pressing of the substrate 100 and the semiconductor substrate 161 against each other, a strong bond can be formed by hydrogen bonding.

As the substrate 100, a substrate having an insulating surface is used. In specific, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. A glass substrate is preferably used as the substrate 100, and for example, a large-area mother glass substrate called a sixth generation substrate (1500 mm×1850 mm), a seventh generation substrate (1870 mm×2200 mm), or an eighth generation substrate (2200 mm×2400 mm) is used. When an SOI substrate is manufactured with a large-area mother glass substrate used as the base substrate 100, a large-area SOI substrate can be obtained. Thus, the number of display panels which is manufactured from a single substrate (panels yielded per substrate) can be increased, and accordingly, light-emitting devices can be further produced.

In order to favorably perform bonding between the substrate 100 and the bonding layer 101, a bonding surface may be activated. For example, one or both of the surfaces that are to form a bond is/are irradiated with an atomic beam or an ion beam. When an atomic beam or an ion beam is used, an inert gas neutral atom beam or inert gas ion beam of argon or the like can be used. Alternatively, a bonding surface can be activated by performing plasma exposure or radical exposure. Such a surface treatment makes it possible to form a bond between different kinds of materials even at a temperature lower than or equal to 400° C.

After the substrate 100 and the semiconductor substrate 161 are bonded to each other with the bonding layer 101 interposed therebetween (see FIG. 4A), it is preferable that one of or both heat treatment and pressure treatment be performed. Heat treatment or pressure treatment makes it possible to increase bonding strength between the substrate 100 and the semiconductor substrate 161. The heat treatment is performed at a temperature equal to or lower than the upper temperature limit of the substrate 100. The pressure treatment is performed so that pressure is applied in a direction perpendicular to the bonding surface and is performed in consideration of the pressure resistance of the substrate 100 and the semiconductor substrate.

Figure 4A:
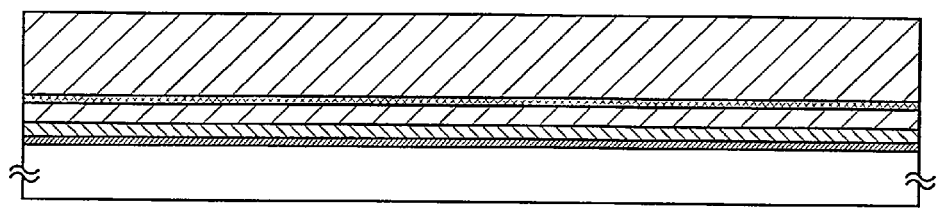
FIGS. 4A to 4C are cross-sectional views showing an example of a method for manufacturing a light-emitting device of the present invention.
Figure 4B:
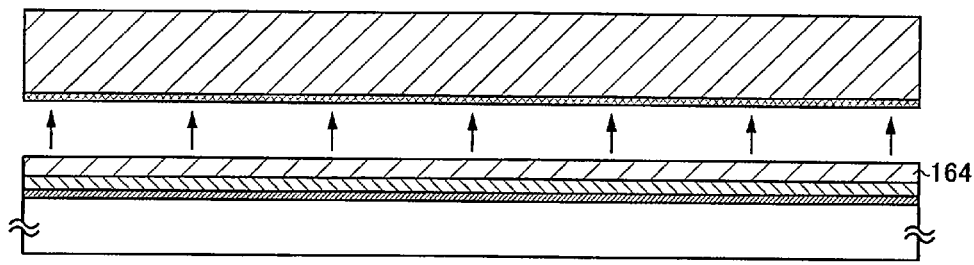
Figure 4C:
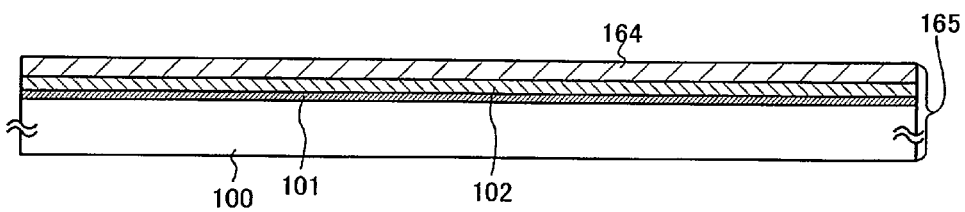

Heat treatment is performed to separate part of the semiconductor substrate 161 from the substrate 100 with the separation layer 163 used as a cleavage plane (see FIG. 4B). The heat treatment is preferably performed at a temperature equal to or higher than the temperature at which the bonding layer 101 is formed and equal to or lower than the upper temperature limit of the substrate 100. When the heat treatment is performed at, for example, 400° C. to 600° C., a change occurs in the volume of fine voids formed in the separation layer 163, which allows cleavage to occur along the separation layer 163. Because the bonding layer 101 is bonded to the substrate 100, a single-crystal semiconductor layer 164 having the same crystallinity as the semiconductor substrate 161 is left over the substrate 100.

Through the above-described steps, an SOI substrate 165 is obtained in which the single-crystal semiconductor layer 164 is provided with the bonding layer 101 interposed between the substrate 100 and the single-crystal semiconductor layer 164.

The surface of the single-crystal semiconductor layer 164 obtained by the separation is preferably polished to be planarized by chemical mechanical polishing (CMP). In addition, instead of using a physical polishing means such as CMP, a surface of the single-crystal semiconductor layer 164 may be planarized by laser beam irradiation. It is to be noted that the laser beam irradiation is preferably conducted under a nitrogen atmosphere with an oxygen concentration of 10 ppm or lower. This is because laser beam irradiation under an oxygen atmosphere may make the surface of the single-crystal semiconductor layer 164 rough. Further, CMP or the like may be conducted for the sake of thinning the obtained single-crystal semiconductor layer 164.

Further, a plurality of semiconductor substrates 161 can be arranged over a large substrate 100 to provide the single-crystal semiconductor layers 164 over the substrate 100. In this case, a large light-emitting device can be manufactured irrespective of the size of the semiconductor substrate 161.

Furthermore, a plurality of single-crystal semiconductor layers 164 each having a panel size may be arranged over the substrate 100. When the plurality of single-crystal semiconductor layers 164 each having a panel size is arranged over the substrate 100, a plurality of panels can be manufactured from the substrate 100. In addition, one display panel can be formed using one single-crystal semiconductor layer, and thus, variation of elements included in a display panel can be suppressed.

By the method for manufacturing an SOI substrate which is illustrated as above in FIGS. 3A to 4C, the SOI substrate 165 can be obtained in which a bond in a bonding portion between the substrate 100 and the single-crystal semiconductor layer 164 is strong even in the case where a glass substrate or the like which has the upper temperature limit of 600° C. or less is used as the substrate 100. Therefore, as the substrate 100, a variety of glass substrates that are used in the electronics industry, such as aluminosilicate glass substrates, aluminoborosilicate glass substrates, and barium borosilicate glass substrates can be used. Of course, a ceramic substrate, a sapphire substrate, a quartz substrate, or the like can be used. That is, a single-crystal semiconductor layer can be formed over a substrate that is longer than one meter on each side. A light-emitting device such as an EL display device can be manufactured using such a large-area substrate.

Next, a method for manufacturing a transistor and a light-emitting element over the SOI substrate 165 is described with reference to the drawings.

Figure 5A:
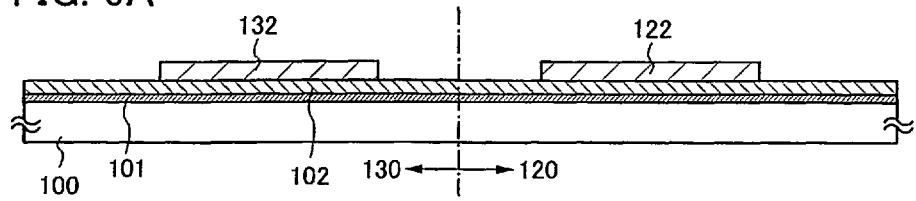
FIGS. 5A to 5E are cross-sectional views showing an example of a method for manufacturing a light-emitting device of the present invention.

First, the single-crystal semiconductor layer 164 is selectively etched to form island-like single-crystal semiconductor layers 122 and 132 (see FIG. 5A).

Figure 5B:
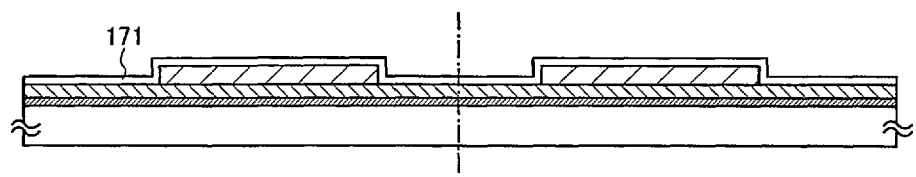

Next, a gate insulating film 171 is formed to cover the single-crystal semiconductor layers 122 and 132 (see FIG. 5B).

The gate insulating film 171 can be provided to have a single layer structure or a stacked structure using an insulating film of silicon oxide, silicon oxynitride, or silicon nitride by a CVD method, a sputtering method, a thermal oxidation method, or the like.

In addition, the gate insulating film 171 may be formed by performing plasma treatment on the single-crystal semiconductor layers 122 and 132 to oxidize or nitride the surfaces of the single-crystal semiconductor layers 122 and 132. For example, plasma treatment is used, in which a mixed gas containing a rare gas such as He, Ar, Kr, or Xe, oxygen, nitrogen oxide ($NO_2$), ammonia, nitrogen, hydrogen, or the like is introduced. In this case, when plasma excitation is performed by introducing a microwave, plasma with a low electron temperature and high density can be generated. The surface of the single-crystal semiconductor layer can be oxidized or nitrided by oxygen radicals (OH radicals may be included) or nitrogen radicals (NH radicals may be included) generated by this high density plasma.

By such treatment using high density plasma, an insulating film having a thickness greater than or equal to 1 nm and less than or equal to 20 nm, typically greater than or equal to 5 nm and less than or equal to 10 nm, is formed over the single-crystal semiconductor layer. Since a reaction in this case is a solid-phase reaction, interface state density between the insulating film and the single-crystal semiconductor layer can be made to be extremely low. By such high density plasma treatment, since the single-crystal semiconductor layer is directly oxidized (or nitrided), variation in the thickness of an insulating film that is formed can be made to be extremely small. By solid-phase oxidation of the surface of the single-crystal semiconductor layer through such high density plasma treatment, an insulating film which has favorable uniformity and low interface state density can be formed.

As for the gate insulating film 171, only the insulating film formed by high density plasma treatment may be used, or one or more of insulating films of silicon oxide, silicon oxynitride, or silicon nitride may be deposited and stacked by a CVD method, a sputtering method, or the like. In any case, variation in characteristics can be reduced in the transistors each including the insulating film formed by high density plasma as part or whole of the gate insulating film.

Figure 5C:
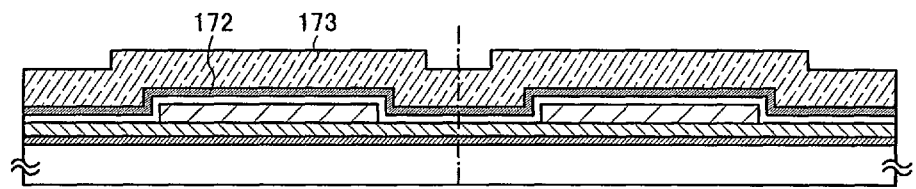

A first conductive layer 172 and a second conductive layer 173 are sequentially stacked over the gate insulating film 171 (see FIG. 5C). The first conductive layer 172 and the second conductive layer 173 are each formed using an element selected from tantalum (Ta), tantalum nitride, tungsten (W), titanium (Ti), molybdenum (Mo), aluminum (Al), copper (Cu), chromium (Cr), niobium (Nb), or the like; an alloy material or a compound material which includes any of these elements as its main component; or a semiconductor material typified by polycrystalline silicon doped with an impurity element such as phosphorus. The first conductive layer 172 and the second conductive layer 173 may be formed using the same conductive material or different conductive materials.

As examples of combination of the first conductive layer 172 and the second conductive layer 173, the following are given: a tantalum nitride film and a tungsten film, a tungsten nitride film and a tungsten film, a molybdenum nitride film and a molybdenum film, and the like. Here, the first conductive layer is formed to a thickness greater than or equal to 20 nm and less than or equal to 100 nm by a CVD method, a sputtering method, or the like. The second conductive layer is formed to a thickness greater than or equal to 100 nm and less than or equal to 400 nm. Although a stacked structure of two conductive layers is used in this embodiment mode, one layer or a stacked structure of three or more layers may be alternatively used. In the case of a three-layer structure, a stacked structure of a molybdenum film, an aluminum film, and a molybdenum film is preferably used.

Then, a resist mask 174 is selectively formed over the second conductive layer 173, and first etching treatment and second etching treatment are performed using the resist masks 174.

Figure 5D:
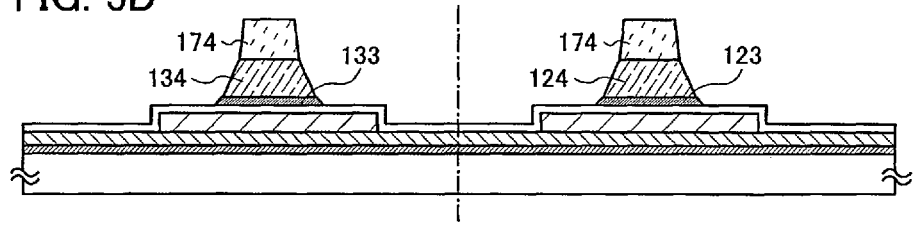

By performing the first etching treatment, the first conductive layer 172 and the second conductive layer 173 which are formed over the gate insulating film 171 are selectively removed, so that a stacked structure of a first conductive layer 123 and a second conductive layer 124 which can serve as a gate electrode is left above the single-crystal semiconductor layer 122, and a stacked structure of a first conductive layer 133 and a second conductive layer 134 which can serve as a gate electrode is left above the single-crystal semiconductor layer 132 (see FIG. 5D).

Figure 5E:
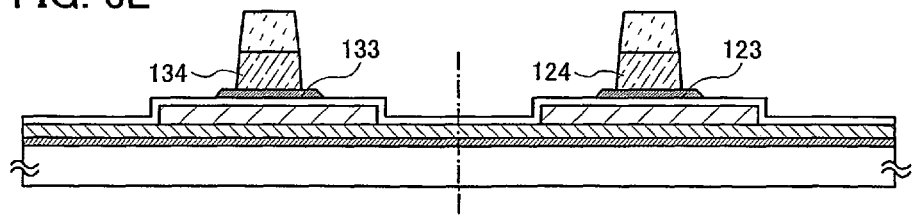

Then, by performing the second etching treatment, end portions of the second conductive layers 124 and 134 are selectively etched (see FIG. 5E). Consequently, structures can be obtained, in which the second conductive layers 124 and 134 have widths narrower than the first conductive layers 123 and 133, respectively.

An etching method for carrying out the first etching treatment and the second etching treatment may be selected as appropriate. In order to improve the etching rate, a dry etching apparatus using a high density plasma source of ECR (electron cyclotron resonance) or ICP (inductively coupled plasma) or the like may be used. By controlling etching conditions in accordance with the first etching treatment and the second etching treatment, the end portions of the first conductive layers 123 and 133 and the second conductive layers 124 and 134 can each be formed into a desired tapered shape.

Figure 6A:
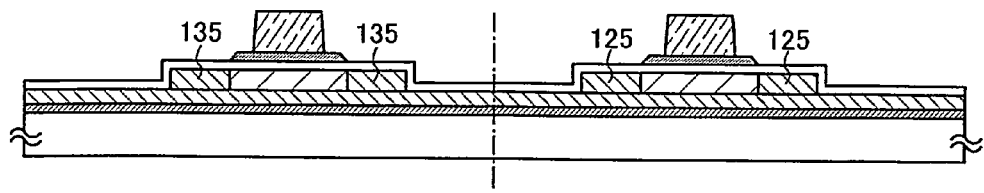
FIGS. 6A to 6D are cross-sectional views showing an example of a method for manufacturing a light-emitting device of the present invention.
Figure 6B:
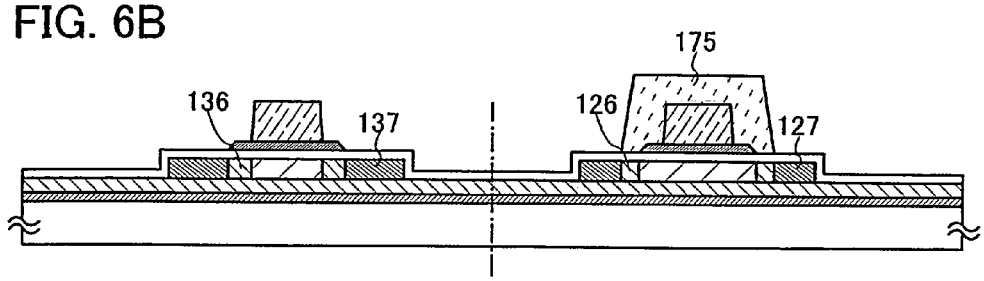
Figure 6C:
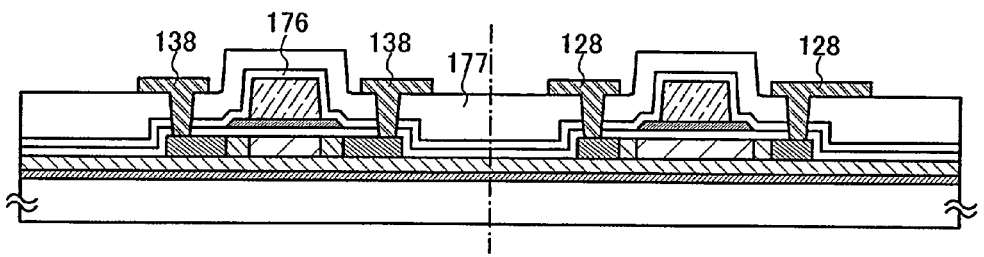

An impurity element is introduced into the single-crystal semiconductor layers 122 and 132 with the use of the first conductive layers 123 and 133 and the second conductive layers 124 and 134 as masks to form low concentration impurity regions 125 in the single-crystal semiconductor layer 122 and low concentration impurity regions 135 in the single-crystal semiconductor layer 132, respectively (see FIG. 6A).

An impurity element can be introduced by an ion doping method, an ion implantation method, or the like with the use of an n-type impurity or a p-type impurity. As an impurity element imparting n-type conductivity, phosphorus (P), arsenic (As), or the like can be used. As an impurity element imparting p-type conductivity, boron (B), aluminum (Al), gallium (Ga), or the like can be used.

Here, an example is described in which the impurity regions 125 do not overlap with the first conductive layer 123 in the single-crystal semiconductor layer 122; however, the impurity regions 125 can be formed in a region which overlaps with the first conductive layer 123 depending on the condition of introducing an impurity element. Further, an example is described in which the impurity regions 135 do not overlap with the first conductive layer 133 in the single-crystal semiconductor layer 132; however, the impurity regions 135 can be formed in a region which overlaps with the first conductive layer 133 depending on the condition of introducing an impurity element.

A resist mask 175 is selectively formed above the first conductive layer 123, the second conductive layer 124, and the single-crystal semiconductor layer 122, and an impurity element is introduced into the single-crystal semiconductor layers 122 and 132 with the use of the resist mask 175, the first conductive layer 133, and the second conductive layer 134 as masks. Thus, impurity regions 126 and 127 are formed in the single-crystal semiconductor layer 122, and impurity regions 136 and 137 are formed in the single-crystal semiconductor layer 132 (see FIG. 6B). It is to be noted that the impurity element goes through the first conductive layer 133 to be introduced into the single-crystal semiconductor layer 132.

An impurity element can be introduced by an ion doping method, an ion implantation method, or the like with the use of an n-type impurity or a p-type impurity. As an impurity element imparting n-type conductivity, phosphorus (P), arsenic (As), or the like can be used. As an impurity element imparting p-type conductivity, boron (B), aluminum (Al), gallium (Ga), or the like can be used.

In the single-crystal semiconductor layer 122, the high concentration impurity regions 127 formed in a region which is not covered with the resist mask 175 serve as a source region and a drain region of a transistor, and the low concentration impurity regions 126 formed in a region which is covered with the resist mask 175 but does not overlap with the first conductive layer 123 serve as LDD regions of a transistor. Further, in the single-crystal semiconductor layer 132, the high concentration impurity regions 137 formed in a region which does not overlap with the first conductive layer 133 serve as a source region and a drain region of a transistor, and the low concentration impurity regions 136 formed in a region which overlaps with the first conductive layer 133 but does not overlap with the second conductive layer 134 serve as LDD regions of a transistor.

The LDD region is a region to which an impurity element is added at low concentration between a channel formation region and a source or a drain region which is formed by addition of an impurity element at high concentration. By the LDD region being provided, the effects of reducing the electric field in the vicinity of the drain region and preventing deterioration due to hot carrier injection can be obtained. In addition, in order to prevent deterioration of a transistor due to hot carriers, a structure may be used in which an LDD region and a gate electrode are disposed so as to overlap with each other with a gate insulating film interposed therebetween (also referred to as a "GOLD (gate-drain overlapped LDD) structure"). This embodiment mode shows an example in which an LDD region is used in a transistor included in the pixel portion 120 and a GOLD structure is used in a transistor included in the driver circuit portion 130. However, the present invention is not limited thereto, and a GOLD structure may be used in a transistor included in the pixel portion 120.

The transistors included in the pixel portion 120 may all have n-type conductivity or p-type conductivity, or may have both n-type conductivity and p-type conductivity. The transistors included in the driver circuit portion 130 may all have n-type conductivity or p-type conductivity, or may have both n-type conductivity and p-type conductivity.

An interlayer insulating layer is formed. Here, as the interlayer insulating layer, insulating layers 176 and 177 are stacked. Subsequently, openings are selectively formed in the gate insulating film 171, the insulating layer 176, and the insulating layer 177 to form conductive layers 128 and 138 each serving as a source electrode or a drain electrode (see FIG. 6C).

As the insulating layers 176 and 177, insulating layers of silicon oxide, silicon oxynitride, silicon nitride, or the like which are formed by a CVD method, a sputtering method, or the like can be used. Alternatively, the insulating layers 176 and 177 can be formed to have a single layer structure or a stacked structure which uses an organic material such as polyimide, polyamide, polyvinyl phenol, benzocyclobutene, acrylic, or epoxy; a siloxane material such as a siloxane resin; an oxazole resin; and/or the like. It is to be noted that a siloxane material corresponds to a material including an Si—O—Si bond. Siloxane includes a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. An oxazole resin includes, for example, photosensitive polybenzoxazole or the like. Photosensitive polybenzoxazole is a material having a low dielectric constant (a dielectric constant of 2.9 at 1 MHz at room temperature), high heat resistance (a thermal decomposition temperature of 550° C. at a temperature rise of 5° C./min by TG/DTA (thermogravimetry-differential thermal analysis), and low water absorption coefficient (0.3% in 24 hours at room temperature). Since an oxazole resin has a lower dielectric constant (approximately 2.9) as compared to a dielectric constant of polyimide (approximately 3.2 to 3.4) or the like, the generation of parasitic capacitance can be suppressed and an operation at high speed is possible. Here, the insulating layer 176 is formed using silicon oxide, silicon oxynitride, or silicon nitride by a CVD method, while the insulating layer 177 is formed using an organic material such as polyimide, polyamide, polyvinyl phenol, benzocyclobutene, acrylic, or epoxy; a siloxane material such as a siloxane resin; an oxazole resin; and the like.

For the conductive layers 128 and 138, a single layer structure or a stacked structure which is formed using one element selected from aluminum, tungsten, titanium, tantalum, molybdenum, nickel, or neodymium (Nd) or formed using an alloy that contains a plurality of the elements given here can be used. For example, a conductive layer that is formed using an alloy that contains a plurality of the elements given above can be formed from an aluminum alloy that contains titanium, an aluminum alloy that contains neodymium, or the like can be used. Furthermore, for the case where the conductive layers 128 and 138 are each provided to have a stacked structure, for example, a structure in which an aluminum layer or an aluminum alloy layer, such as one of those described above, is interposed between titanium layers may be used, as well. It is to be noted that the conductive layers 128 and 138 each serve as a source electrode or a drain electrode of a transistor.

Figure 6D:
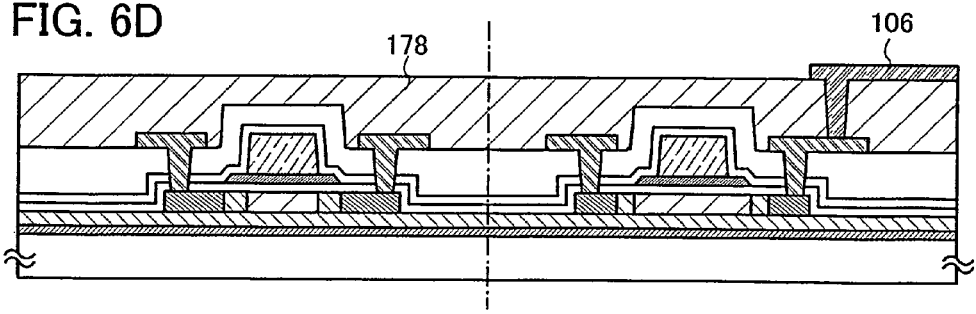

A pixel electrode 106 is formed to be electrically connected to the conductive layer 128 (see FIG. 6D). Here, an example is described in which the pixel electrode 106 is formed over an insulating layer 178 provided over the conductive layer 128. However, the present invention is not limited thereto, and for example, a structure may be used in which the pixel electrode 106 is provided over the insulating layer 177. The pixel electrode 106 serves as an anode or a cathode in a light-emitting device.

As the insulating layer 178, an insulating layer of silicon oxide, silicon oxynitride, silicon nitride, or the like which is formed by a CVD method, a sputtering method, or the like can be formed. Alternatively, the insulating layer 178 can be formed to have a single layer structure or a stacked structure which uses an organic material such as polyimide, polyamide, polyvinyl phenol, benzocyclobutene, acrylic, or epoxy; a siloxane material such as a siloxane resin; an oxazole resin; and/or the like.

The pixel electrode 106 may be formed using a transparent conductive layer formed from a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide is added (ITSO), or the like can also be used. As the pixel electrode 106, a material that has a high work function, for example, an element selected from nickel (Ni), tungsten (W), chromium (Cr), platinum (Pt), zinc (Zn), tin (Sn), indium (In), or molybdenum (Mo), or an alloy material including any of the metal elements as its main component, for example, titanium nitride, titanium silicon nitride, tungsten silicide, tungsten nitride, tungsten silicide nitride, or niobium nitride may be used to form a single layer film or a film of stacked layers.

An insulating film (for example, an organic resin film) is formed by a coating method and the obtained insulating film is patterned to form an insulating layer 179 covering an end portion of the pixel electrode 106. Subsequently, a layer 107 including an organic compound is formed by an evaporation method or a coating method, and then, a counter electrode 108 (a cathode or an anode of the light-emitting device) is formed (see FIG. 7A).

The layer 107 including an organic compound has a stacked structure, and a buffer layer may be used as one layer of the layer 107 including an organic compound. The buffer layer is formed of a composite material layer including an organic compound and an inorganic compound, and the inorganic compound exhibits an electron accepting property with respect to the organic compound. The buffer layer is formed from a composite material containing an organic compound and an inorganic compound, and the inorganic compound corresponds to one or more selected from titanium oxide, zirconium oxide, hafnium oxide, vanadium oxide, niobium oxide, tantalum oxide, chromium oxide, molybdenum oxide, tungsten oxide, manganese oxide, or rhenium oxide. The buffer layer is a composite material layer including a hole-transporting organic compound and an inorganic compound.

For example, it is preferable to provide a stack of layers containing an organic compound (a stack of the buffer layer and an organic compound layer) between the pixel electrode 106 and the counter electrode 108. The buffer layer is a composite layer including metal oxide (such as molybdenum oxide, tungsten oxide, or rhenium oxide) and an organic compound (a hole transporting material, for example, 4,4'-bis[N-(3-methylphenyl)-N-phenylamino]biphenyl (abbreviation: TPD), 4,4'-bis[N-(1-naphthyl)-N-phenylamino]biphenyl (abbreviation: α-NPD), 4,4'-bis{N-[4-(N,N-di-m-tolylamino)phenyl]-N-phenylamino}biphenyl (abbreviation: DNTPD), or the like). In addition, for the layer 107 including an organic compound, for example, tris(8-quinolinolato)aluminum (abbreviation: Alq$_3$), tris(4-methyl-8-quinolinolato) aluminum (abbreviation: Almq$_3$), α-NPD, and the like can be used. In addition, the layer 107 including an organic compound may include a dopant material, and for example, N,N'-dimethylquinacridone (abbreviation: DMQd), coumarin 6, rubrene, and the like can be used. The layer 107 including an organic compound provided between the pixel electrode 106 and the counter electrode 108 may be formed by an evaporation method such as a resistance heating method.

In the case where the counter electrode 108 is a cathode, the counter electrode 108 is formed using a metal, an alloy, an electrically conductive compound, or a mixture of these, each of which has a low work function. In specific, a rare-earth metal such as Yb or Er as well as an alkali metal such as Li or Cs; an alkaline-earth metal such as Mg, Ca, or Sr; an alloy containing any of these (Mg:Ag, Al:Li, Mg:In, or the like); or a compound of any of these (CaF$_2$ or CaN) can be used. When the layer 107 including an organic compound is provided with an electron injecting layer, another conductive layer of Al or the like can be used. In the case where light is emitted from the cathode side, another light-transmitting oxide conductive material such as indium tin oxide (ITO), zinc oxide (ZnO), indium zinc oxide (IZO), or zinc oxide to which gallium is added (GZO) can be used for the counter electrode 108.

Figure 7A:
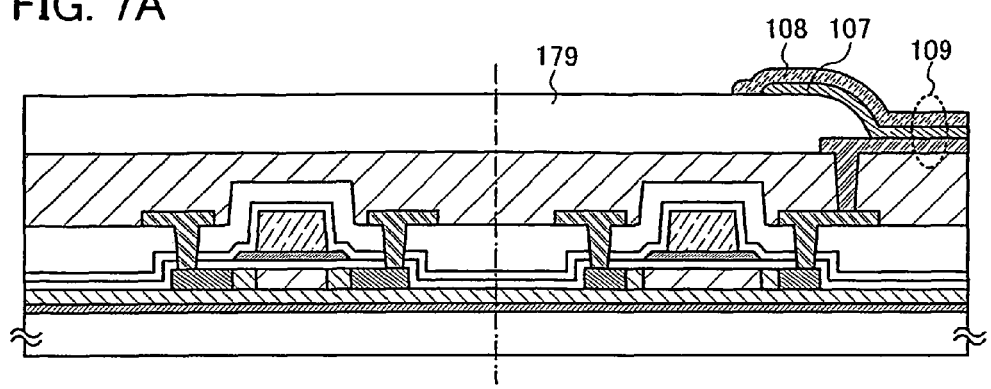
FIGS. 7A and 7B are cross-sectional views showing an example of a method for manufacturing a light-emitting device of the present invention.
Figure 7B:
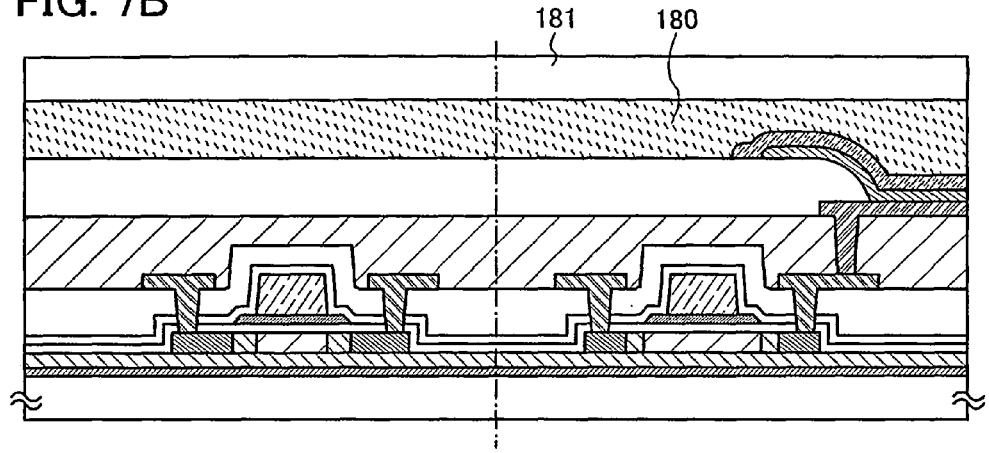

Next, a counter substrate 181 is provided to face the substrate 100 (see FIG. 7B). A filler 180 may be provided between the counter substrate 181 and the counter electrode 103, or a space between the counter substrate 181 and the counter electrode 103 may be filled with an inert gas. Further, a protective film may be formed to cover the counter electrode 108.

Through the above steps, a light-emitting device described in this embodiment mode is completed. In each transistor included in a driver circuit portion or a pixel portion of a light-emitting device which is described in this embodiment mode, a channel formation region is formed using a single-crystal semiconductor layer. Therefore, variation in characteristics of transistors between each pixel can be reduced as compared to a light-emitting device in which a polycrystalline semiconductor layer (polysilicon) is used as a channel formation region of a transistor in a pixel portion; thus, display unevenness in a light-emitting device can be suppressed.

Further, when a channel formation region of a transistor included in a driver circuit portion is formed using a single-crystal semiconductor layer, a channel length L of the transistor can be reduced as compared to a light-emitting device in which a polycrystalline semiconductor layer is used as a channel formation region of a transistor in a driver circuit portion. Accordingly, power consumption can be reduced and driving at higher speed becomes possible. Furthermore, since an element such as a transistor included in a driver circuit portion can be made fine, a pixel portion can occupy a larger area in the case where the pixel portion and the driver circuit portion are provided over one substrate. It is to be noted that a channel length refers to a length in a direction in which carriers flow in a channel formation region.

This embodiment mode can be combined with the structure of a light-emitting device which is described in any of other embodiment modes in this specification as appropriate.

Embodiment Mode 2

This embodiment mode describes a method for manufacturing an SOI substrate, which is different from that in the above-described embodiment mode, with reference to the drawings.

Figure 31A:
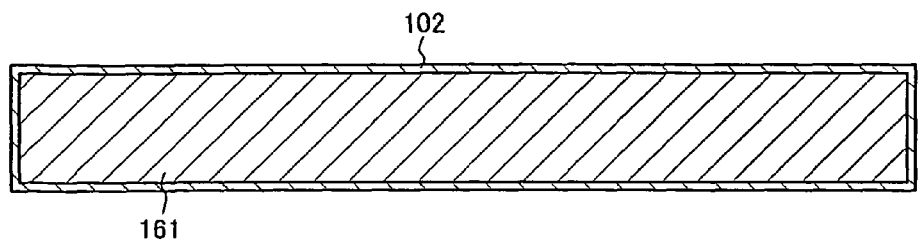
FIGS. 31A to 31D are cross-sectional views showing an example of a method for manufacturing a light-emitting device of the present invention.

First, a semiconductor substrate 161 is washed with a sulfuric acid/hydrogen peroxide mixture (SPM), an ammonia peroxide mixture (APM), a hydrochloric acid/hydrogen peroxide mixture (HPM), diluted hydrogen fluoride (DHF), or the like, as appropriate. Then, thermal oxidation of the semiconductor substrate 161 is performed to form an oxide film 190 (see FIG. 31A). Although the thermal oxidation may be conducted by dry oxidation, the thermal oxidation is preferably performed by oxidation in an oxygen atmosphere to which halogen is added. As a material including halogen, HCl is typical, and alternatively, one or more of HF, $NF_3$, HBr, $Cl_2$, $ClF_3$, $BCl_3$, $F_2$, $Br_2$, or the like can be used. As an example of such thermal oxidation, thermal oxidation may be performed at 900 to 1150° C. (typically, 1000° C.) in an atmosphere including HCl at a rate of 0.5 to 10 volume % (preferably 3 volume %) with respect to oxygen. The treatment time of thermal oxidation may be 0.1 to 6 hours, and preferably, 0.5 to 1 hour. The thickness of the oxide film thus formed is made to be 10 to 1000 nm (preferably, 50 to 200 nm), and for example, 100 nm.

Heat treatment is performed within such a temperature range, so that a gettering effect by the halogen element to the semiconductor substrate 161 can be obtained. As the gettering effect, an effect of removing a metal impurity is particularly obtained. That is, an impurity such as metal turns into a volatile chloride and moves into the air so as to be removed by an effect of chlorine. Gettering is effective when the surface of the semiconductor substrate 161 is subjected to chemical mechanical polishing (CMP). In addition, hydrogen has an effect of compensating defects at an interface between the semiconductor substrate 161 and the oxide film 190 so as to lower a local level density of the interface.

When halogen is included in the oxide film 190, an effect that a heavy metal that is an extrinsic impurity is captured so as to prevent contamination of the single-crystal semiconductor layer can be obtained. Metals such as Fe, Cr, and Ni are typical heavy metals, and Mo may be further included therein in some cases. These are introduced into a single-crystal semiconductor layer in a step of forming a separation layer through doping with ions without mass separation. That is, when halogen is contained in the oxide film 190 by HCl oxidation or the like, the oxide film 190 has an effect of gettering an impurity such as a heavy metal which gives an adverse effect on the single-crystal semiconductor layer. By heat treatment conducted after formation of the oxide film 190, a metal as an impurity included in the single-crystal semiconductor layer is separated out to the oxide film 190, reacted with halogen (e.g., chlorine), and captured. Thus, the impurity captured in the oxide film 190 can be fixed and contamination of the semiconductor substrate 161 can be prevented. That is, the oxide film 190 captures a metal element serving as a life time killer of a semiconductor so that the metal element does not diffuse again, whereby performance of a transistor can be improved.

The oxide film 190 formed by thermal oxidation contains halogen. Halogen is contained at a concentration of $1\times10^{17}/cm^3$ to $5\times10^{20}/cm^3$, so that the oxide film 190 can have a function as a protective film which captures an impurity such as metal so as to prevent contamination of the semiconductor substrate 161.

Figure 31B:
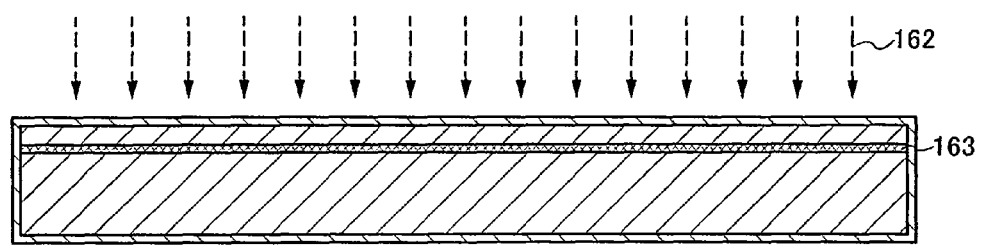

Irradiation with ions 162 of hydrogen, halogen, or the like is performed to form a separation layer 163 (see FIG. 31B). The ions accelerated by an electric field are added through the surface of the semiconductor substrate 161 at a predetermined depth, whereby the separation layer 163 is formed in the semiconductor substrate 161. The depth at which the separation layer 163 is formed in the semiconductor substrate 161 can be controlled by acceleration energy of the ions and an incident angle of the ions.

Figure 32:
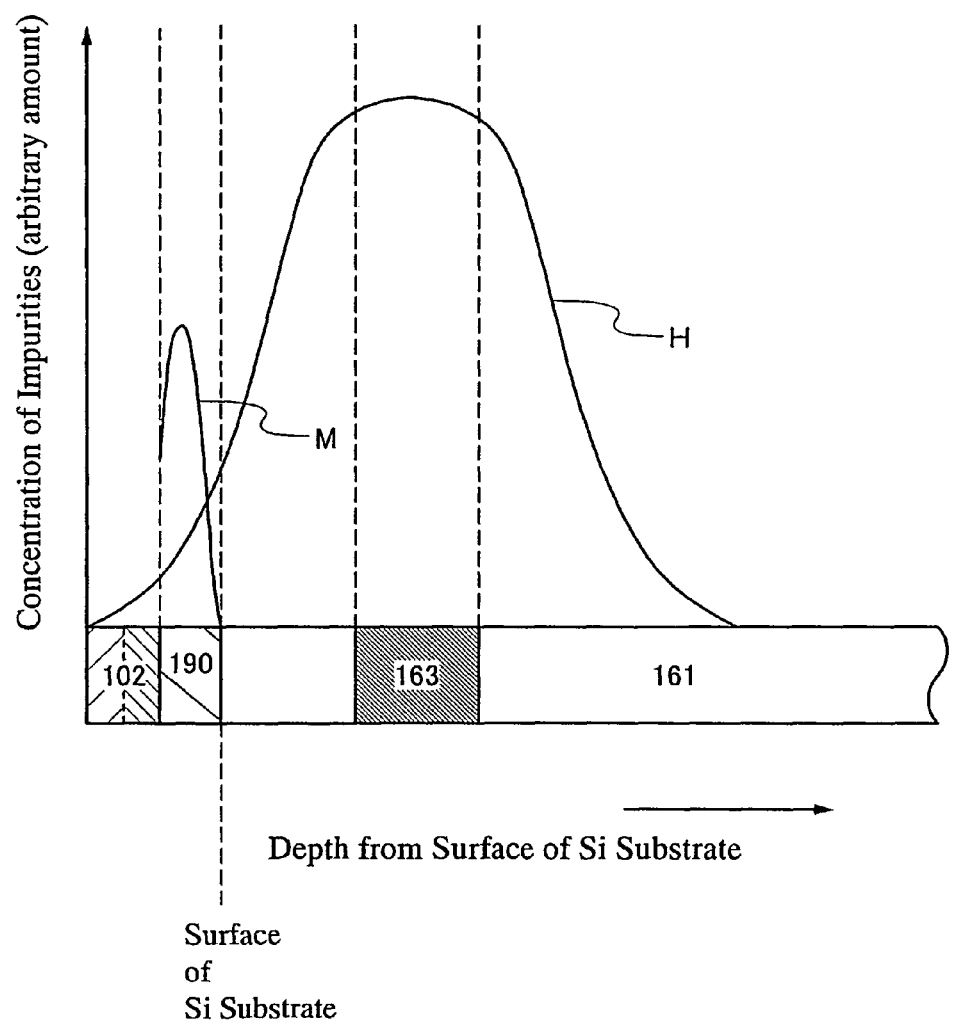
FIG. 32 illustrates an example of a method for manufacturing a light-emitting device of the present invention.

FIG. 32 schematically shows the distribution of the halogen ions added to the semiconductor substrate 161 as a curve H. The halogen elements added to the semiconductor substrate 161 are Gaussian-distributed. The separation layer 163 is formed in a region which is close to an average depth at which ions have entered the semiconductor substrate 161 from the surface of the semiconductor substrate 161. Of course, the ions are almost Gaussian-distributed so as to peak at a certain depth in the case where a semiconductor is irradiated with ions accelerated by an electric field, and the peak position of the Gaussian distribution is used as a guide of the depth of the separation layer 163.

It is preferable that ion irradiation be performed with an ion doping apparatus. That is, a doping method is used in which irradiation with a plurality of ion species produced in such a way that a source gas is made into plasma is performed without mass separation. In this embodiment mode, it is preferable to perform irradiation with one kind of ions or plural kinds of ions of different masses each including the same atom. At the ion doping, the accelerating voltage may be 10 to 100 kV, preferably 30 to 80 kV; the dosage may be $1\times10^{16}$ to $4\times10^{16}/cm^2$; and the beam current density may be equal to or greater than 2 $\mu A/cm^2$, preferably equal to or greater than 5 $\mu A/cm^2$, and more preferably equal to or greater than 10 $\mu A/cm^2$. By the irradiation, defects produced in the semiconductor substrate 161 can be reduced.

As the halogen which is used for the irradiation, fluorine, chlorine, or bromine is selected. As gas which is supplied to a doping apparatus for obtaining halogen ions, HF, $NF_3$, HBr, $Cl_2$, $ClF_3$, $BCl_3$, $F_2$, $Br_2$, or the like is used. Crystals are not badly damaged though the semiconductor substrate 161 is irradiated with ions of fluorine as halogen ions because fluorine has the small mass number in particular. The irradiation with the halogen ions is performed so that halogen is contained at a concentration of $1 \times 10^{20}/cm^3$ (preferably $5 \times 10^{20}/cm^3$) or more in the separation layer 163 formed in the semiconductor substrate 161. In the semiconductor substrate 161, when a halogen addition region of high concentration is locally formed, the crystal structure is disordered and fine holes are formed, so that the separation layer 163 having a porous structure can be obtained. In this case, a change occurs in the volume of fine voids formed in the separation layer 163 by heat treatment at a comparatively low temperature, and separation occurs along the separation layer 163; accordingly, a thin single-crystal semiconductor layer can be formed.

In this process, irradiation with hydrogen ions may be performed concurrently or before or after the irradiation of the semiconductor substrate 161 with halogen ions. When irradiation with hydrogen ions is performed, the hydrogen ions preferably include $H^+$, $H_2^+$, and $H_3^+$ ions with a high proportion of $H_3^+$ ions, whereby the irradiation efficiency of ions can be increased and the time for irradiation can be shortened.

Since an ion doping apparatus performs irradiation with ions without mass separation, the semiconductor substrate 161 is irradiated with metal ions concurrently with halogen ions or hydrogen ions. Since a metal ion has the large mass number, most metal ions are distributed in a top surface on the ion irradiation side. In this embodiment mode, the oxide film 190 is formed over a surface of the semiconductor substrate 161. When the oxide film 190 is formed thicker than the depth at which the metal ions are added, the distribution of the metal can be kept within the oxide film 190. When halogen is contained in the oxide film 190 by HCl oxidation or the like, the oxide film 190 has an effect of gettering an impurity such as a heavy metal which gives an adverse effect on the semiconductor substrate 161. Thus, the impurity captured in the oxide film 190 can be fixed to prevent contamination of the semiconductor substrate 161.

Even when the semiconductor substrate 161 is irradiated with ions which have been subjected to mass separation, the separation layer 163 can be similarly formed. Also in this case, selective irradiation with ions of a large mass (for example, $H_3^+$ ions) is preferable because an effect which is similar to that described above is obtained.

Other than hydrogen, deuterium or an inert gas such as helium can also be selected as the gas from which ion species from which ions are produced are produced. When helium is used as a source gas and an ion doping apparatus which does not have a mass-separation function is used, an ion beam with a high proportion of $He^+$ ions can be obtained. By irradiation of the semiconductor substrate 161 with such ions, fine voids can be formed and the separation layer 163 similar to the above can be provided in the semiconductor substrate 161.

Figure 31C:
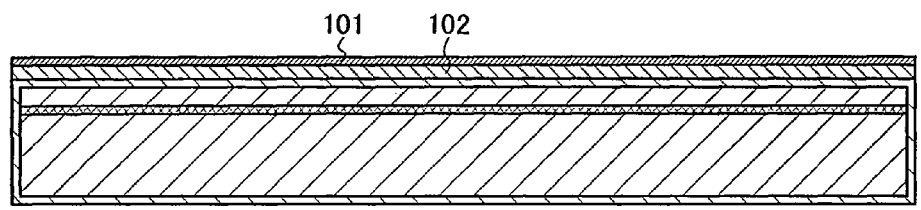

A nitrogen-containing layer 102 is formed over the oxide film 190, and a bonding layer 101 is formed over the nitrogen-containing layer 102 (see FIG. 31C). The nitrogen-containing layer 102 and the bonding layer 101 may be formed using the manufacturing method and the material described in Embodiment Mode 1.

Figure 31D:
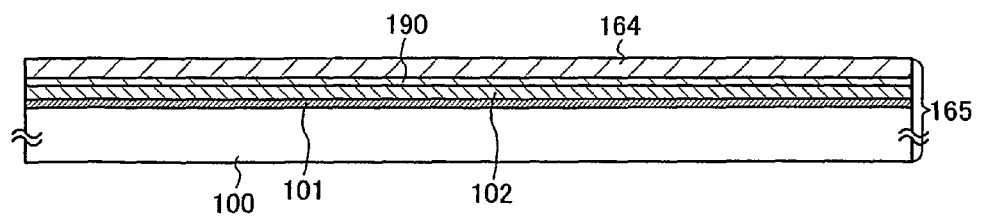

Through a subsequent step after that shown in FIG. 3D, an SOI substrate 165 is obtained, which is provided with a single-crystal semiconductor layer 164 with the bonding layer 101, the nitrogen-containing layer 102, and the oxide film 190 interposed between the single-crystal semiconductor layer 164 and the substrate 100 (see FIG. 31D).

The SOI substrate described in this embodiment mode can be combined with the structure of the light-emitting device which is described in other embodiment modes in this specification, as appropriate.

Embodiment Mode 3

This embodiment mode describes an example of a light-emitting device with reference to the drawings.

Figure 8:
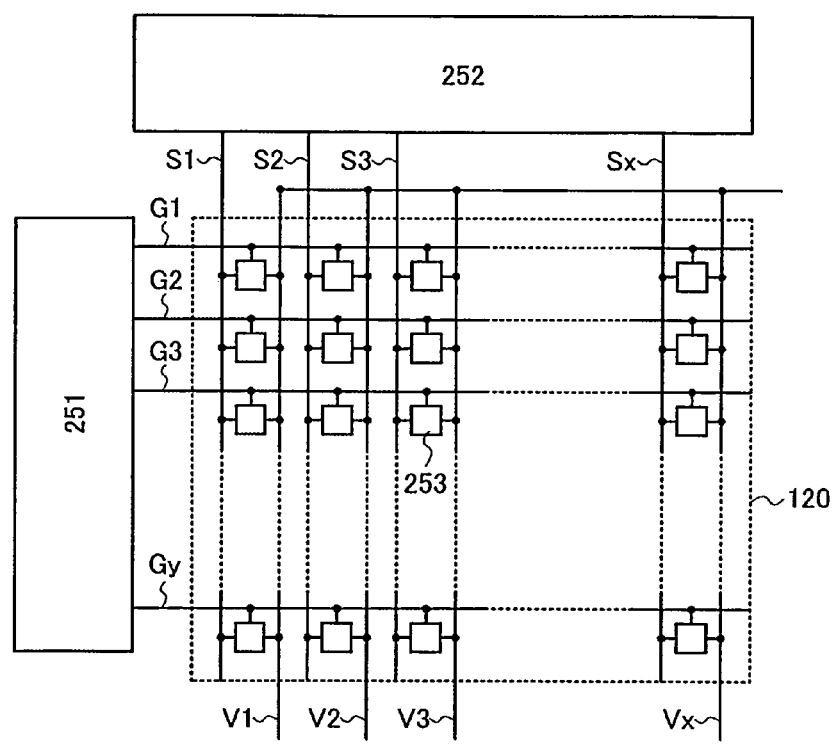
FIG. 8 is a diagram showing an example of a pixel structure of a light-emitting device of the present invention.

FIG. 8 shows a block diagram of an active-matrix EL display device. The EL display device includes a driver circuit portion formed of a scanning line driver circuit 251, a signal line driver circuit 252, and the like, and a pixel portion 120 in which a plurality of pixels 253 is arranged.

A signal output from the signal line driver circuit 252 is input to signal lines S1 to Sx and transferred to each pixel 253. A signal output from the scanning line driver circuit 251 is input to scanning lines G1 to Gy and transferred to each pixel 253. Power supply lines V1 to Vx are arranged to be parallel to the signal lines and supply current to each pixel 253.

The EL display device described in this embodiment mode can have a structure in which the driver circuit portion including the scanning line driver circuit 251, the signal line driver circuit 252, and the like and the pixel portion 120 are provided over one substrate. Further, the scanning line driver circuit 251, the signal line driver circuit 252, and the pixels 253 are formed using transistors in each of which a single-crystal semiconductor layer is used as a channel formation region as described in the above embodiment mode. Therefore, the miniaturization or higher-speed operation of an element such as a transistor becomes possible, as compared to an EL display device in which each transistor of a driver circuit portion and a pixel is formed using a polycrystalline semiconductor layer.

Figure 9:
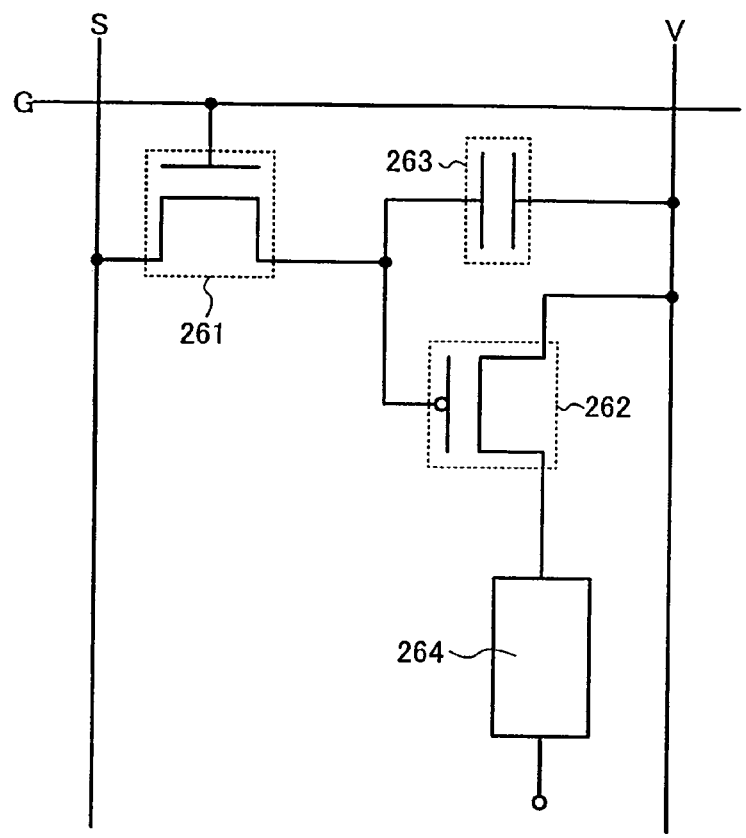
FIG. 9 is a diagram showing an example of a structure of a light-emitting device of the present invention.

Next, FIG. 9 shows an example of the pixel 253 of the EL display device described in this embodiment mode.

The pixel 253 includes a first transistor 261, a second transistor 262, a capacitor 263, and a light-emitting element 264. Here, an example is described in which the first transistor 261 is an n-channel transistor and the second transistor 262 is a p-channel transistor; however, the present invention is not limited thereto. Both the first transistor 261 and the second transistor 262 may be n-channel transistors or p-channel transistors, or the first transistor 261 may be a p-channel transistor and the second transistor 262 may be an n-channel transistor.

A gate of the first transistor 261 is electrically connected to a scanning line (here, referred to as "a scanning line G"), which is any of the scanning lines G1 to Gy, one of a source and a drain of the first transistor 261 is electrically connected to a signal line (here, referred to as "a signal line S"), which is any of the signal lines S1 to Sx, and the other of the source and the drain of the first transistor 261 is electrically connected to one of electrodes of the capacitor 263 and a gate of the second transistor 262. It is to be noted that the first transistor 261 may be referred to as a switching transistor or a transistor for switching.

The gate of the second transistor 262 is electrically connected to the other of the source and the drain of the first transistor 261 and one of electrodes of the capacitor 263, one of a source and a drain of the second transistor 262 is electrically connected to a power supply line (here, referred to as "a power supply line V"), which is any of the power supply lines V1 to Vx, and the other of the source and the drain of the second transistor 262 is electrically connected to one of electrodes of the light-emitting element 264. The other of the electrodes of the light-emitting element 264 may be set to a low power source potential. It is to be noted that the second transistor 262 may be referred to as a driving transistor.

It is to be noted that the low power source potential refers to a potential satisfying (the low power source potential)<(a high power source potential) based on the high power source potential set to the power supply line V. As the low power source potential, GND, 0 V, or the like may be set, for example.

The other of the electrodes of the capacitor 263 is electrically connected to the power supply line (here, referred to as "the power supply line V"), which is any of the power supply lines V1 to Vx. It is to be noted that the gate capacitance of the second transistor 262 may be used as a substitute for the capacitor 263, so that the capacitor 263 can be omitted. The gate capacitance of the second transistor 262 may be formed in a region where a source region, a drain region, an LDD region, or the like overlaps with the gate electrode. Alternatively, the capacitance may be formed between a channel formation region and the gate electrode.

Next, an operation of the EL display device is described. It is to be noted that the case is described where the EL display device described in this embodiment mode is operated by constant-current driving. The constant-current driving refers to driving by constant current in a period of holding video such as one frame period but does not refer to driving by the same amount of current at all times.

In a pixel where the scanning line G is selected, the potential of the signal line S is input to one of electrodes of the capacitor 263 through the first transistor 261 which has been turned to an on-state (a conduction state). Electric charges for voltage corresponding to a video signal are stored in the capacitor 263, and the capacitor 263 stores the voltage. This voltage corresponds to gate-source voltage Vgs of the second transistor 262.

Then, voltage between the electrodes of the capacitor 263 is applied to the gate of the second transistor 262, and current passes through the light-emitting element 264 from the power supply line V via the second transistor 262 in accordance with the applied voltage. Thus, the light-emitting element 264 emits light.

The emission luminance of the light-emitting element 264 is almost proportional to the amount of current passing through the light-emitting element 264. Therefore, the gray scale of the pixel can be expressed by changing the amount of current passing through the light-emitting element 264.

In the EL display device described in this embodiment mode, current passing through the light-emitting element 264 is input from the power supply line V in accordance with voltage applied to the gate of the second transistor 262. Here, drain-source voltage Vds of a transistor and drain current Id thereof have a relation as shown in FIG. 10.

Figure 10:
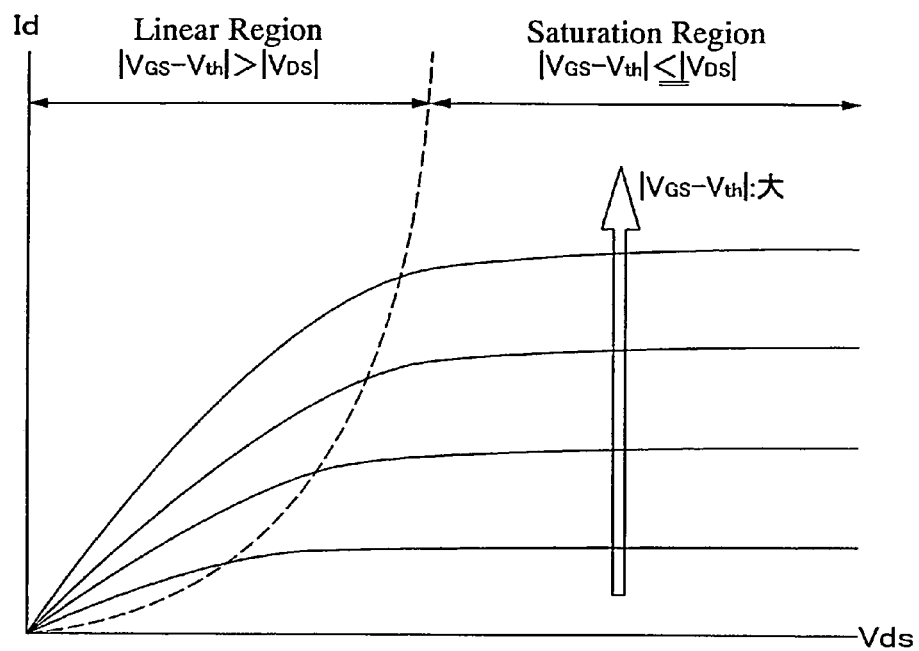
FIG. 10 is a graph illustrating an operation of a light-emitting device of the present invention.

FIG. 10 shows graphs of drain currents Id corresponding to different gate voltages Vgs. Drain current Id becomes higher as |Vgs−Vth|, an absolute value of a difference between gate voltage Vgs and threshold voltage Vth of the second transistor 262, becomes higher; in other words, |Vgs|, an absolute value of the gate voltage Vgs, becomes higher.

In the case where |Vgs−Vth|, an absolute value of a difference between gate voltage Vgs and threshold voltage Vth of the second transistor 262, is higher than |Vds|, an absolute value of drain-source voltage Vds, the transistor operates in the linear region. In the case where |Vgs−Vth| is equal to or lower than |Vds|, an absolute value of drain-source voltage Vds, the transistor operates in the saturation region. When the transistor operates in the saturation region, a current value is hardly changed even through the drain-source voltage Vds is changed, and the current value is determined only by the amount of Vgs.

In the EL display device described in this embodiment mode, when the light-emitting element 264 emits light, the second transistor 262 is operated in the saturation region in which |Vds|, an absolute value of drain-source voltage Vds, is equal to or higher than |Vgs−Vth|, an absolute value of a difference between gate voltage Vgs and threshold voltage Vth of the second transistor 262. When the light-emitting element 264 does not emit light, the second transistor 262 may be turned off.

The gray scale of the pixel in the EL display device is expressed by changing voltage applied to the gate of the second transistor 262 (by changing a potential input to the signal line S) to change current passing through the light-emitting element 264 (by a constant-current analog gray scale method). That is, in a constant-current analog gray scale method, a gray scale is displayed by changing an analog video signal input to the signal line S (by changing the potential of the signal line S).

In general, in the case where the second transistor 262 is operated in the saturation region when the light-emitting element 264 emits light, there is a problem in that variation in mobility or threshold values of transistors among pixels leads to variation in drain current, resulting in display unevenness of the EL display device. In particular, in the case where a transistor is formed using a polycrystalline semiconductor layer, there is a wide variation in mobility or threshold values of transistors between pixels, which makes it difficult to operate an EL display device by constant-current driving. This is because, in crystallization of a semiconductor layer (laser crystallization or the like), it is difficult to obtain a polycrystalline semiconductor layer having a uniform crystal grain boundary in the entire region included in a pixel portion.

On the other hand, in the EL display device described in this embodiment mode, with the use of an SOI substrate, a transistor or the like included in a pixel is formed using a single-crystal semiconductor layer; thus, variation in mobility or threshold values of transistors between pixels can be reduced. Accordingly, even in the case where the second transistor 262 is operated in the saturation region, a change in characteristics of the transistor is small, and thus, display unevenness of the EL display device can be prevented even when the EL display device is operated by a constant-current analog gray scale method.

An operation of the EL display device described in this embodiment mode is performed by constant-current driving and light emission of the light-emitting element 264 is controlled by current. Therefore, even when a V-I characteristic of the light-emitting element is changed by a temperature change or deterioration of the light-emitting element, luminance at a certain level can be held as compared to the case where an operation is performed by constant-voltage driving in which light emission of the light-emitting element 264 is controlled by voltage.

Next, a pixel structure of an EL display device illustrated in FIG. 9 is described with reference to the drawings.

Figure 11A:
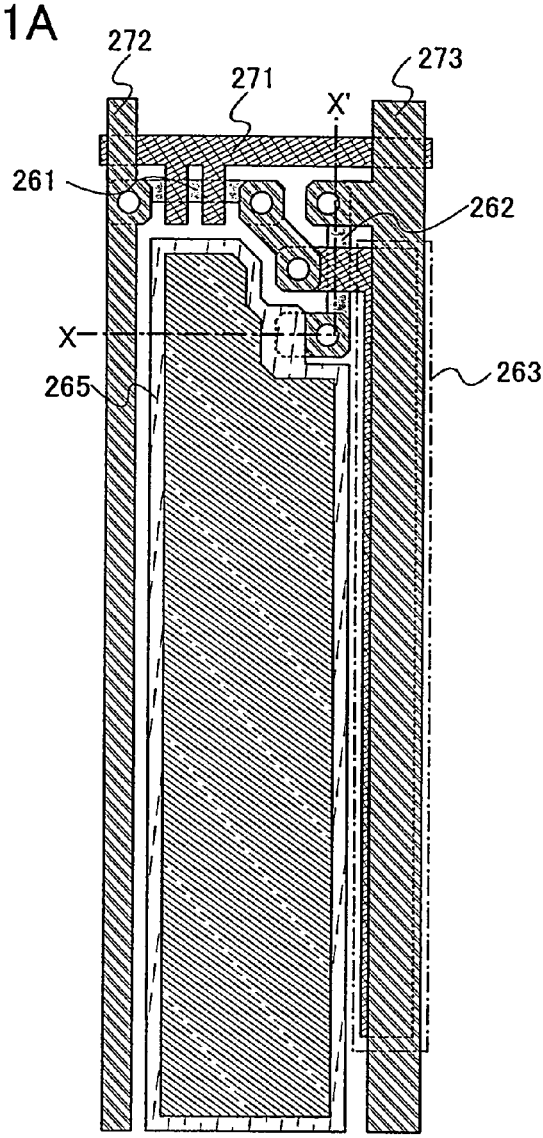
FIGS. 11A and 11B are a top view and a cross-sectional view, respectively, which show an example of a structure of a light-emitting device of the present invention.
Figure 11B:
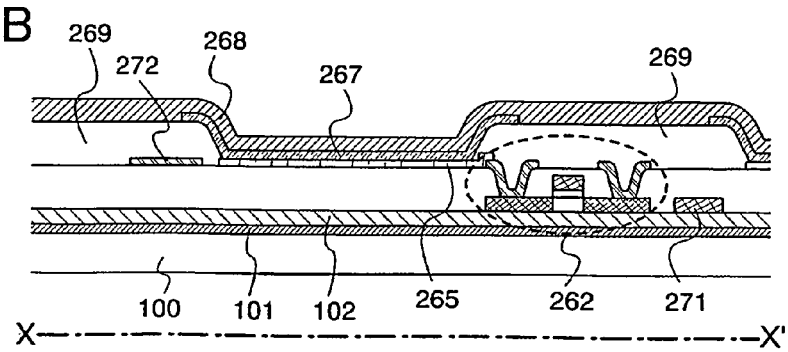

FIG. 11A shows an example of a top plan view (a layout diagram) of a pixel including two transistors (a first transistor and a second transistor). FIG. 11B shows an example of a cross-sectional view taken along X-X' in FIG. 11A.

FIGS. 11A and 11B show a first transistor 261, a first wiring 271, a second wiring 272, a second transistor 262, a third wiring 273, a counter electrode 268, a capacitor 263, a pixel electrode 265, a partition wall 269, an organic thin film 267, and a substrate 100. It is to be noted that the first transistor 261 is used as a switching transistor, the first wiring 271 as a scanning line G, the second wiring 272 as a signal line S, the second transistor 262 as a driving transistor, and the third wiring 273 as a power supply line V.

Further, the EL display device described in this embodiment mode can be manufactured using the SOI substrate described in the above embodiment mode. Accordingly, channel formation regions of the first transistor 261 and the second transistor 262 which are provided over the substrate 100 made of glass or the like can be manufactured using single-crystal semiconductor layers. Here, a structure is described in which the bonding layer 101 and the nitrogen-containing layer 102 are stacked from the substrate 100 side between the substrate 100 and a single-crystal semiconductor layer included in each of the first transistor 261 and the second transistor 262.

By provision of the nitrogen-containing layer 102, an alkali metal such as sodium or an alkaline-earth metal which is included in glass can be prevented from being mixed into the single-crystal semiconductor layer included in each of the first transistor 261 and the second transistor 262 in the case of using a glass substrate as the substrate 100.

It is to be noted that the structure of the EL display device described in this embodiment mode is not limited thereto. For example, as shown in FIG. 1A, a structure may be used in which a nitrogen-containing layer is not provided between the substrate 100 and the single-crystal semiconductor layer included in each of the first transistor 261 and the second transistor 262. Further, as shown in FIG. 2, a structure may be used in which the nitrogen-containing layer 151, the bonding layer 152, and the bonding layer 101 are stacked from the substrate 100 side between the substrate 100 and the single-crystal semiconductor layer included in each of the first transistor 261 and the second transistor 262.

A gate electrode of the first transistor 261 is electrically connected to the first wiring 271. One of a source electrode and a drain electrode of the first transistor 261 is electrically connected to the second wiring 272. The other of the source electrode and the drain electrode of the first transistor 261 is electrically connected to a gate electrode of the second transistor 262 and one of electrodes of the capacitor 263. It is to be noted that the gate electrode of the first transistor 261 includes a plurality of gate electrodes. Accordingly, leakage current in the off state of the first transistor 261 can be reduced.

One of the source electrode and the drain electrode of the second transistor 262 is electrically connected to the third wiring 273, and the other of the source electrode and the drain electrode of the second transistor 262 is electrically connected to the pixel electrode 265. Accordingly, current passing through the pixel electrode 265 can be controlled by the second transistor 262.

The organic thin film 267 (an organic compound layer) is provided over the pixel electrode 265. The counter electrode 268 is provided over the organic thin film 267 (the organic compound layer). It is to be noted that the counter electrode 268 may be formed to be connected to all the pixels in common, or may be patterned using a shadow mask or the like.

Light emitted from the organic thin film 267 (the organic compound layer) is transmitted through either the pixel electrode 265 or the counter electrode 268.

In FIG. 11B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 265 be formed of a transparent conductive layer. On the other hand, in the case of top emission, it is preferable that the counter electrode 268 be formed of a transparent conductive layer.

In a light-emitting device for color display, EL elements having respective light emission colors of RGB may be separately formed, or an EL element with a single color may be formed and light emission of RGB can be obtained by using a color filter.

It is to be noted that the structure shown in FIGS. 11A and 11B are just examples, and various structures can be employed for a pixel layout, a cross-sectional structure, a stacking order of electrodes of an EL element, and the like, other than the structure shown in FIGS. 11A and 11B. Further, as a light-emitting element, various elements such as a crystalline element such as an LED, and an element formed of an inorganic thin film can be used as well as the element formed of the organic thin film shown in the drawing.

It is to be noted that this embodiment mode can be combined with the structure of the light-emitting device which is described in other embodiment modes in this specification, as appropriate.

Embodiment Mode 4

This embodiment mode descries a light-emitting device which is different from that in the above embodiment mode, with reference to the drawings. In specific, the case is described where an EL display device is operated by a constant-current digital gray scale method, with reference to the drawings.

An EL display device of this embodiment mode is similar to that in Embodiment Mode 2 in that the second transistor 262 is operated in the saturation region at the time of light emission of the light-emitting element 264 in FIG. 9. However, gray scale display of the light-emitting element 264 is performed by combination of light emission and non-light emission of the light-emitting element 264. Therefore, two kinds of potentials are applied to the gate of the second transistor 262 to control light emission or non-light emission of the light-emitting element 264.

In the case where the light-emitting element 264 is in a non-light emission state, a potential at which the second transistor 262 is turned off is supplied to the gate electrode of the second transistor 262 through the first transistor 261 from the signal line S. In the case where the light-emitting element 264 is in a light emission state, a constant potential at which the second transistor 262 is turned on is supplied to the gate electrode of the second transistor 262.

That is, ideally, constant current passing through the light-emitting element 264 is made constant to obtain constant luminance from the light-emitting element 264. Then, a plurality of subframe periods is provided in one frame period. A video signal is written to a pixel in each subframe period, lighting and non-lighting of the pixel are controlled in each subframe period, and a gray scale is expressed by the sum of lighting subframe periods.

An operation of an EL display device in this embodiment mode is described below.

FIGS. 12A and 12B are timing charts showing an example of digital time gray scale driving. The timing chart of FIG. 12A shows a driving method in the case where a signal writing period (an address period) to a pixel and a light-emitting period (a sustain period) are separated.

One frame period refers to a period for fully displaying an image for one display region. One frame period includes a plurality of subframe periods, and one subframe period includes an address period and a sustain period. Address periods Ta1 to Ta4 indicate time for writing signals to pixels in all rows, and periods Tb1 to Tb4 indicate time for writing signals to pixels in one row (or one pixel). Sustain periods Ts1 to Ts4 indicate time for maintaining a lighting state or a non-lighting state in accordance with a video signal written to the pixel, and a ratio of the length of the sustain periods is set to satisfy Ts1:Ts2:Ts3:Ts4=$2^3:2^2:2^1:2^0$=8:4:2:1. A gray scale is expressed depending on in which sustain period light emission is performed.

First, in the address period Ta1, pixel selection signals are sequentially input to scanning lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of each pixel in the sustain period Ts1 are controlled by the written video signal. Similarly, in the address periods Ta2, Ta3, and Ta4, a video signal is input to pixels, and lighting and non-lighting of each pixel in the sustain periods Ts2, Ts3, and Ts4 are controlled by the video signal. Then, in each subframe period, a pixel to which a signal for not lighting in the address period and for lighting when the sustain period starts after the address period ends is written is lit.

Here, the i-th pixel row is described with reference to FIG. 12B. First, in the address period Ta1, pixel selection signals are input to scanning lines from a first row, and in a period Tb1($i$) in the address period Ta1, a pixel in the i-th row is selected. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period Ts1 are controlled by the written video signal. Similarly, in the address periods Ta2, Ta3, and Ta4, a video signal is input to the pixel in the i-th row, and lighting and non-lighting of the pixel in the i-th row in the sustain periods Ts2, Ts3, and Ts4 are controlled by the video signal. Then, in each subframe period, a pixel to which a signal for not lighting in the address period and for lighting when the sustain period starts after the address period ends is written is lit.

Here, the case where a 4-bit gray scale is expressed is described here; however, the number of bits and the number of gray scales are not limited thereto. It is to be noted that lighting is not needed to be performed in order of Ts1, Ts2, Ts3, and Ts4, and the order may be random or light may be emitted by dividing the whole period into a plurality of periods. The lighting time of Ts1, Ts2, Ts3, and Ts4 is not needed to be a power of two, and may be the same length or slightly different from a power of two.

Next, a driving method in the case where a period for writing a signal to a pixel (an address period) and a light-emitting period (a sustain period) are not separated is described. That is, a pixel in a row in which a writing operation of a video signal is completed maintains the signal until another signal is written to the pixel (or the signal is erased). A period between the writing operation and writing of another signal to the pixel is referred to as data holding time. In the data holding time, the pixel is lit or not lit in accordance with the video signal written to the pixel. The same operations are performed until the last row, and the address period ends. Then, an operation proceeds to a signal writing operation of the next subframe period sequentially from a row in which the data holding time ends.

As described above, in the case of a driving method in which a pixel is immediately lit or not lit in accordance with a video signal written to the pixel when the signal writing operation is completed and the data holding time starts, signals cannot be input to two rows at the same time even when an attempt to make the data holding time shorter than the address time is made. Accordingly, address periods need to be prevented from overlapping, so that the data holding time cannot be made shorter. As a result, it is difficult to perform high-level gray scale display.

Thus, the data holding time is set to be shorter than the address period by provision of an erasing period. A driving method in the case where the data holding time shorter than the address period is set by provision of an erasing period is described with reference to FIG. 13A.

First, in the address period Ta1, pixel scan signals are sequentially input to scanning lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of the pixel in the sustain period Ts1 are controlled by the written video signal. In a row in which a writing operation of a video signal is completed, a pixel is immediately lit or not lit in accordance with the written video signal. The same operations are performed until the last row, and the address period Ta1 ends. Then, an operation proceeds to a signal writing operation of the next subframe period sequentially from a row in which the data holding time ends. Similarly, in the address periods Ta2, Ta3, and Ta4, a video signal is input to the pixel, and lighting and non-lighting of the pixel in the sustain periods Ts2, Ts3, and Ts4 are controlled by the video signal. The end of the sustain period Ts4 is set by the start of an erasing operation. This is because when a signal written to a pixel is erased in an erasing time Te of each row, the pixel is forced to be not lit regardless of the video signal written to the pixel in the address period until another signal is written to the pixel. That is, the data holding time ends from a pixel in which the erasing time Te starts.

Figures 13A, 13B:
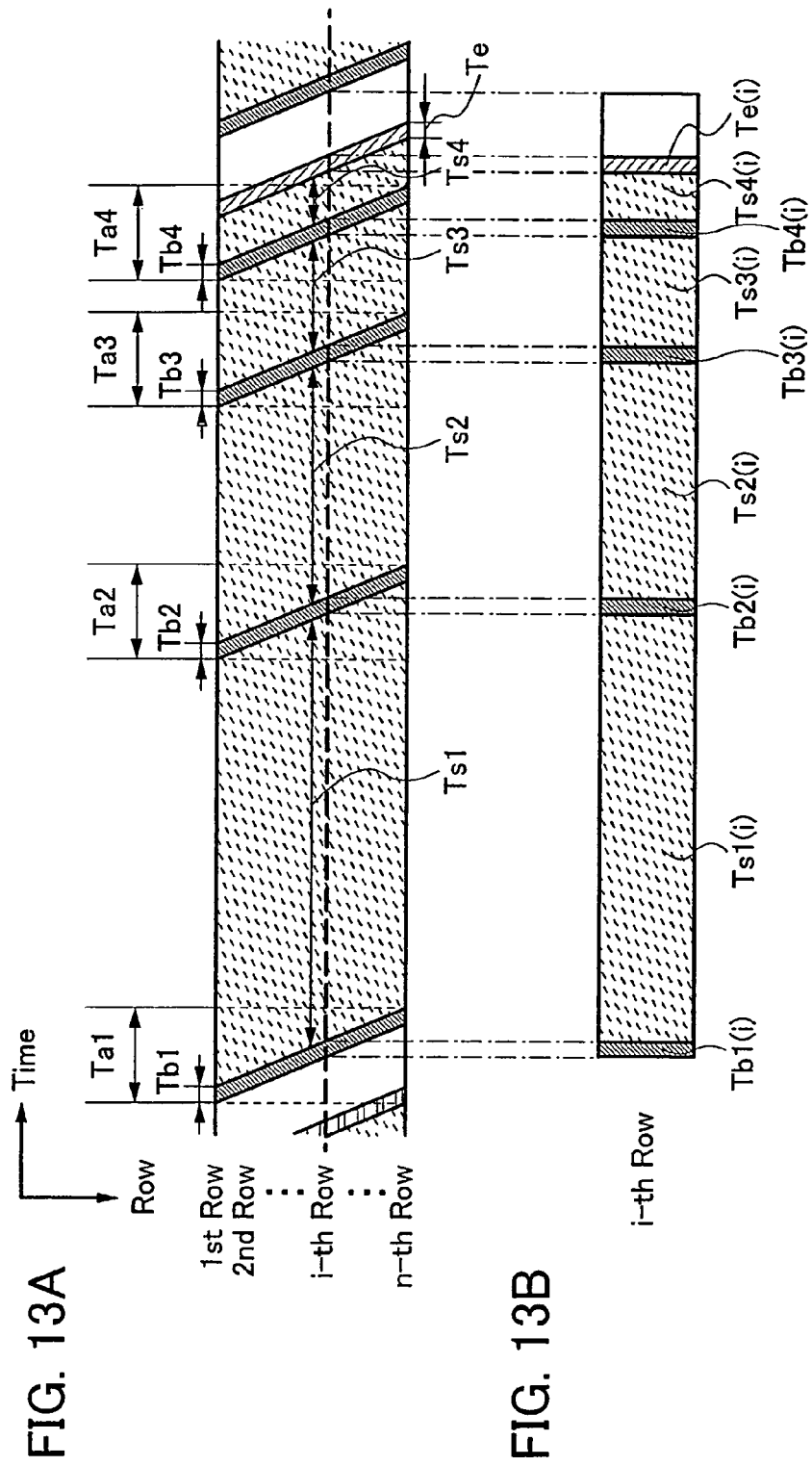
FIGS. 13A and 13B are views illustrating an operation of a light-emitting device of the present invention.

Here, the i-th pixel row is described with reference to FIG. 13B. In the i-th pixel row, in the address period Ta1, pixel scan signals are sequentially input to scanning lines from a first row, and a pixel is selected. Then, in the period Tb1($i$), while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in a sustain period Ts1($i$) are controlled by the written video signal. That is, the pixel in the i-th row is immediately lit or not lit in accordance with the video signal written to the pixel after the writing operation of the video signal to the i-th row is completed. Similarly, in the address periods Ta2, Ta3, and Ta4, a video signal is input to the pixel in the i-th row, and lighting and non-lighting of the pixel in the i-th row in the sustain periods Ts2, Ts3, and Ts4 are controlled by the video signal. The end of a sustain period Ts4($i$) is set by the start of an erasing operation. This is because the pixel is forced to be not lit regardless of the video signal written to the pixel in the i-th row in an erasing time Te(i) in the i-th row. That is, the data holding time of the pixel in the i-th row ends when the erasing time Te(i) starts.

Thus, a display device with a high-level gray scale and a high duty ratio (a ratio of a lighting period in one frame period) can be provided, since a lighting period of a pixel which is shorter than an address period can be provided without separating the address period and a sustain period. Since instantaneous luminance can be lowered, reliability of a display element can be improved.

Here, the case where a 4-bit gray scale is expressed is described here; however, the number of bits and the number of gray scales are not limited thereto. It is to be noted that lighting is not needed to be performed in order of Ts1, Ts2, Ts3, and Ts4, and the order may be random or light may be emitted by dividing the whole period into a plurality of periods. The lighting time of Ts1, Ts2, Ts3, and Ts4 is not needed to be a power of two, and may be the same length or slightly different from a power of two.

Next, a structure and an operation of a pixel to which digital time gray scale driving which is described with reference to FIGS. 13A and 13B can be applied are described with reference to FIGS. 14 and 15.

Figure 14:
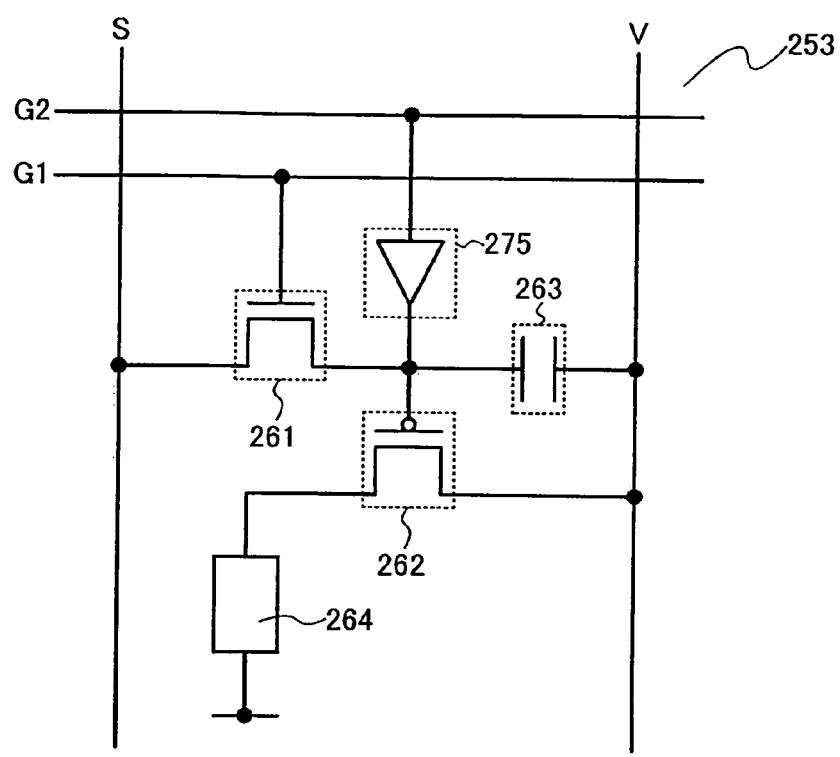
FIG. 14 is a diagram showing an example of a pixel structure of a light-emitting device of the present invention.

FIG. 14 shows an example of a pixel structure to which digital time gray scale driving can be applied.

A pixel 253 includes a first transistor 261 for switching, a second transistor 262 for driving, a capacitor 263, a light-emitting element 264, and a rectifying element 275. A gate of the first transistor 261 is connected to a first scanning line G1, a first electrode (one of a source electrode and a drain electrode) of the first transistor 261 is connected to a signal line S, and a second electrode (the other of the source electrode and the drain electrode) of the first transistor 261 is connected to a gate of the second transistor 262. The gate of the second transistor 262 is connected to a power supply line V through the capacitor 263 and is connected to a second scanning line G2 through the rectifying element 275, a first electrode of the second transistor 262 is connected to the power supply line V, and a second electrode of the second transistor 262 is connected to a first electrode (a pixel electrode) of the light-emitting element 264. A second electrode of the light-emitting element 264 corresponds to a common electrode.

It is to be noted that the second electrode (the common electrode) of the light-emitting element 264 is set to have a low power source potential. A low power source potential refers to a potential satisfying (the low power source potential)<(a high power source potential) based on the high power source potential set to the power supply line V. As the low power supply potential, GND, 0 V, or the like can be set, for example.

It is to be noted that gate capacitance of the second transistor 262 may be used as a substitute for the capacitor 263, so that the capacitor 263 can be omitted. The gate capacitance of the second transistor 262 may be formed in a region where a source region, a drain region, an LDD region, or the like overlaps with the gate electrode. Alternatively, capacitance may be formed between a channel formation region and the gate electrode.

As the rectifying element 275, a diode-connected transistor can be used. A PN junction diode, a PIN junction diode, a Schottky diode, a diode formed of a carbon nanotube, or the like may be used other than a diode-connected transistor. A diode-connected transistor may be an n-channel transistor or a p-channel transistor.

The pixel 253 is such that the rectifying element 275 and the second scanning line G2 are added to the pixel shown in FIG. 9.

An erasing operation is described. In the erasing operation, a high level signal is input to the second scanning line G2. Thus, current is supplied to the rectifying element 275, and a gate potential of the second transistor 262 held by the capacitor 263 can be set to a certain potential. That is, the potential of the gate of the second transistor 262 is set to a certain value, and the second transistor 262 can be forced to be turned off regardless of a video signal written to the pixel.

It is to be noted that a low level signal input to the second scanning line G2 has a potential such that current is not supplied to the rectifying element 275 when a video signal for non-lighting is written to a pixel. A high level signal input to the second scanning line G2 has a potential such that a potential to turn off the second transistor 262 can be set to the gate regardless of a video signal written to a pixel.

As the rectifying element 275, a diode-connected transistor can be used. A PN junction diode, a PIN junction diode, a Schottky diode, a diode formed of a carbon nanotube, or the like may be used other than a diode-connected transistor. A diode-connected transistor may be an n-channel transistor or a p-channel transistor.

Figure 15:
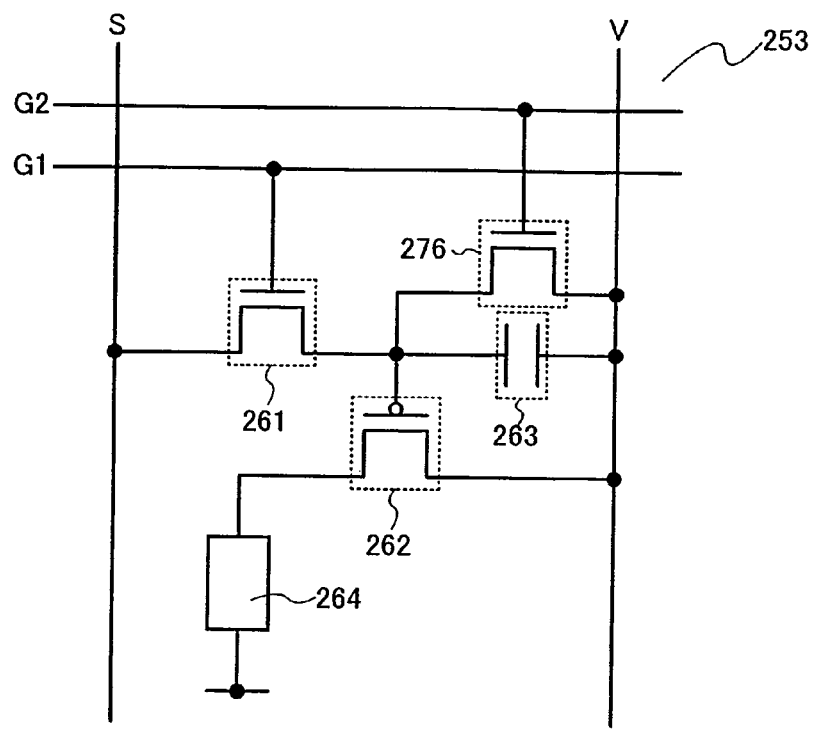
FIG. 15 is a diagram showing an example of a pixel structure of a light-emitting device of the present invention.

FIG. 15 shows another example of a pixel structure to which digital time gray scale driving can be applied.

A pixel 253 includes a first transistor 261 for switching, a second transistor 262 for driving, a capacitor 263, a light-emitting element 264, and an erasing transistor 276. A gate of the first transistor 261 is connected to a first scanning line G1, a first electrode (one of a source electrode and a drain electrode) of the first transistor 261 is connected to a signal line S, and a second electrode (the other of the source electrode and the drain electrode) of the first transistor 261 is connected to a gate of the second transistor 262. The gate of the second transistor 262 is connected to a power supply line V through the capacitor 263, and is also connected to a first electrode of the erasing transistor 276. A first electrode of the second transistor 262 is connected to the power supply line V, and a second electrode of the second transistor 262 is connected to a first electrode (a pixel electrode) of the light-emitting element 264. A gate of the erasing transistor 276 is connected to a second scanning line G2, and a second electrode of the erasing transistor 276 is connected to the power supply line V. A second electrode of the light-emitting element 264 corresponds to a common electrode.

The second electrode (the common electrode) of the light-emitting element 264 is set to have a low power supply potential.

It is to be noted that gate capacitance of the second transistor 262 may be used as a substitute for the capacitor 263, so that the capacitor 263 can be omitted. The gate capacitance of the second transistor 262 may be formed in a region where a source region, a drain region, an LDD region, or the like overlaps with the gate electrode. Alternatively, capacitance may be formed between a channel formation region and the gate electrode.

The pixel is such that the erasing transistor 276 and the second scanning line G2 are added to the pixel shown in FIG. 9.

An erasing operation is described. In the erasing operation, a high level signal is input to the second scanning line G2. Thus, the erasing transistor 276 is turned on, and the gate and the first electrode of the second transistor 262 can be made to have the same potential. That is, Vgs of the second transistor 262 can be 0 V. Accordingly, the second transistor 262 can be forced to be turned off.

It is to be noted that this embodiment mode can be combined with the structure of the light-emitting device which is described in other embodiment modes in this specification, as appropriate.

Embodiment Mode 5

This embodiment mode describes an example of a driving method of a light-emitting device.

Figure 16:
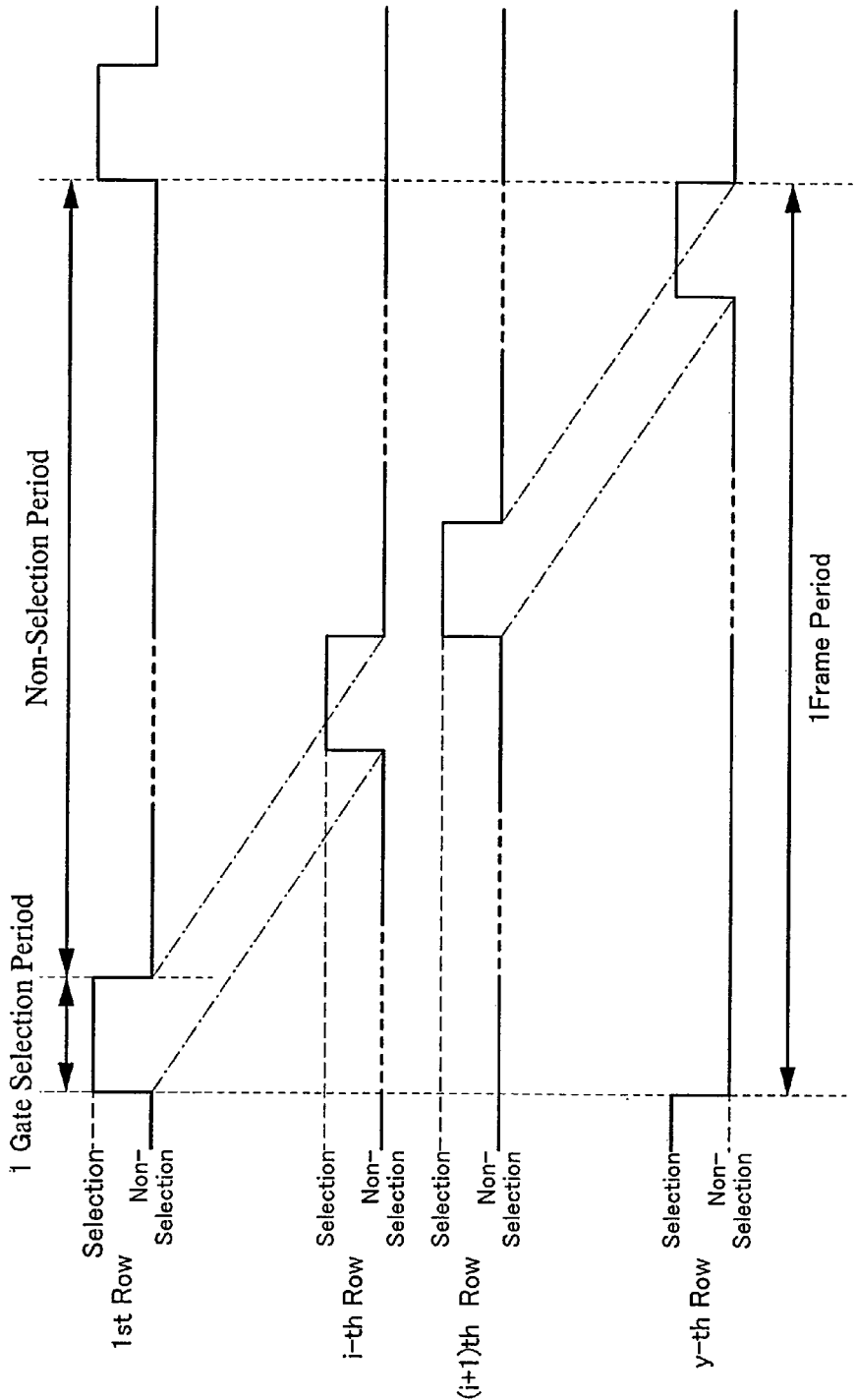
FIG. 16 is a view illustrating an operation of a light-emitting device of the present invention.

FIG. 16 shows an example of a timing chart for describing an operation of the EL display device shown in FIG. 8.

The timing chart of FIG. 16 shows one frame period corresponding to a period when an image of one screen is displayed. One frame period is not particularly limited, but is preferably at least 1/60 second or less so that a viewer does not perceive a flicker.

The timing chart of FIG. 16 shows timing of selecting the scanning line G1 in the first row, the scanning line Gi (one of the scanning lines G1 to Gy) in the i-th row, the scanning line Gi+1 in the (i+1)th row, and the scanning line Gy in the y-th row.

At the same time as the scanning line is selected, the pixel 253 connected to the scanning line is also selected. For example, when the scanning line Gi in the i-th row is selected, the pixel 253 connected to the scanning line Gi in the i-th row is also selected.

The scanning lines G1 to Gy are sequentially selected (hereinafter also referred to as scanned) from the scanning line G1 in the first row to the scanning line Gy in the y-th row. For example, while the scanning line Gi in the i-th row is selected, the scanning lines (G1 to Gi−1 and Gi+1 to Gy) other than the scanning line G1 in the i-th row are not selected. Then, during the next period, the scanning line Gi+1 in the (i+1)th row is selected. It is to be noted that a period during which one scanning line is selected is referred to as one gate selection period.

Accordingly, when a scanning line in a certain row is selected, video signals from the signal lines S1 to Sx are input to a plurality of pixels 253 connected to the scanning line. For example, while the scanning line Gi in the i-th row is selected, given video signals are input from the signal lines S1 to Sx to the plurality of pixels 253 connected to the scanning line Gi in the i-th row. Thus, each of the plurality of pixels 253 can be controlled individually by the scan signal and the video signal.

Next, the case where one gate selection period is divided into a plurality of subgate selection periods is described.

FIG. 17 is a timing chart in the case where one gate selection period is divided into two subgate selection periods (a first subgate selection period and a second subgate selection period).

It is to be noted that one gate selection period may be divided into three or more subgate selection periods.

The timing chart of FIG. 17 shows one frame period corresponding to a period when an image of one screen is displayed. One frame period is not particularly limited, but is preferably at least 1/60 second or less so that a viewer does not perceive a flicker.

It is to be noted that one frame is divided into two subframes (a first subframe and a second subframe).

The timing chart of FIG. 17 shows timing of selecting the scanning line Gi in the i-th row, the scanning line Gi+1 in the (i+1)th row, the scanning line Gj (one of the scanning lines Gi+1 to Gy) in the j-th row, and the scanning line Gj+1 in the (j+1)th row.

At the same time as the scanning line is selected, the pixel 253 connected to the scanning line is also selected. For example, when the scanning line Gi in the i-th row is selected, the pixel 253 connected to the scanning line Gi in the i-th row is also selected.

The scanning lines G1 to Gy are sequentially scanned in each subgate selection period. For example, in one gate selection period, the scanning line Gi in the i-th row is selected in the first subgate selection period, and the scanning line Gj in the j-th row is selected in the second subgate selection period. Thus, in one gate selection period, an operation can be performed as if the scan signals of two rows are selected. At this time, different video signals are input to the signal lines S1 to Sx in the first subgate selection period and the second subgate selection period. Accordingly, different video signals can be input to a plurality of pixels 253 connected to the i-th row and a plurality of pixels 253 connected to the j-th row.

Next, a driving method for displaying images with high quality is described.

Figure 18A:
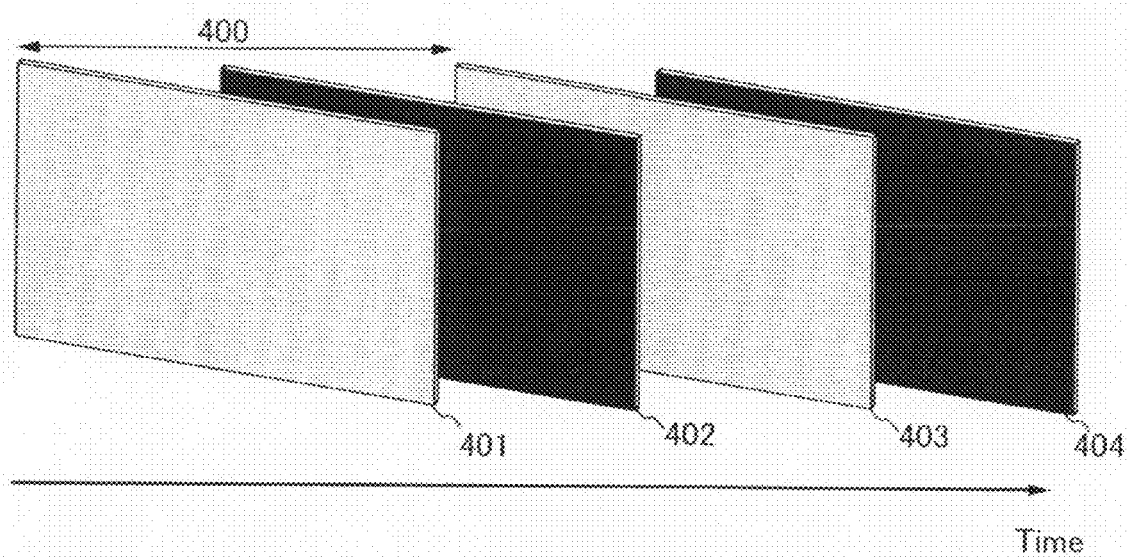
FIGS. 18A and 18B are perspective views illustrating operations of a light-emitting device of the present invention.
Figure 18B:
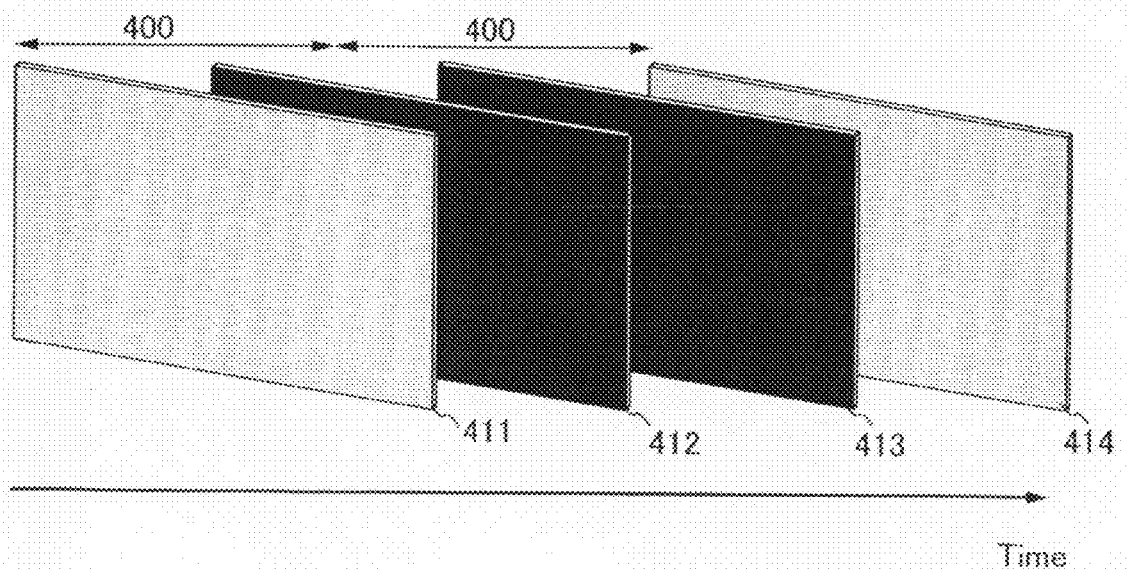

FIGS. 18A and 18B are views for describing high frequency driving.

FIG. 18A shows the case where one image and one intermediate image are displayed in one frame period 400. Reference numerals 401, 402, 403, and 404 denote an image of one frame, an intermediate image of the frame, an image of the next frame, and an intermediate image of the next frame, respectively.

The intermediate image 402 of the frame may be made based on image signals of the frame and the next frame. Alternatively, the intermediate image 402 of the frame may be made from the image 401 of the frame, or may be a black image. Accordingly, the quality of a moving image in a hold-type display device can be improved. Further, when one image and one intermediate image are displayed in one frame period 400, there is an advantage in that consistency with a frame rate of the video signal can be easily obtained and an image processing circuit is not complicated.

FIG. 18B shows the case where one image and two intermediate images are displayed in a period with two successive one frame periods 400 (two frame periods). Reference numeral 411, 412, 413, and 414 denote an image of the frame, an intermediate image of the frame, an intermediate image of the next frame, an image of a frame after next, respectively.

Each of the intermediate image 412 of the frame and the intermediate image 413 of the next frame may be made based on video signals of the frame, the next frame, and the frame after next. Alternatively, each of the intermediate image 412 of the frame and the intermediate image 413 of the next frame may be a black image. When one image and two intermediate images are displayed in two frame periods, there is an advantage in that operating frequency of a peripheral driver circuit is not so high and the quality of a moving image can be effectively improved.

In driving an EL display device described in this embodiment mode, various frequencies can be used for frame frequency. For example, frame frequency such as 60 Hz, 90 Hz, 120 Hz, 150 Hz, 240 Hz, or the like may be used. In the EL display device in this embodiment mode, transistors included in driver circuit portions such as a scanning line driver circuit portion and a signal line driver circuit portion and a pixel portion can be formed using a single-crystal semiconductor layer, as described in the above embodiment mode. Accordingly, the transistors can be operated at high speed. Even when the transistors are operated at high speed, low power consumption can be attempted as compared to a transistor formed using a polycrystalline semiconductor layer.

It is to be noted that this embodiment mode can be combined with the structure of the light-emitting device which is described in other embodiment modes in this specification, as appropriate.

Embodiment Mode 6

This embodiment mode describes an example of a driving method of a light-emitting device. In specific, overdriving is described with reference to the drawings.

Figure 19A:
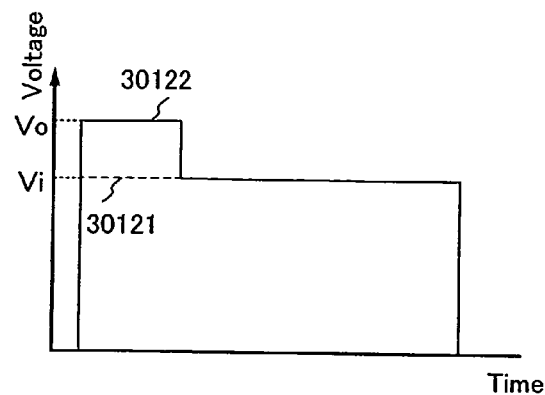
FIGS. 19A to 19C are a graph and views which illustrate operations of a light-emitting device of the present invention.
Figure 19B:
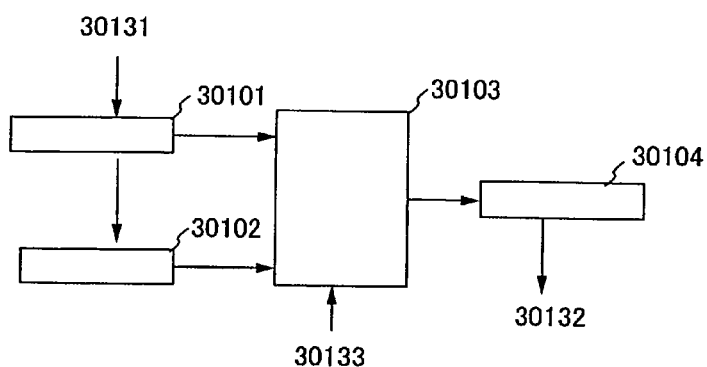
Figure 19C:
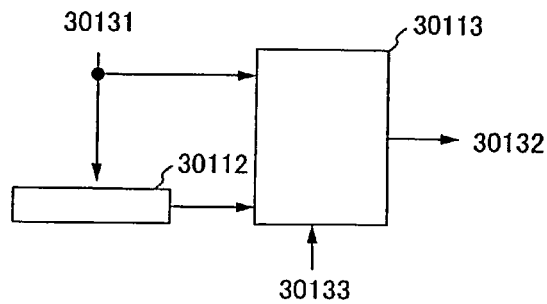

First, overdriving is described with reference to FIGS. 19A to 19C. FIG. 19A shows voltage which is input from the signal line S to the gate of the second transistor for driving through the first transistor for switching, in the above-described EL display device. In general, although input voltage 30121 for obtaining intended output luminance Lo is Vi, a certain time is necessary in some cases before output luminance reaches the intended output luminance when Vi is directly input as voltage to be input.

With the use of overdriving, light can be emitted from a light-emitting element sooner with the intended output luminance. In specific, this is a method as follows: first, Vo which is larger voltage than voltage Vi is applied to the gate of the second transistor for a certain time to increase response speed, and then, the input voltage input to the second transistor is returned to Vi. The input voltage at this time is as shown by input voltage 30122 in FIG. 19A. Although the response speed of a light-emitting element is generally higher than that of a liquid crystal element, in the case where there is a delay or the like due to a wiring material such as wiring resistance, overdriving is effectively used.

It is to be noted that although the case where output luminance is changed positively with respect to input voltage is described in FIG. 19A, this embodiment mode also includes the case where output luminance is changed negatively with respect to input voltage.

A circuit for realizing such driving is described with reference to FIGS. 19B and 19C. First, the case where an input image signal 30131 is a signal having an analog value (may be a discrete value) and an output image signal 30132 is also a signal having an analog value is described with reference to FIG. 19B. An overdriving circuit shown in FIG. 19B includes an encoding circuit 30101, a frame memory 30102, a correction circuit 30103, and a D/A converter circuit 30104.

First, the input image signal 30131 is input to the encoding circuit 30101 and encoded. That is, the input image signal 30131 is converted from an analog signal into a digital signal with an appropriate bit number. After that, the converted digital signal is input to each of the frame memory 30102 and the correction circuit 30103. An image signal of the previous frame which is held in the frame memory 30102 is input to the correction circuit 30103 at the same time. Then, in the correction circuit 30103, an image signal corrected using an image signal of the frame and the image signal of the previous frame is output in accordance with a numeric value table which is prepared in advance. At this time, an output switching signal 30133 may be input to the correction circuit 30103 and the corrected image signal and the image signal of the frame may be switched to be output. Next, the corrected image signal or the image signal of the frame is input to the D/A converter circuit 30104. Then, the output image signal 30132 which is an analog signal having a value in accordance with the corrected image signal or the image signal of the frame is output. In this manner, overdriving is realized.

Next, the case where the input image signal 30131 is a signal having a digital value and the output image signal 30132 is also a signal having a digital value is described with reference to FIG. 19C. An overdriving circuit shown in FIG. 19C includes a frame memory 30112 and a correction circuit 30113.

First, the input image signal 30131 is a digital signal and is input to each of the frame memory 30112 and the correction circuit 30113. An image signal of the previous frame which is held in the frame memory 30112 is input to the correction circuit 30113 at the same time. Then, in the correction circuit 30113, an image signal corrected using an image signal of the frame and the image signal of the previous frame is output in accordance with a numeric value table which is prepared in advance. At this time, the output switching signal 30133 may be input to the correction circuit 30113 and the corrected image signal and the image signal of the frame may be switched to be output. In this manner, overdriving is realized.

It is to be noted that the case where the input image signal 30131 is an analog signal and the output image signal 30132 is a digital signal is included in the overdriving circuit in this embodiment mode. At this time, the D/A converter circuit 30104 may be omitted from the circuit shown in FIG. 19B. In addition, the case where the input image signal 30131 is a digital signal and the output image signal 30132 is an analog signal is included in the overdriving circuit in this embodiment mode. At this time, the encoding circuit 30101 may be omitted from the circuit shown in FIG. 19B.

This embodiment mode can be combined with the structure of a light-emitting device which is described in any of other embodiment modes in this specification, as appropriate.

Embodiment Mode 7

In this embodiment mode, a display panel manufactured by using the SOI substrate described in the above embodiment mode is described with reference to FIGS. 20A and 20B and the like. FIG. 20A is a top view showing a display panel. FIG. 20B is a cross-sectional view taken along a line A-A' of FIG. 20A. A signal line driver circuit 4401, a pixel portion 4402, a first scanning line driver circuit 4403, and a second scanning line driver circuit 4406, which are indicated by dotted lines, are included. A sealing substrate 4404 and a sealing material 4405 are also included, and a space surrounded by the sealing material 4405 is a space 4407.

A wiring 4408 is a wiring to transmit signals input to the first scanning line driver circuit 4403, the second scanning line driver circuit 4406, and the signal line driver circuit 4401, and receives video signals, clock signals, start signals, and the like from an FPC 4409 that becomes an external input terminal. An IC chip (a semiconductor chip in which a memory circuit, a buffer circuit, and the like are formed) 4422 and 4423 are mounted over a junction portion of the FPC 4409 and the display panel by COG (chip on glass) or the like. It is to be noted that only the FPC is shown in the figure; however, a printed wiring board (PWB) may be attached to the FPC. Instead of including a semiconductor chip in the memory circuit, the buffer circuit, and the like, a transistor using a single-crystal semiconductor layer may be included in the memory circuit, the buffer circuit, and the like.

Next, a cross-sectional structure is described with reference to FIG. 20B. The pixel portion 4410 and peripheral driver circuits (the first scanning line driver circuit 4403, the second scanning line driver circuit 4406, and the signal line driver circuit 4401) are formed over a substrate 100. Here, the signal line driver circuit 4401 and the pixel portion 4402 are shown.

It is to be noted that the signal line driver circuit 4401 is formed using a plurality of transistors such as transistors 4420 and 4421. The transistors 4420 and 4421 can each have a structure in which a single-crystal semiconductor layer is used as a semiconductor layer which is to be a channel formation region. Also, a structure is shown here in which a bonding layer 101 and a nitrogen-containing layer 102 are stacked from the substrate 100 side.

By provision of the nitrogen-containing layer 102, in the case where a glass substrate is used as the substrate 100, an alkali metal such as sodium or an alkaline-earth metal which is included in glass can be prevented from being mixed into a single-crystal semiconductor layer included in the first transistor 261 and the second transistor 262.

It is to be noted that the structure of the display panel described in this embodiment mode is not limited thereto. For example, a structure may be used in which a nitrogen-containing layer is not provided between the single-crystal semiconductor layer included in the transistor and the substrate 100, as shown in FIG. 1A. Alternatively, a structure may be used in which the nitrogen-containing layer 151, the bonding layer 152, and the bonding layer 101 are stacked from the substrate 100 side between the single-crystal semiconductor layer included in the transistor and the substrate 100, as shown in FIG. 2.

In addition, the pixel portion 4402 includes a plurality of circuits forming a pixel including a switching transistor 4411 (a first transistor) and a driving transistor 4412 (a second transistor). It is to be noted that a source electrode of the driving transistor 4412 is connected to a first electrode 4413. An insulator 4414 is formed to cover an end portion of the first electrode 4413. Here, a positive photosensitive acrylic resin film is used. The transistors 4411 and 4412 can each have a structure in which a single-crystal semiconductor layer is used as a semiconductor layer which is to be a channel formation region.

In addition, for good coverage, a curved surface having curvature is formed at an upper end portion or a lower end portion of the insulator 4414. For example, when positive photosensitive acrylic is used as a material for the insulator 4414, a curved surface having a curvature radius (0.2 to 3 µm) is preferably provided only at the upper end portion of the insulator 4414. Further, as the insulator 4414, either negative photosensitive acrylic that become insoluble in an etchant by light irradiation or positive photosensitive acrylic that become soluble in an etchant by light irradiation can be used.

A layer 4416 containing an organic compound and a second electrode 4417 are formed over the first electrode 4413. Here, as a material used for the first electrode 4413 functioning as an anode, a material with a high work function is preferably used. For example, a single layer film such as an ITO (indium tin oxide) film, an indium zinc oxide (IZO) film, a titanium nitride film, a chromium film, a tungsten film, a Zn film, or a Pt film; a stacked-layer structure of a titanium nitride film and a film containing aluminum as its main component; a three-layer structure of a titanium nitride film, a film containing aluminum as its main component, and a titanium nitride film, and the like can be used. It is to be noted that in a case of a stacked-layer structure, resistance as a wiring is low, good ohmic contact is obtained, and a function as an anode can be obtained.

The layer 4416 containing the organic compound is formed by an evaporation method using an evaporation mask or by an ink-jet method. A metal complex using a metal from group 4 of the periodic table is used for a part of the layer 4416 containing the organic compound, and a low molecular material or a high molecular material may be used in combination. Further, for a material used for the layer including the organic compound, a single layer or a stacked layer of an organic compound is often used; however, in this embodiment mode, an inorganic compound may be used in a part of a film formed from an organic compound. Moreover, a triplet material can also be used.

Further, as a material used for the second electrode 4417, which is a cathode and formed over the layer 4416 containing the organic compound, a material with a low work function (Al, Ag, Li, Ca, or an alloy thereof such as MgAg, MgIn, AlLi, CaF$_2$, or calcium nitride) may be used. It is to be noted that when light generated in the layer 4416 containing the organic compound is transmitted through the second electrode 4417, a stacked-layer structure of a metal thin film and a transparent conductive layer (ITO (indium tin oxide), an indium oxide-zinc oxide alloy (In$_2$O$_3$—ZnO), zinc oxide, or the like) is preferably used as the second electrode 4417.

In addition, the sealing substrate 4404 is attached to the substrate 100 with the sealing material 4405 to have a structure provided with a light-emitting element 4418 in the space 4407 surrounded by the substrate 100, the sealing substrate 4404, and the sealing material 4405. It is to be noted that the space 4407 may be filled with the sealing material 4405 or with a rare gas (such as nitrogen or argon).

It is to be noted that an epoxy-based resin is preferably used for the sealing material 4405. Further, it is desirable that these materials transmit as little moisture or oxygen as possible. In addition, as a material used for the sealing substrate 4404, a plastic substrate formed using FRP (fiberglass-reinforced plastics), PVF (polyvinyl fluoride), polyester, acrylic, or the like as well as a glass substrate or a quartz substrate can be used.

As described above, a display panel using the SOI substrate described in Embodiment Mode 1 can be obtained.

As shown in FIGS. 20A and 20B, the signal line driver circuit 4401, the pixel portion 4402, the first scanning line driver circuit 4403, and the second scanning line driver circuit 4406 are formed over the same substrate 100, whereby reduction in cost of the display device can be realized. Further, when unipolar transistors are used for the signal line driver circuit 4401, the pixel portion 4402, the first scanning line driver circuit 4403, and the second scanning line driver circuit 4406, simplification of a manufacturing process can be realized, whereby further cost reduction can be realized. When a single-crystal semiconductor layer is used for semiconductor layers of transistors used for the signal line driver circuit 4401, the pixel portion 4402, the first scanning line driver circuit 4403, and the second scanning line driver circuit 4406, a display device can be reduced in size and operated at high speed.

It is to be noted that the signal line driver circuit and the scanning line driver circuit are not limited to being provided in a row direction and a column direction of the pixels.

Figure 21:
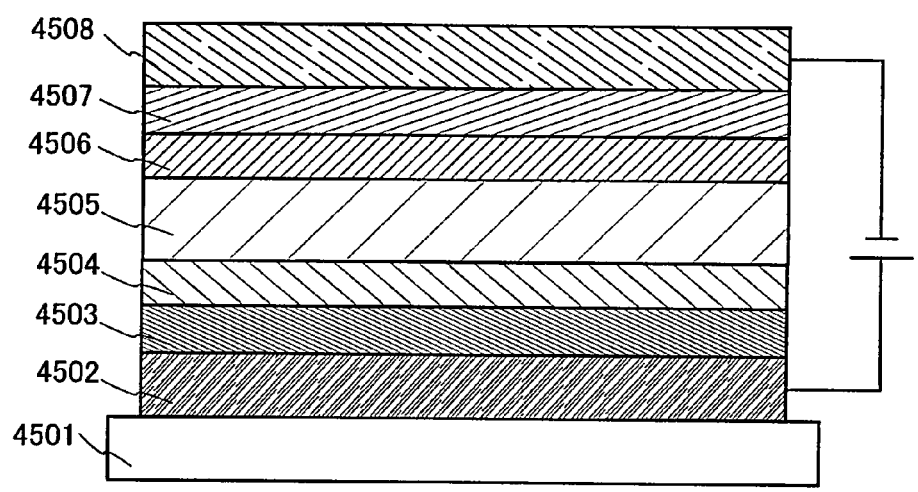
FIG. 21 is a cross-sectional view showing an example of a structure of a light-emitting element of a light-emitting device of the present invention.

Next, FIG. 21 shows an example of a light-emitting element which can be applied to the light-emitting element 4418.

An element structure is such that an anode 4502, a hole injecting layer 4503 formed from a hole injecting material, a hole transporting layer 4504 formed from a hole transporting material, a light-emitting layer 4505, an electron transporting layer 4506 formed from an electron transporting material, an electron injecting layer 4507 formed from an electron injecting material, and a cathode 4508 are stacked over a substrate 4501. Here, the light-emitting layer 4505 may be formed from only one kind of a light-emitting material in some cases and may be formed from two or more kinds of materials in other cases. A structure of the element of the present invention is not limited to this structure.

In addition to the stacked-layer structure shown in FIG. 21, in which functional layers are stacked, there are wide variations such as an element formed using a high molecular compound and a high efficiency element utilizing a triplet light-emitting material which emits light from a triplet excitation state in a light-emitting layer. These variations can also be applied to a white light-emitting element or the like which can be obtained by controlling a recombination region of carriers using a hole blocking layer and dividing a light-emitting region into two regions.

Next, a manufacturing method of the element shown in FIG. 21 is described. First, a hole injecting material, a hole transporting material, and a light-emitting material are sequentially evaporated on the substrate 4501 including the anode 4502 (ITO (indium tin oxide)). Next, an electron transporting material and an electron injecting material are evaporated, and finally, the cathode 4508 is formed by evaporation.

Next, materials suitable for the hole injecting material, the hole transporting material, the electron transporting material, the electron injecting material, and the light-emitting material are described as follows.

As the hole injecting material, an organic compound such as a porphyrin-based compound, phthalocyanine (hereinafter referred to as "$H_2Pc$"), copper phthalocyanine (hereinafter referred to as "CuPc"), or the like is effective. A material which has a lower ionization potential than that of the hole transporting material to be used and has a hole transporting function can also be used as the hole injecting material. Further, a material, such as polyaniline and polyethylene dioxythiophene (hereinafter referred to as "PEDOT") doped with polystyrene sulfonate (hereinafter referred to as "PSS"), obtained by subjecting a conductive high molecular compound to chemical doping may also employed. Further, an insulating high molecular compound is effective in planarization of the anode, and polyimide (hereinafter referred to as "PI") is often used. Further, an inorganic compound which includes an ultrathin film of aluminum oxide (hereinafter referred to as "alumina") as well as a thin film of a metal such as gold or platinum is also used.

As the hole transporting material, an aromatic amine-based compound (that is, a compound having a benzene ring-nitrogen bond) is most widely used. A material which is widely used as the hole transporting material includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD"), and 4,4'-bis[N-(1-naphthyl)-N-phenyl-amino]-biphenyl (hereinafter referred to as "α-NPD"), and starburst aromatic amine compounds such as 4,4',4"-tris(N,N-diphenyl-amino)-triphenylamine (hereinafter referred to as "TDATA") and 4,4',4"-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton, such as tris(8-quinolinolato)aluminum (hereinafter referred to as "$Alq_3$"), BAlq, tris(4-methyl-8-quinolinolato)aluminum (hereinafter referred to as "Almq"), or bis(10-hydroxybenzo[h]-quinolinato)beryllium (hereinafter referred to as "Bebq"). In addition, a metal complex having an oxazole-based or a thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$") may be employed. Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-1,2,4-triazole (hereinafter referred to as "p-EtTAZ"), and phenanthroline derivatives such as bathophenanthroline (hereinafter referred to as "BPhen") and BCP have electron transporting properties.

As the electron injecting material, the above-mentioned electron transporting materials can be used. In addition, an ultrathin film of an insulator, for example, metal halide such as calcium fluoride, lithium fluoride, or cesium fluoride or alkali metal oxide such as lithium oxide is often used. Further, an alkali metal complex such as lithium acetyl acetonate (hereinafter referred to as "Li(acac)") or 8-quinolinolato-lithium (hereinafter referred to as "Liq") is also effective.

As the light-emitting material, in addition to the above-mentioned metal complexes such as $Alq_3$, Almq, BeBq, BAlq, $Zn(BOX)_2$, and $Zn(BTZ)_2$, various fluorescent pigments are effective. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is reddish orange, and the like. In addition, a triplet light-emitting material which mainly includes a complex with platinum or iridium as a central metal is available. As the triplet light-emitting material, tris(2-phenylpyridine)iridium, bis(2-(4'-tolyl)pyridinato-N,$C^{2'}$)acetylacetonato iridium (hereinafter referred to as "acaclr$(tpy)_2$"), 2,3,7,8,12,13,17,18-octaethyl-21H,23Hporphyrin-platinum, and the like are known.

By using the materials having each function as described above in combination, a highly reliable light-emitting element can be formed.

A light-emitting element of which layers are formed in reverse order of that in FIG. 21 can also be used. That is, the cathode 4508, the electron injecting layer 4507 formed from the electron injecting material, the electron transporting layer 4506 formed from the electron transporting material, the light-emitting layer 4505, the hole transporting layer 4504 formed from the hole transporting material, the hole injecting layer 4503 formed from the hole injecting material, and the anode 4502 are sequentially stacked over the substrate 4501.

In addition, it is acceptable as long as at least one of the anode and the cathode of the light-emitting element is transparent in order to extract light emission. A transistor and a light-emitting element are formed over a substrate; and there are light-emitting elements having a top emission structure where light emission is extracted from a surface on the side opposite to the substrate, having a bottom emission structure where light emission is extracted from a surface on the substrate side, and having a dual emission structure where light emission is extracted from both the surface on the side opposite to the substrate and the surface on the substrate side. A pixel configuration of the present invention can be applied to a light-emitting element having any emission structure.

A light-emitting element having a top emission structure is described with reference to FIG. 22A.

A driving transistor 4601 is formed over a substrate 100. A first electrode 4602 is formed in contact with a source electrode of the driving transistor 4601, and a layer 4603 containing an organic compound and a second electrode 4604 are formed thereover.

The first electrode 4602 is an anode of the light-emitting element. The second electrode 4604 is a cathode of the light-emitting element. That is, a region where the layer 4603 containing the organic compound is interposed between the first electrode 4602 and the second electrode 4604 functions as the light-emitting element.

As a material used for the first electrode 4602 which functions as the anode, a material having a high work function is desirably used. For example, a single layer film such a titanium nitride film, a chromium film, a tungsten film, a Zn film, or a Pt film, a stacked-layer structure of a titanium nitride film and a film containing aluminum as its main component, a three-layer structure of a titanium nitride film, a film containing aluminum as its main component, and a titanium nitride film, or the like can be used. It is to be noted that in a case of a stacked-layer structure, the resistance as a wiring is low, a good ohmic contact can be obtained, and further, a function as an anode can be achieved. By using a metal film which reflects light, an anode which does not transmit light can be formed.

As a material used for the second electrode 4604 which functions as the cathode, a stacked layer of a thin metal film formed from a material having a low work function (Al, Ag, Li, Ca, or an alloy thereof such as MgAg, MgIn, AlLi, $CaF_2$, or calcium nitride) and a transparent conductive layer (ITO (indium tin oxide), indium zinc oxide (IZO), zinc oxide (ZnO), or the like) is preferably used. With the use of a thin metal film and a transparent conductive layer having a light transmitting property, a cathode which can transmit light can be formed.

Figure 22A:
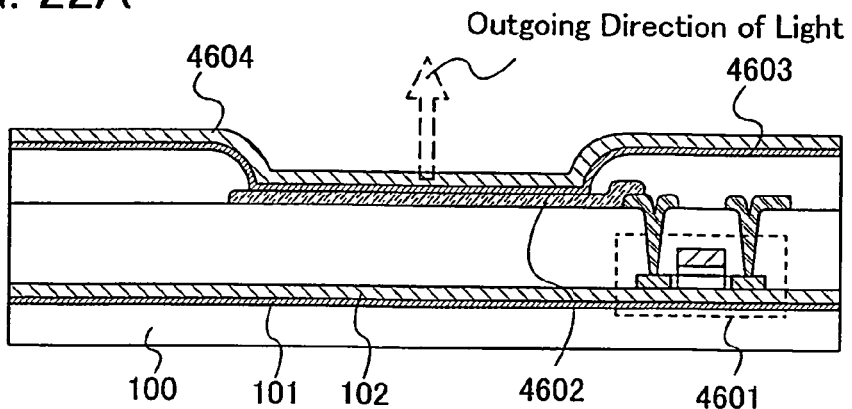
FIGS. 22A to 22C are cross-sectional views each showing an example of a structure of a light-emitting device of the present invention.

As described above, light from the light-emitting element can be extracted from a top surface as shown by an arrow in FIG. 22A. That is, when the structure is used for the display panel shown in FIGS. 20A and 20B, light is emitted toward the sealing substrate 4404 side. Therefore, when a light-emitting element having a top emission structure is employed in a display device, a substrate having a light transmitting property is used as the sealing substrate 4404.

When an optical film is provided, the sealing substrate 4404 may be provided with an optical film.

It is to be noted that a metal film formed from a material such as MgAg, MgIn, or AlLi, which functions as a cathode and has a low work function can be used for the first electrode 4602. In this case, a transparent conductive layer, such as an ITO (indium tin oxide) film or an indium zinc oxide (IZO) film, can be used for the second electrode 4604. Therefore, the transmittance of the top light emission can be improved with this structure.

Next, a light-emitting element having a bottom emission structure is described with reference to FIG. 22B. The same reference numerals as those in FIG. 22A are used since the structure of the light-emitting element is the same except for the light emission structure.

Here, as a material used for the first electrode 4602 which functions as the anode, a material having a high work function is preferably used. For example, a transparent conductive layer such as an ITO (indium tin oxide) film or an indium zinc oxide (IZO) film can be used. With the use of a transparent conductive layer having a light transmitting property, an anode which can transmit light can be formed.

As a material used for the second electrode 4604 which functions as the cathode, a metal film formed from a material having a low work function (Al, Ag, Li, Ca, or an alloy thereof such as MgAg, MgIn, AlLi, $CaF_2$, or calcium nitride) can be used. With the use of a metal film which reflects light, a cathode which does not transmit light can be formed.

Figure 22B:
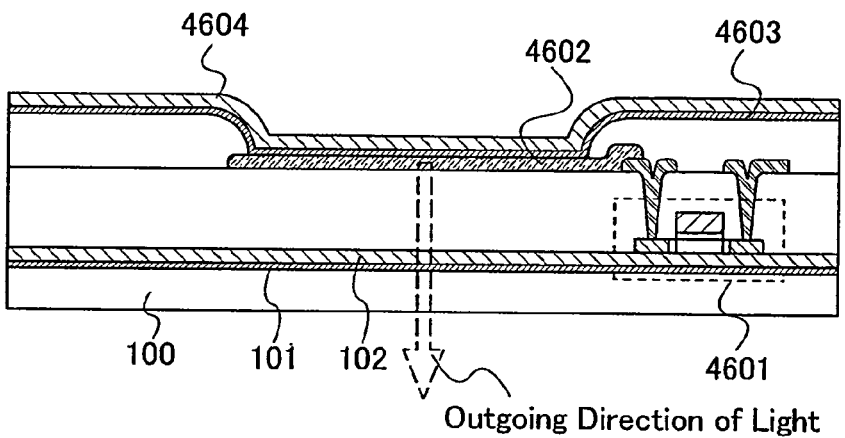

As described above, light from the light-emitting element can be extracted from a bottom surface as shown by an arrow in FIG. 22B. That is, when the structure is used for the display panel shown in FIGS. 20A and 20B, light is emitted toward the substrate 100 side. Therefore, when a light-emitting element having a bottom emission structure is employed in a display device, a substrate having a light transmitting property is used as the substrate 100.

When an optical film is provided, the substrate 100 may be provided with an optical film.

Next, a light-emitting element having a dual emission structure is described with reference to FIG. 22C. The same reference numerals as those in FIG. 22A are used since the structure of the light-emitting element is the same except for the light emission structure.

Here, as a material used for the first electrode 4602 which functions as the anode, a material having a high work function is preferably used. For example, a transparent conductive layer such as an ITO (indium tin oxide) film or an indium zinc oxide (IZO) film can be used. With the use of a transparent conductive layer having a light transmitting property, an anode which can transmit light can be formed.

As a material used for the second electrode 4604 which functions as the cathode, a stacked layer of a thin metal film formed from a material having a low work function (Al, Ag, Li, Ca, or an alloy thereof such as MgAg, MgIn, AlLi, $CaF_2$, or calcium nitride) and a transparent conductive layer (ITO (indium tin oxide), indium oxide zinc-oxide alloy ($In_2O_3$— ZnO), zinc oxide (ZnO), or the like) can be used. With the use of a thin metal film and a transparent conductive layer having a light transmitting property, a cathode which can transmit light can be formed.

Figure 22C:
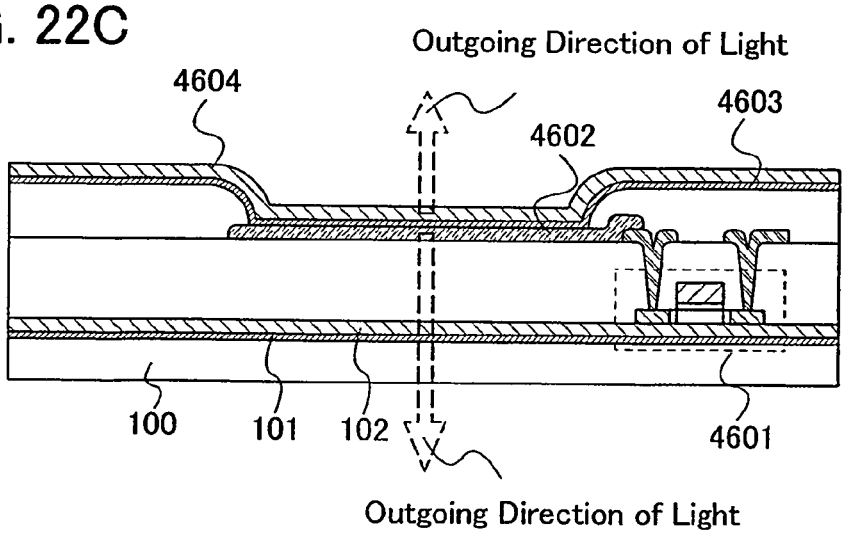

As described above, light from the light-emitting element can be extracted from both sides as shown by arrows in FIG. 22C. That is, when the display panel shown in FIGS. 20A and 20B is employed, light is emitted toward the substrate 100 side and the sealing substrate 4404 side. Therefore, when a light-emitting element having a dual emission structure is employed in a display device, a substrate having a light transmitting property is used for both the substrate 100 and the sealing substrate 4404.

When an optical film is provided, both the substrate 100 and the sealing substrate 4404 may be individually provided with an optical film.

In addition, the present invention can be applied to a display device in which full color display is realized by using a white light-emitting element and a color filter.

Figure 23:
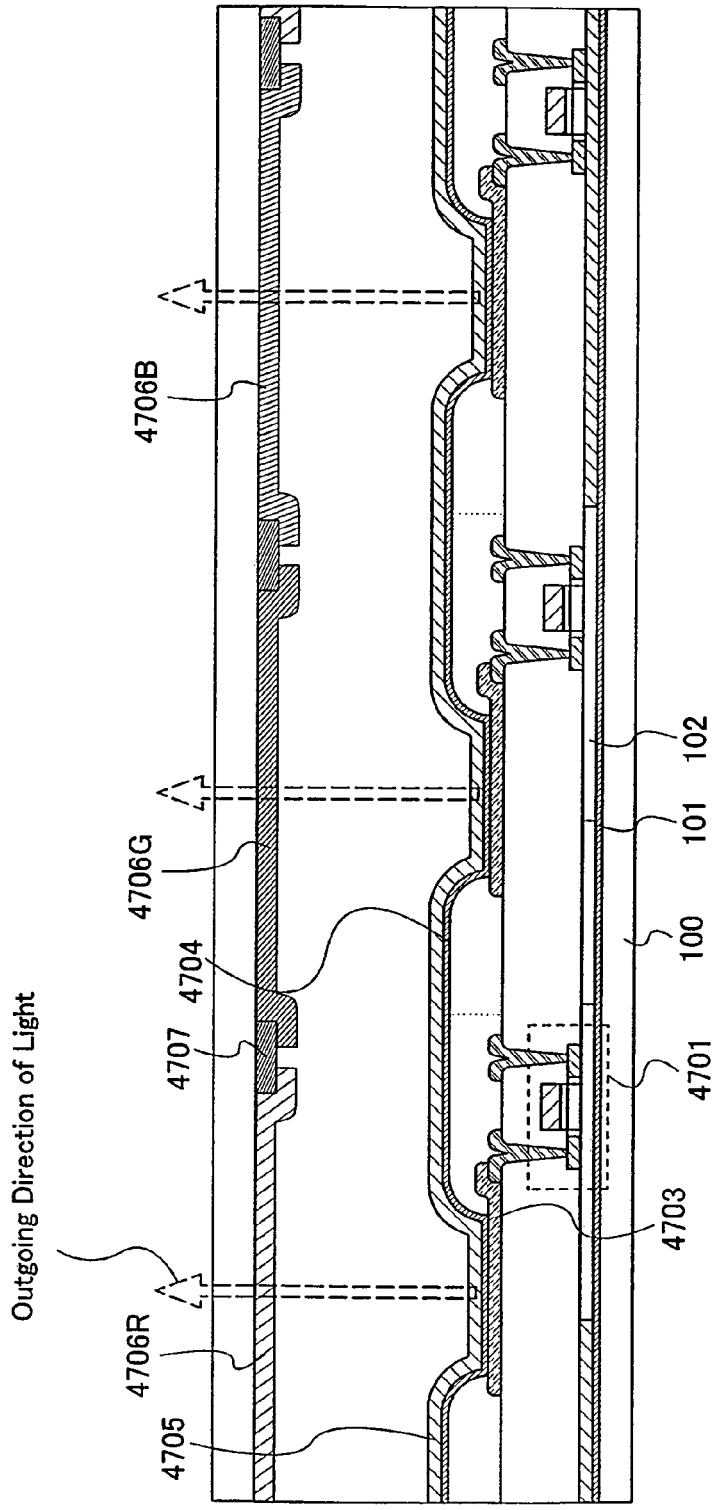
FIG. 23 is a cross-sectional view showing an example of a structure of a light-emitting device of the present invention.

As shown in FIG. 23, a driving transistor 4701 is formed over a substrate 100 with a bonding layer 101 and a nitrogen-containing layer 102 interposed therebetween. A first electrode 4703 is formed in contact with a source electrode of the driving transistor 4701, and a layer 4704 containing an organic compound and a second electrode 4705 are formed thereover.

The first electrode 4703 is an anode of a light-emitting element. The second electrode 4705 is a cathode of the light-emitting element. That is, a region where the layer 4704 containing the organic compound is interposed between the first electrode 4703 and the second electrode 4705 functions as the light-emitting element. In the structure shown in FIG. 23, white light is emitted. A red color filter 4706R, a green color filter 4706G, and a blue color filter 4706B are provided over the light-emitting elements; thus, full color display can be performed. Further, a black matrix (also referred to as a BM) 4707 which separates these color filters is provided.

This embodiment mode can be combined with the structure of a light-emitting device which is described in any of other embodiment modes in this specification as appropriate.

Embodiment Mode 8

This embodiment mode describes an example of a light-emitting device of the present invention with reference to the drawings. In specific, a structure of a light-emitting element in the light-emitting device described in the above embodiment mode is described with reference to the drawings.

A light-emitting device described in this embodiment mode includes a plurality of light-emitting elements that have emission colors which are different from each other. Each light-emitting element has a plurality of layers including an organic compound layer between a pair of electrodes. In the description given below, the plurality of layers provided between the pair of electrodes is collectively referred to as an EL layer.

Figure 25:
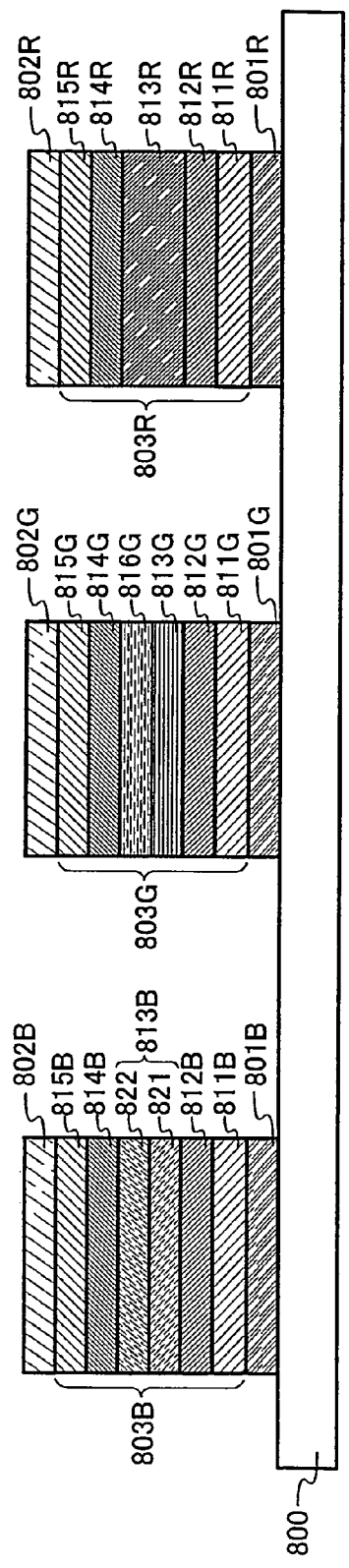
FIG. 25 is a cross-sectional view showing an example of a structure of a light-emitting element of a light-emitting device of the present invention.

In FIG. 25, a substrate 800 is used as a support of the light-emitting elements. The substrate 800 can be glass, plastic or the like, for example. Other than the above materials, any material that can serve as a support of the light-emitting elements can be used.

In this embodiment mode, the light-emitting element includes a first electrode, a second electrode, and an EL layer provided between the first electrode and the second electrode. It is to be noted that description is made below, on the assumption that the first electrode serves as an anode and the second electrode serves as a cathode. In other words, description is made below, on the assumption that light is emitted when voltage is applied to the first electrode and the second electrode such that a potential of the first electrode is higher than that of the second electrode.

A structure of each light-emitting element will now be described.

<Blue-Light-Emitting Element>

An anode 801B is preferably formed from a metal, an alloy, an electrically conductive compound, a mixture thereof, or the like each having a high work function (specifically, a work function of 4.0 eV or higher). In specific, for example, indium oxide-tin oxide (ITO: Indium Tin Oxide), indium oxide-tin oxide including silicon or silicon oxide, indium oxide-zinc oxide (IZO: Indium Zinc Oxide), indium oxide including tungsten oxide and zinc oxide (IWZO), and the like are given. Films of these conductive metal oxides are generally formed by sputtering; however, a sol-gel method or the like may also be used. For example, indium oxide-zinc oxide (IZO) can be formed by a sputtering method using a target in which 1 to 20 wt % of zinc oxide with respect to indium oxide is included. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used.

When a layer including a composite material which will be described later is used as a layer in contact with the anode 801B, the anode 801B can be formed using a wide variety of metals, alloys, electrically conductive compound, a mixture of them, or the like regardless of their work functions. For example, aluminum (Al), silver (Ag), an aluminum alloy (e.g., AlSi), or the like can be used. Besides, an element belonging to Group 1 or 2 of the periodic table which has a low work function, i.e., alkali metals such a lithium (Li) and cesium (Cs) and alkaline-earth metals such as magnesium (Mg), calcium (Ca), and strontium (Sr); alloys of them (e.g., MgAg and AlLi); rare earth metals such as europium (Eu) and ytterbium (Yb); alloys of them; and the like can also be used. A film made of an alkali metal, an alkaline-earth metal, or an alloy of them can be formed by a vacuum evaporation method. Further, a film made of an alloy including an alkali metal or an alkaline-earth metal can be formed by a sputtering method. It is also possible to deposit a silver paste or the like by an inkjet method or the like.

There are no particular limitations on the stacked structure of the EL layer 803B, and layers formed from a substance with a high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with a light-emitting layer of this embodiment mode as appropriate. For example, a hole-injecting layer, a hole-transporting layer, a light-emitting layer, an electron-transporting layer, an electron-injecting layer, and/or the like can be combined as appropriate. Specific materials to form each of the layers will be given below.

A hole-injecting layer 811B is a layer including a substance having a high hole-injecting property. As the substance with a high hole-injecting property, molybdenum oxide, vanadium oxide, ruthenium oxide, tungsten oxide, manganese oxide, or the like may be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injecting layer.

Further, as the hole-injecting layer, a composite material of a substance with a high hole-transporting property containing an acceptor substance can be used. It is to be noted that, by using such a substance with a high hole-transporting property containing an acceptor substance, a material used to form an electrode may be selected regardless of its work function. In other words, besides a material with a high work function, a material with a low work function may also be used as the anode 801. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. In specific, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

As a substance having a high hole-transporting property which can be used for the composite material, various compounds such as an aromatic amine compound, carbazole derivatives, aromatic hydrocarbon, and a high molecular compound (such as oligomer, dendrimer, or polymer) can be used. The substance having a high hole-transporting property which can be used for the composite material is preferably a substance having a hole mobility of $10^{-6}$ cm$^2$/Vs or higher. However, other substances than the above described substances may also be used as long as the substances have higher hole-transporting properties than electron-transporting properties. Organic compounds which can be used for the composite material will be specifically shown below.

For example, the following can be given as the aromatic amine compound which can be used for the composite material: N,N'-bis(4-methylphenyl)(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as carbazole derivatives which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. As described above, the aromatic hydrocarbon which has a hole mobility of $1 \times 10^{-6}$ cm² Vs or higher and which has 14 to 42 carbon atoms is particularly preferable.

The aromatic hydrocarbon which can be used for the composite material may have a vinyl skeleton. As aromatic hydrocarbons having a vinyl group, the following are given as examples: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

For the hole-injecting layer 811B, high molecular compounds (e.g., oligomer, dendrimer, or polymer) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine (abbreviation: Poly-TPD). Further, high molecular compounds mixed with acid such as poly(3,4-ethylenedioxythiophene)/poly(styrenesulfonic acid) (PEDOT/PSS) and polyaniline/poly(styrenesulfonic acid) (PAni/PSS) can also be used.

It is to be noted that it is also possible to form the hole-injecting layer 811B using a composite material which is formed from the above-described high molecular compound such as PVK, PVTAP, PTPDMA, or Poly-TPD and the above-described substance having an acceptor property.

A hole-transporting layer 812B is a layer including a substance having a high hole-transporting property. As a substance having a high hole-transporting property, the following aromatic amine compounds can be used: aromatic amine compounds such as 4,4'-bis[N-(1-naphthyl)-N-phenylamino] biphenyl (abbreviation: NPB or α-NPD), N,N'-bis(3-methylphenyl)-N,N'-dipheny-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB). The substances described here are mainly substances having a hole mobility of $10^{-6}$ cm²/Vs or higher. Further, other substances may also be used as long as the hole-transporting properties thereof are higher than the electron-transporting properties thereof. It is to be noted that the layer including a substance having a high hole-transporting property is not limited to a single layer but may have a stacked structure of two or more layers made of the above-described substances.

Further, the hole-transporting layer 812B may also be formed with high molecular compounds such as PVK, PVTPA, PTPDMA, and Poly-TPD.

The light-emitting layer 813B is a layer including a substance having a high light-emitting property. In the light-emitting element described in this embodiment mode, the light-emitting layer includes a first light-emitting layer 821 and a second light-emitting layer 822. The first light-emitting layer 821 includes a first organic compound having a high light-emitting property and an organic compound having a hole-transporting property, and the second light-emitting layer 822 includes the first organic compound having a high light-emitting property and an organic compound having an electron-transporting property. The first light-emitting layer is provided on the anode side, in other words, on the anode side of the second light-emitting layer.

The first organic compound is a substance having a high light-emitting property, and various materials can be used. In specific, materials can be used, such as 4-(9H-carbazol-9-yl)-4'-(10-phenyl-9-anthryl)triphenylamine (abbreviation: YGAPA), 4,4'-(2-tert-butylanthracen-9,10-diyl)bis{N-[4-(9H-carbazol-9-yl)phenyl]-N-phenylaniline} (abbreviation: YGABPA), N,9-diphenyl-N-[4-(10-phenyl-9-anthryl) phenyl]-9H-carbazol-3-amine (abbreviation: PCAPA), N,N''-(2-tert-butylanthracene-9,10-diyldi-4,1-phenylene)bis[N,N',N'-triphenyl-1,4-phenylenediamine] (abbreviation: DPABPA), N,N'-bis[4-(9H-carbazol-9-yl)phenyl]-N,N'-diphenylstilbene-4,4'diamine (abbreviation: YGA2S), N-[4-(9H-carbazol-9-yl)phenyl]-N-phenylstilbene-4-amine (abbreviation: YGAS), N,N'-diphenyl-N,N'-bis(9-phenylcarbazol-3-yl)stilbene-4,4'-diamine (abbreviation: PCA2S), 4,4'-bis(2,2-diphenylvinyl)biphenyl (abbreviation: DPVBi), 2,5,8,11-tetra(tert-butyl)perylene (abbreviation: TBP), perylene, rubrene, 1,3,6,8-tetraphenylpyrene or the like.

The organic compound having a hole-transporting property included in the first light-emitting layer 821 is a substance which exhibits a hole-transporting property higher than an electron-transporting property. The organic compound having an electron-transporting property included in the second light-emitting layer 822 is a substance which exhibits an electron-transporting property higher than a hole-transporting property.

Figure 26:
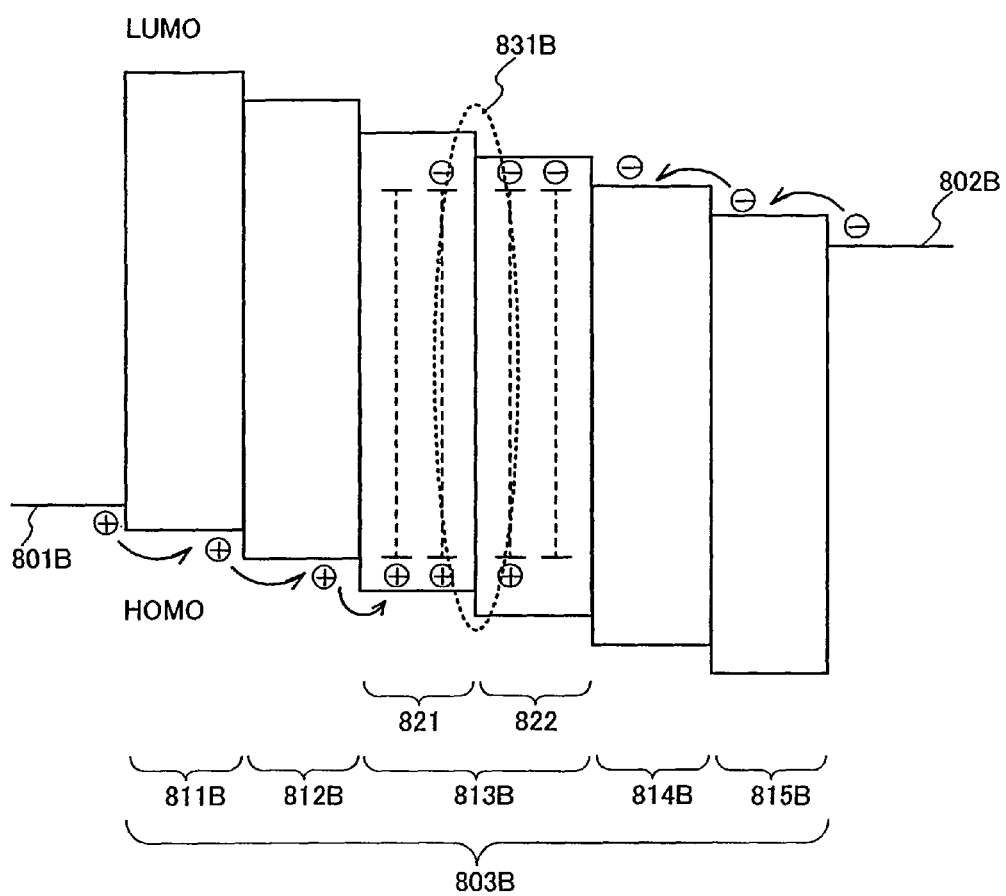
FIG. 26 illustrates an example of a structure of a light-emitting element of a light-emitting device of the present invention.

Here, FIG. 26 illustrates an example of a band diagram of the blue-light-emitting element illustrated in FIG. 25. In FIG. 26, holes injected from the anode 801B are injected into the first light-emitting layer 821 through the hole-injecting layer 811B and the hole-transporting layer 812B. The holes injected into the first light-emitting layer 821 are transported through the first light-emitting layer 821 and further, into the second light-emitting layer 822. Here, the organic compound having an electron-transporting property included in the second light-emitting layer 822 is a substance which exhibits an electron-transporting layer higher than a hole-transporting layer, and thus, the holes injected into the second light-emitting layer 822 are difficult to move. Consequently, a large number of holes are present near the interface between the first light-emitting layer 821 and the second light-emitting layer 822. In addition, occurrence of a phenomenon in which holes and electrons reach an electron-transporting layer 114B without being recombined can be suppressed.

On the other hand, electrons injected from the cathode 802B are injected into the second light-emitting layer 822 through the electron-injecting layer 815B and the electron-transporting layer 814B. The electrons injected into the second light-emitting layer 822 are transported through the second light-emitting layer 822, and further, injected into the first light-emitting layer 821. Here, the organic compound having a hole-transporting property included in the first light-emitting layer 821 is a substance which exhibits a hole-transporting property higher than an electron-transporting property, and thus, the electrons injected into the first light-emitting layer 821 are difficult to move. Consequently, a large number of electrons are present near the interface between the first light-emitting layer 821 and the second light-emitting layer 822. In addition, occurrence of a phenomenon in which holes and electrons reach the hole-transporting layer 812B without being recombined can be suppressed.

As described above, a large number of holes and electrons are present in a region in the vicinity of the interface between the first light-emitting layer 821 and the second light-emitting layer 822, so that the degree of recombination can be increased in the vicinity of the interface. In other words, a light-emitting region 831B is formed in the vicinity of the center of the light-emitting layer 813B. As a result, occurrence of a phenomenon in which holes reaches the electron-transporting layer 813 and electrons reach the hole-transporting layer 812B without being recombined can be suppressed, so that reduction in the degree of recombination can be prevented. Thus, the reduction of carrier balance over time can be prevented, which leads to increase in reliability.

In order that holes and electrons are injected into the first light-emitting layer 821, it is necessary that the organic compound having a hole-transporting property is an organic compound which can be oxidized and reduced. Thus, the highest occupied molecular orbital level (HOMO level) of the organic compound having a hole-transporting property is preferably greater than or equal to −6.0 eV and less than or equal to −5.0 eV. In addition, the lowest unoccupied molecular orbital level (LUMO level) of the organic compound having a hole-transporting property is preferably greater than or equal to −3.0 eV and less than or equal to −2.0 eV.

Similarly, in order that holes and electrons are injected into the second light-emitting layer 822, it is necessary that the organic compound having an electron-transporting property is an organic compound which can be oxidized and reduced. Thus, the highest occupied molecular orbital level (HOMO level) of the organic compound having an electron-transporting property is preferably greater than or equal to −6.0 eV and less than or equal to −5.0 eV. In addition, the lowest unoccupied molecular orbital level (LUMO level) of the organic compound having an electron-transporting property is preferably greater than or equal to −3.0 eV and less than or equal to −2.0 eV.

As the measuring method of the highest occupied molecular orbital level (HOMO level) and the lowest unoccupied molecular orbital level (LUMO level), there is a calculation method using the cyclic voltammetry (CV) measurement. Further, the ionization potential in a thin film state is measured with a photoelectron spectroscopy device and the HOMO level can be calculated. Then, the LUMO level can be calculated from the result and an energy gap obtained from an absorption spectrum in a thin film state.

As such an organic compound which can be oxidized and reduced, a tricyclic condensed aromatic compound, a tetracyclic condensed aromatic compound, a pentacyclic condensed aromatic compound, and a hexacyclic condensed aromatic compounds are given. In specific, an anthracene derivative, a phenanthrene derivative, a pyrene derivative, a chrysene derivative, a dibenzo[g,p]chrysene derivative, and the like are given. For example, as a compound having a hole-transporting property which can be used for the first layer, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 6,12-dimethoxy-5,11-diphenylchrysene, N,N,N',N',N'',N'',N''',N'''-octaphenyldibenzo[g,p]chrysene-2,7,10,15-tetraamine, and the like are given. As an compound having an electron-transporting property which can be used for the second layer, 9-[4-(10-phenyl-9-antryl)phenyl]-9H-carbazole (abbreviation: CzPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3) and the like can be given.

As described above with reference to FIG. 26, the light-emitting element described in this embodiment mode is structured such that holes are injected into the second light-emitting layer 822 from the first light-emitting layer 821. Thus, the difference between the highest occupied molecular orbital level (HOMO level) of the organic compound having a hole-transporting property and the highest occupied molecular orbital level (HOMO level) of the organic compound having an electron-transporting property is preferably small. Further, the light-emitting element is structured such that electrons are injected into the first light-emitting layer 821 from the second light-emitting layer 822. Thus, the difference between the lowest unoccupied molecular orbital level (LUMO level) of the organic compound having a hole-transporting property and the lowest unoccupied molecular orbital level (LUMO level) of the organic compound having an electron-transporting property is preferably small. If the difference between the highest occupied molecular orbital level (HOMO level) of the organic compound having a hole-transporting property and the highest occupied molecular orbital level (HOMO level) of the organic compound having an electron-transporting property is large, the light-emitting region comes closely to the first light-emitting layer side or the second light-emitting layer side. Similarly, if the difference between the lowest unoccupied molecular orbital (LUMO) level of the organic compound having a hole-transporting property and the lowest unoccupied molecular orbital (LUMO) level of the organic compound having an electron-transporting property is large, the light-emitting region comes closely to the first light-emitting layer side or the second light-emitting layer side. Accordingly, the difference between the highest occupied molecular orbital level (HOMO level) of the organic compound having a hole-transporting property and the highest occupied molecular orbital level (HOMO level) of the organic compound having an electron-transporting property is preferably 0.3 eV or less, more desirably, 0.1 eV. In addition, the difference between the lowest unoccupied molecular orbital (LUMO) level of the organic compound having a hole-transporting property and the lowest unoccupied molecular orbital (LUMO) level of the organic compound having an electron-transporting property is 0.3 eV or less, more desirably, 0.1 eV or less.

Further, the light-emitting element provides light emission by recombination of electrons and holes, and thus, the organic compound used in the light-emitting layer 813B is preferably stable even when an oxidative reaction and a reductive reaction are repeated. In other words, the organic compound preferably has reversible oxidation reduction characteristics. In particular, the organic compound having a hole-transporting property and the organic compound having an electron-transporting property are preferably stable even when an oxidative reaction and a reductive reaction are repeated. It can be confirmed by employing the cyclic voltammetry (CV) measurement whether the organic compounds are stable or not when an oxidative reaction and a reductive reaction are repeated.

In specific, when an oxidative reaction and a reductive reaction are repeated in the CV measurement, changes of an oxidation peak potential ($E_{pa}$) in the oxidative reaction of the organic compound and a reduction peak potential ($E_{pc}$) in the reductive reaction, changes of the shape at the peak, or the like are observed, thereby confirming whether the organic compounds are stable or not when the oxidative reaction and the reductive reaction are repeated. The number of repetition of the oxidative reaction and the reductive reaction is preferably large; however, when the reactions are repeated 50 to 200 times, substantial stability can be estimated. In the measurement like this, in the organic compound having a hole-transporting property and the organic compound having an electron-transporting property used for the light-emitting layer 813B, the changes in the intensity of the oxidation peak potential and the intensity of the reduction peak potential are preferably smaller than 50%, more preferably less than 30%. In other words, for example, the peak intensity of 50% or higher is preferably kept even when the oxidation peak decreases. More preferably, a peak intensity of 70% or higher is kept. In addition, the changes of the values of the oxidation peak potential and the reduction peak potential are preferably 0.05 V or lower. More preferably, the changes are 0.02 V or lower.

As an organic compound which can be stable even when an oxidative reaction and a reductive reaction are repeated, in other words, as an organic compound which has reversible oxidation reduction characteristics, an anthracene derivative is particularly preferable among the tricyclic condensed aromatic compound, the tetracyclic condensed aromatic compound, the pentacyclic condensed aromatic compound, and the hexacyclic condensed aromatic compounds, which are described above. As an example of the organic compound having a hole-transporting property included in the first light-emitting layer 821, specifically, 9,10-diphenylanthracene (abbreviation: DPAnth), N,N-diphenyl-9-[4-(10-phenyl-9-antryl)phenyl]-9H-carbazol-3-amine (abbreviation: CzA1PA), 4-(10-phenyl-9-antryl)triphenylamine (abbreviation: DPhPA), N,9-diphenyl-N-[4-(10-phenyl-9-antryl)phenyl]-9H-carbazol-3-amine (abbreviation: PCAPA), N,9-diphenyl-N-{4-[4-(10-phenyl-9-antryl)phenyl]phenyl}-9H-carbazol-3-amine (abbreviation: PCAPBA), and the like can be given. As an example of the organic compound having an electron-transporting property included in the second light-emitting layer 822, specifically, 9-[4-(10-phenyl-9-antryl)phenyl]-9H-carbazole (abbreviation: CzPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), and the like are given. Such anthracene derivatives are preferable, since such anthracene derivatives are stable even when the oxidative reaction and the reductive reaction are repeated.

The same substance is used for the substance having a high light-emitting property included in the first light-emitting layer and the substance having a high light-emitting property included in the second light-emitting layer, thereby making it possible to emit light in the vicinity of the center of the light-emitting layer. On the other hand, if different substances having high light-emitting properties are used for the first light-emitting layer and the second light-emitting layer, there is a possibility that light is emitted from only one of the first light-emitting layer and the second light-emitting layer. If light is emitted from only one layer, it is difficult to emit light in the vicinity of the center of the light-emitting layer. Further, if the first layer and the second layer are formed using different substances having high light-emitting properties, the substances having high light-emitting properties both emit light, and thus, light emission having an excellent color purity cannot be obtained. In addition, there is a possibility that the color of the light emission is changed. Therefore, the substance having a high light-emitting property included in the first light-emitting layer and the substance having a high light-emitting property included in the second light-emitting layer are preferably the same.

The materials of the first light-emitting layer and the second light-emitting layer which serve as a light-emitting layer can be selected and combined as appropriate in view of the above perspective.

The electron-transporting layer 814B is a layer that contains a substance with a high electron-transporting property. For example, a layer including a metal complex having a quinoline skeleton or a benzoquinoline skeleton, such as tris (8-quinolinolato)aluminum (abbreviation: Alq), tris(4-methyl-8-quinolinolato)aluminum (abbreviation: Almq$_3$), bis (10-hydroxybenzo[h]-quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are substances each having an electron mobility of $10^{-6}$ cm$^2$/Vs or higher. The electron-transporting layer may be formed from other materials than those described above as long as the substances have electron-transporting properties higher than hole-transporting properties. Furthermore, the electron-transporting layer is not limited to a single layer, and two or more layers made of the aforementioned substances may be stacked.

As the electron-transporting layer 814B, a high molecular compound can be used. For example, poly[(9,9-dihexylfluorene-2,7-diyl)co-(pyridin-3,5-diyl)] (abbreviation: PF-Py) or poly[(9,9-dioctyllfluorene-2,7-diyl)-co-(2,2'-pyridin-6,6'-diyl)] (abbreviation: PF-BPy) can be used.

In addition, an electron-injecting layer 815B may be provided. As the electron-injecting layer 815B, an alkali metal compound, or an alkaline-earth metal compound such as lithium fluoride (LiF), cesium fluoride (CsF), or calcium fluoride (CaF$_2$) may be used. Further, a layer formed by combination of a substance having an electron-transporting property with an alkali metal or an alkaline-earth metal can be used. For example, Alq which contains magnesium (Mg) may be used. By using a layer formed by combination of a substance having an electron-transporting property with an alkali metal or an alkaline-earth metal as the electron-injecting layer, electron injection from the cathode 802B is performed efficiently, which is preferable.

The cathode 802B can be formed from a metal, an alloy, an electrically conductive compound, or a mixture of these, having a low work function (specifically, a work function of 3.8 eV or lower). As a typical example of such a cathode material, an element belonging to Group 1 or 2 in the periodic table, i.e., an alkali metal such as lithium (Li) or cesium (Cs), or an alkaline-earth metal such as magnesium (Mg), calcium (Ca), or strontium (Sr); an alloy containing any of these (such as MgAg or AlLi); a rare earth metal such as europium (Er) or ytterbium (Yb); an alloy containing such a rare earth metal; or the like can be used. A film made of an alkali metal, an alkaline-earth metal, or an alloy of them can be formed by a vacuum evaporation method. Further, a film made of an alloy of an alkali metal or an alkaline-earth metal can be formed by a sputtering method. It is also possible to deposit a silver paste or the like by an inkjet method or the like.

When the electron-injecting layer 815B is provided between the cathode 802B and the electron-transporting layer 814B, the cathode 802B can be formed using various conductive materials such as Al, Ag, ITO, and indium oxide-tin oxide containing silicon or silicon oxide, regardless of their work functions. Further, such conductive materials can be deposited by a sputtering method, an ink-jet method, a spin coating method, or the like.

In the light-emitting element as described above, a light-emitting region is formed in the vicinity of the center of the light-emitting layer, without being formed at the interface between the light-emitting layer and the hole-transporting layer or at the interface between the light-emitting layer and the electron-transporting layer. Thus, there are almost no influences which would be caused when the light-emitting region is adjacent to the hole-transporting layer or the electron-transporting layer. Therefore, a light-emitting element having a longer lifetime which deteriorates less, can be obtained. In addition, the light-emitting layer of the light-emitting element as described above is formed using a compound which is stable even when an oxidative reaction and a reductive reaction are repeated, and thus, is difficult to deteriorate even when light emission by recombination of electrons and holes is repeated. Accordingly, a light-emitting element having a longer lifetime can be obtained.

<Green-Light-Emitting Element>

An anode 801G can have a similar structure to the anode 801B. The anode 801G may be formed using the same material as the anode 801B or a different material from the anode 801B. In the case where the anode 801G is formed using the same material as the anode 801B, a light-emitting device can be formed without increasing the number of steps, which is preferable.

There is no particular limitation on the stacked structure of the EL layer 803G, and layers formed from a substance with a high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with a layer for controlling carrier transfer and a light-emitting layer shown in this embodiment mode as appropriate. For example, a hole-injecting layer, a hole-transporting layer, a light-emitting layer, an electron-transporting layer, an electron-injecting layer, and/or the like can be combined as appropriate. Specific materials to form each of the layers will be given below.

A hole-injecting layer 811G can have a similar structure to the hole-injecting layer 811B. The hole-injecting layer 811G may be formed using the same material as the hole-injecting layer 811B or a different material from the hole-injecting layer 811B. In the case where the hole-injecting layer 811G is formed using the same material as the hole-injecting layer 811B, a light-emitting device can be formed without increasing the number of steps, which is preferable.

A hole-transporting layer 812G can have a similar structure to the hole-transporting layer 812B. The hole-transporting layer 812G may be formed using the same material as the hole-transporting layer 812B or a different material from the hole-transporting layer 812B. In the case where the hole-transporting layer 812G is formed using the same material as the hole-transporting layer 812B, a light-emitting device can be formed without increasing the number of steps, which is preferable.

The light-emitting layer 813G is a layer including a high light-emitting substance, and can be formed using a variety of materials. As a light-emitting material which exhibits greenish light emission, the following can be used: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like.

It is to be noted that in this embodiment mode, a layer 816G for controlling carrier transfer is provided between the light-emitting layer 813G and the cathode 802G, the light-emitting layer 813G preferably has an electron-transporting property. Conventionally, when the light-emitting layer has an electron-transporting property, an electron-blocking layer is provided between the light-emitting layer and an anode in order to prevent electrons from passing through the light-emitting layer. However, when the electron-blocking layer deteriorates over time, a recombination region expands to the inside of the electron-blocking layer (or inside of the hold-transporting layer), which would result in a significant decrease in current efficiency (i.e., luminance decay). Meanwhile, in this embodiment mode, the movement of electrons is controlled before the electrons reach the light-emitting layer (between the light-emitting layer and the cathode). Therefore, even if the balance of electrons is somewhat lost, the proportion of recombination in the light-emitting layer hardly changes, which is advantageous in that luminance does not easily decay.

It is to be noted that the light-emitting layer 813G may also have a structure in which the above-described light-emitting substance is dispersed in another substance. Various types of substances can be used for a material for dispersing the light-emitting substance, and it is preferable to use a substance whose lowest unoccupied molecular orbital (LUMO) level is higher than that of the light-emitting substance and whose highest occupied molecular orbital (HOMO) level is lower than that of the light-emitting substance.

It is to be noted that in this embodiment mode, the light-emitting layer 813G preferably has an electron-transporting property because the layer 816G for controlling the movement of carriers is provided between the light-emitting layer 813G and the cathode 802G. That is, the electron-transporting property is preferably higher than the hole-transporting property. Therefore, the above-described material in which the high light-emitting substance is dispersed is preferably an organic compound having an electron-transporting property. In specific, the following metal complexes can be used: tris(8-quinolinolato)aluminum(III) (abbreviation: Alq), tris(4-methyl-8-quinolinolato)aluminum(III) (abbreviation: Almq$_3$), bis(10-hydroxybenzo[h]-quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-

(2-benzothiazolyl)phenolato]zinc(II) (abbreviation: Zn(BTZ)$_2$). Further, the following heterocyclic compounds can also be used: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP). Alternatively, the following condensed aromatic compounds can also be used: 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3''-(benzene-1,3,5-triyl)tripyrene (abbreviation: TPB3).

As a material in which the light-emitting substance is dispersed, a plurality of kinds of materials can be used. For example, a substance for controlling the crystallization of rubrene or the like can be further added in order to control the crystallization. In addition, NPB, Alq, or the like can be further added in order to efficiently transfer energy to the light-emitting substance.

When a structure in which a high light-emitting substance is dispersed in another substance is employed, the crystallization of the light-emitting layer 813G can be suppressed. Further, concentration quenching which results from the high concentration of the high light-emitting substance can also be suppressed.

Further, high molecular compounds can be used for the light-emitting layer 813G. As a light-emitting material which exhibits greenish light emission, the following can be used: poly(p-phenylenevinylene) (abbreviation: PPV), poly[(9,9-dihexylfluorene-2,7-diyl)-alt-co-(benzo[2,1,3]thiadiazol-4,7-diyl)] (abbreviation: PFBT), poly[(9,9-dioctylfluorene-2,7-divinylenefluorenylene)-alt-co-(2-methoxy-5-(2-ethylhexyloxy)-1,4-phenylene)], and the like.

The layer 816G for controlling carrier transfer includes two or more types of substances. In this embodiment mode, the layer 816G for controlling carrier transfer includes a third organic compound and a fourth organic compound, and the third organic compound is included more than the fourth organic compound in the layer 116G for controlling carrier transfer.

The layer 816G for controlling carrier transfer is formed closer to the cathode 802G than the light-emitting layer 813G, and thus the third organic compound is a compound having an electron-transporting property. In other words, the third organic compound is preferably a substance whose electron-transporting property is higher than its hole-transporting property. Typically, the following can be used: metal complexes such as Alq, Almq$_3$, BeBq$_2$, BAlq, Znq, BAlq, ZnPBO, and ZnBTZ; heterocyclic compounds such as PBD, OXD-7, TAZ, TPBI, BPhen, and BCP; and condensed aromatic compounds such as CzPA, DPCzPA, DPPA, DNA, t-BuDNA, BANT, DPNS, DPNS2, and TPB3. Further, the following high molecular compounds can also be used: poly[(9,9-dihexylfluorene-2,7-diyl)-co-(pyridin-3,5-diyl)] (abbreviation: PF-Py) and poly[(9,9-dioctylfluorene-2,7-diyl)-co-(2,2'-bipyridine-6,6'-diyl)] (abbreviation: PF-BPy). Above all, metal complexes are preferably used in terms of electric stability (in particular, stability against electrons). In addition, the LUMO level of the fourth organic compound is preferably lower than the LUMO level of the third organic compound by 0.3 eV or more. Thus, depending on the type of the fourth organic compound used, the third organic compound may be selected as appropriated so as to satisfy the condition. For example, when DPQd or coumarin 6 is used as the fourth organic compound, Alq is used as the third organic compound, and at this time, the condition is satisfied.

The fourth organic compound is a compound having a function of trapping electrons. In specific, the fourth organic compound is preferably an organic compound having a LUMO level which is lower than a LUMO level of the third organic compound by 0.3 eV or more. Since the fourth organic compound is included, the electron transfer speed of the whole layer is smaller than that of a layer including only the third organic compound. In other words, by addition of the fourth organic compound, the electron transfer can be controlled. Further, the concentration of the fourth organic compound is controlled so that the carrier transfer speed can be controlled.

It is preferable that the emission colors of the light-emitting layer 813G and the fourth organic compound be similar colors. Accordingly, the difference between a peak value of an emission spectrum of the substance having a high light-emitting property and a peak value of an emission spectrum of the fourth organic compound is preferably 30 nm or less. When the difference is 30 nm or less, emission color of the substance having a high light-emitting property and emission color of the fourth organic compound are similar colors. Accordingly, even in a case where the fourth organic compound emits light due to change in voltage or the like, change in emission color of the light-emitting element can be suppressed. However, the fourth organic compound has no necessity to emit light. For example, in a case where emission efficiency of the substance having a high light-emitting property is higher than that of the fourth organic compound, the concentration of the fourth organic compound in the layer 816G for controlling carrier transfer is preferably adjusted so that only light emitted from the substance having a high light-emitting property is substantially obtained (the concentration is slightly lowered so that light emission from the fourth organic compound is suppressed). In this case, emission color of the substance having a high light-emitting property and emission color of the fourth organic compound are similar colors (that is, the substance having a high light-emitting property and the fourth organic compound have almost the same energy gap). Accordingly, energy transfer from the substance having a high light-emitting property to the fourth organic compound does not easily occur, and thus high emission efficiency is obtained.

For example, when the organic compound contained in the light-emitting layer 813G is an organic substance which exhibits greenish light emission such as 2PCAPA, 2PCABPhA, 2DPAPA, 2DPABPhA, 2YGABPhA, or DPhAPhA, the fourth organic compound is preferably a compound which exhibits light emission in the range of bluish green to yellowish green such as N,N'-dimethylquinacridone (abbreviation: DMQd), N,N'-diphenylquinacridone (abbreviation: DPQd), 9,18-dihydrobenzo[h]benzo[7,8]quino[2,3-b]acridine-7,16-dione (abbreviation: DMNQd-1), 9,18-dimethyl-9,18-dihydrobenzo[h]benzo[7,8]quino[2,3-b]acridine-7,16-dione (abbreviation: DMNQd-2), coumarin 30, coumarin 6, coumarin 545T, or coumarin 153. It is to be noted that the above compounds are compounds having lower LUMO levels among compounds used in light-emitting elements, and when any of the above compounds is added to the third organic compound described later, it exhibits excellent electron-trapping property.

It is to be noted that among the above compounds exemplarily illustrated for the fourth organic compound, quinacridone derivatives such as DMQd, DPQd, DMNQd-1, and DMNQd-2 are chemically stable and thus preferable. That is, when quinacridone derivatives are used, the lifetime of the light-emitting element can be particularly prolonged. In addition, since quinacridone derivatives exhibit greenish light emission, the element structure of the light-emitting element is particularly effective for a light-emitting element of a greenish color. A green color requires the highest level of luminance in forming a full-color display, and there are cases where the deterioration speed of a green-light-emitting element is faster than those of light-emitting elements for other colors. However, such a problem can be ameliorated by applying this embodiment mode.

It is to be noted that the fourth organic compound is preferably coumarin derivatives such as coumarin 102, coumarin 6H, coumarin 480D, coumarin 30, coumarin 6, coumarin 545T, and coumarin 153. Coumarin derivatives have low electron trapping properties. Therefore, the concentration of the fourth organic compound added to the third organic compound may be relatively high. That is, the concentration of the fourth organic compound can easily be controlled, and thus a layer for controlling carrier transfer which has desired properties can easily be obtained. Further, since coumarin derivatives have high luminous efficiency, decrease in luminous efficiency of the entire light-emitting element can be suppressed when the fourth organic compound emits light.

In order to keep color purity of the light-emitting element, it is also possible that the energy gap of the fourth organic compound included in the layer 816G for controlling carrier transfer is made larger than the energy gap of the substance having high light-emitting property included in the light-emitting layer 813G. Since the energy gap of the fourth organic compound is larger than the energy gap of the high light-emitting substance included in the light-emitting layer 813G, emission color of the fourth organic compound is not mixed and emission from the high light-emitting substance can be obtained; therefore, the light-emitting element has excellent color purity.

An energy gap which is larger than that of visible light is preferable for the energy gap of the fourth organic compound. Thus, the energy gap of the fourth organic compound is preferably 3.0 eV or more. In particular, the energy gap is preferably larger than that of green light. In addition, when emission of the fourth organic compound is light in ultraviolet to purple, energy can transfer to the high light-emitting substance included in the light-emitting layer 813G even if the fourth organic compound is excited; accordingly, the light-emitting element can have excellent color purity. Therefore, the emission peak of the wavelength of the fourth organic compound is preferably in the range of from 350 nm to 450 nm, inclusive.

As the fourth organic compound having such an energy gap described above, a quinoxaline derivative is preferable in particular. The quinoxaline derivative is preferably 2,3-diphenylquinoxaline derivative, in terms of chemical stability. For example, 2,3-diphenylquinoxaline (abbreviation: DPQ), 2,3-bis(4-fluorophenyl)quinoxaline (abbreviation: FDPQ), 2,3-bis(4-trifluoromethylphenyl)quinoxaline (abbreviation: $CF_3$-DPQ), and the like are given.

Further, among 2,3-diphenylquinoxaline derivatives, in particular, 2,3,2'3'-tetraphenyl-6,6'-biquinoxaline derivative, which has a relatively high molecular weight and high heat resistance, is preferable.

As described above, the LUMO level of the fourth organic compound is preferably lower than that of the fifth organic compound by 0.3 eV or more. Thus, depending on the type of the fourth organic compound to be used, a substance may be selected so as to satisfy the condition as the fifth organic compound as appropriate.

Figure 27:
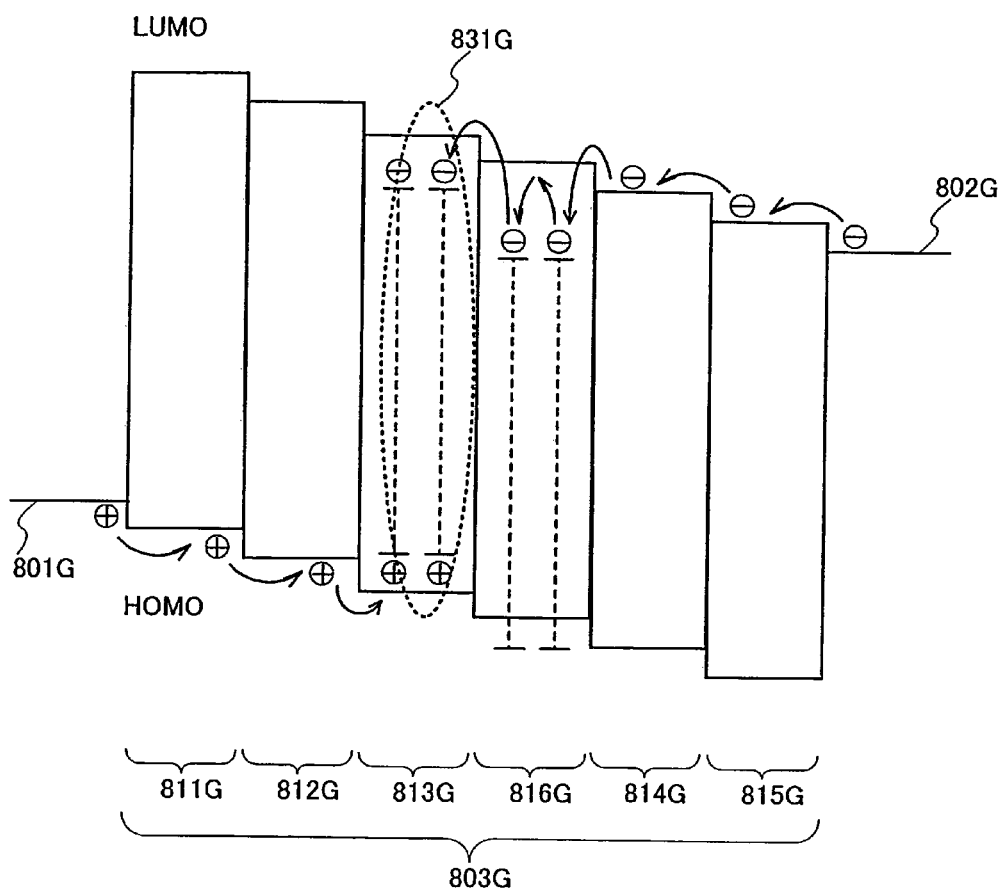
FIG. 27 illustrates an example of a structure of a light-emitting element of a light-emitting device of the present invention.

FIG. 27 exemplarily illustrates a band diagram of the green-light-emitting element shown in FIG. 25. In FIG. 27, holes injected from the anode 801G pass through the hole-injecting layer 811G and the hole-transporting layer 812G. Then, the holes are injected to the light-emitting layer 813G. On the other hand, electrons injected from the cathode 802G pass through an electron-injecting layer 815G and an electron-transporting layer 814G. Then, the electrons are injected to the layer 816G for controlling carrier transfer. The movement speed of the electrons injected to the layer 816G for controlling carrier transfer is retarded by the fourth organic compound having an electron trapping property. The electrons whose movement speed has been retarded are injected to the light-emitting layer 113G, and then recombined with holes. In this manner, light emission is obtained.

When the light-emitting layer 813G has an electron-transporting property, for example, the movement speed of the holes that are injected from the hole-transporting layer 812G to the light-emitting layer 813G is retarded. In addition, the movement speed of the electrons that are injected from the layer 816G for controlling carrier transfer to the light-emitting layer 813G is even slow in the light-emitting layer 813G because it has already been retarded in the layer 816G for controlling carrier transfer. Therefore, holes of a slow movement speed and electrons of a slow movement speed are recombined in the light-emitting layer 813G, whereby the recombination probability is increased and luminous efficiency is improved.

In the case of a conventional light-emitting element which does not include the layer 816G for controlling carrier transfer, the movement speed of electrons is not retarded and the electrons are directly injected to the light-emitting layer 813G. Thus, the electrons reach the vicinity of the interface between the hole-transporting layer 812G and the light-emitting layer 813G. Therefore, a light-emitting region is formed in the vicinity of the interface between the hole-transporting layer 812G and the light-emitting layer 813G. In that case, there is a possibility that the electrons may reach and deteriorate the hole-transporting layer 812G. Further, as the amount of electrons that have reached the hole-transporting layer 812G is increased over time, the recombination probability in the light-emitting layer is decreased over time, which leads to a shorter lifetime of the element (luminance decay over time).

In the green-light-emitting element shown in this embodiment mode, electrons injected from the cathode 802G pass through the electron-injecting layer 815G and the electron-transporting layer 814G. Then, the electrons are injected to the layer 816G for controlling carrier transfer. Here, the layer 816G for controlling carrier transfer has a structure in which the fourth organic compound having a function of trapping electrons is added to the third organic compound having an electron-transporting property. Therefore, the movement speed of the electrons that are injected to the layer 816G for controlling carrier transfer is retarded and the electron injection to the light-emitting layer 813G is controlled. As a result, a light-emitting region, which has conventionally been formed in the vicinity of the interface between the hole-transporting layer 812G containing a compound with a high hole-transporting property and the light-emitting layer 813G, is formed in a region from the light-emitting layer 813G to the vicinity of the interface between the light-emitting layer 813G and the layer 816G for controlling carrier transfer, in the light-emitting element shown in this embodiment mode. Therefore, there is low possibility that electrons may reach and deteriorate the hole-transporting layer 812G which contains a compound with a high hole-transporting property. Similarly, as for holes, there is also low possibility that holes may reach and deteriorate the electron-transporting layer 814G which contains a compound with a high electron-transporting property because the layer 816G for controlling carrier transfer contains the third organic compound having an electron-transporting property.

Further, it is an important point that not merely a substance with low electron mobility is applied to the layer 816G for controlling carrier transfer but an organic compound having an a function of trapping electrons is added to an organic compound having an electron-transporting property. That is, the change of carrier balance hardly occurs, as compared with the case where the movement of carriers is controlled by a single substance. For example, when the movement of electrons is controlled by a layer made of a single substance, the balance of the whole layer is changed by a partial change in morphology or by partial crystallization. Thus, such a light-emitting element will easily deteriorate over time. However, as shown in this embodiment mode, when the movement of electrons is controlled with the component that is included less, among all the components included in the layer 816G for controlling carrier transfer, it is possible to reduce the effects of morphological change, crystallization, aggregation, or the like, and thereby deterioration over time can be suppressed. Therefore, a long-lifetime light-emitting element whose luminous efficiency will not easily decrease over time can be obtained.

In the green-light-emitting element shown in this embodiment mode, the light-emitting region is not formed at the interface between the light-emitting layer and the hole-transporting layer or the interface between the light-emitting layer and the electron-transporting layer. Therefore, there is no adverse effect of deterioration which would otherwise be caused if the light-emitting region is positioned close to the hole-transporting layer or the electron-transporting layer. Further, changes in carrier balance over time (in particular, changes in amount of electron injection over time) can be suppressed. Therefore, a long-lifetime light-emitting element which does not easily deteriorate can be obtained.

In addition, the thickness of the layer 816G for controlling carrier transfer is preferably in the range of from 5 nm to 20 nm, inclusive. If the thickness is too large, electron transfer speed may become too slow, which leads to increase in driving voltage. On the other hand, if the thickness is too small, the electron transfer speed may not be controlled. For this reason, the thickness of the layer 816G for controlling carrier transfer is preferably in the range of from 5 nm to 20 nm, inclusive.

An electron-transporting layer 814G can have a similar structure to the electron-transporting layer 814B. The electron-transporting layer 814G may be formed using the same material as the electron-transporting layer 814B or a different material from the electron-transporting layer 814B. In the case where the electron-transporting layer 814G is formed using the same material as the electron-transporting layer 814B, a light-emitting device can be formed without increasing the number of steps, which is preferable.

An electron-injecting layer 815G can have a similar structure to the electron-injecting layer 815B. The electron-injecting layer 815G may be formed using the same material as the electron-injecting layer 815B or a different material from the electron-injecting layer 815B. In the case where the electron-injecting layer 815G is formed using the same material as the electron-injecting layer 815B, a light-emitting device can be formed without increasing the number of steps, which is preferable.

The cathode 802G can have a similar structure to the cathode 802B. The cathode 802G may be formed using the same material as the cathode 802B or a different material from the cathode 802B. In the case where the cathode 802G is formed using the same material as the cathode 802B, a light-emitting device can be formed without increasing the number of steps, which is preferable.

The light-emitting element as described above includes a layer for controlling carrier transfer. The layer for controlling carrier transfer contains at least two kinds of substances. Therefore, by controlling the combination of substances, the mixture ratio thereof, the thickness of the layer, or the like, carrier balance can be precisely controlled.

Further, since the carrier balance can be controlled by controlling the combination of substances, the mixture ratio thereof, the thickness of the layer, or the like, carrier balance can be more easily controlled than in a conventional light-emitting element. That is, the movement of carriers can be controlled not by changing the physical properties of a material used but by controlling the mixture ratio, the thickness of the layer, and the like.

Thus, it becomes possible to prevent excessive electrons from being injected and also prevent electrons from penetrating the light-emitting layer and reaching the hole-transporting layer or the hole-injecting layer. Therefore, a decrease in luminous efficiency over time can be suppressed. That is, a long-lifetime light-emitting element can be provided.

Among two or more kinds of substances contained in the layer for controlling electron transfer, the fourth organic compound included less than the third organic compound is used for controlling the movement of electrons. Therefore, the movement of electrons can be controlled with the component that is included less, among the components contained in the layer for controlling electron transfer. Thus, a long-lifetime light-emitting element which does not easily deteriorate over time can be obtained. In other words, the change of carrier balance hardly occurs, as compared with the case where the movement of carriers is controlled by a single substance. For example, when the movement of electrons is controlled by a layer made of a single substance, the balance of the whole layer is changed by a partial change in morphology or by partial crystallization. Therefore, such a light-emitting element will easily deteriorate over time. However, as shown in this embodiment mode, when the movement of electrons is controlled with the component that is included less, among all the components contained in the layer for controlling carrier transfer, it is possible to suppress the effects of morphological change, crystallization, aggregation, or the like, and thereby deterioration over time can be suppressed. Therefore, a long-lifetime light-emitting element whose luminous efficiency will not easily decrease over time can be provided.

<Red-Light-Emitting Element>

An anode 801R can have a similar structure to the anode 801B. The anode 801R may be formed using the same material as the anode 801B or a different material from the anode 801B. In the case where the anode 801R is formed using the same material as the anode 801B, a light-emitting device can be formed without increasing the number of steps, which is preferable.

There are no particular limitations on the stacked structure of the EL layer 803B, and layers formed from a substance with a high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with the light-emitting layer shown in this embodiment mode as appropriate. For example, a hole-injecting layer, a hole-transporting layer, a light-emitting layer, an electron-transporting layer, an electron-injecting layer, and/or the like can be combined as appropriate. Specific materials to form each of the layers will be given below.

A light-emitting layer 813R includes a substance having a high light-emitting property, a fifth organic compound, and a sixth organic compound.

In the light-emitting layer 813R, the fifth organic compound is a compound having a hole-transporting property. In specific, an aromatic amine compound such as 4,4'-bis[N-(1-napthyl)-N-phenylamino]biphenyl (abbreviation: NPB), 4,4'-bis[N-(9-phenanthryl)-N-phenylamino]biphenyl (abbreviation: PPB), 4,4'-bis[N-(3-methylphenyl)-N-phenylamino]biphenyl (abbreviation: TPD), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4',4"-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl)triphenylamine (abbreviation: YGAO11), or N-[4-(9-carbazolyl)phenyl]-N-phenyl-9,9-dimethylfluoren-2-amine (abbreviation: YGAF) can be used. Also, a carbazole derivative such as 4,4'-di(N-carbazolyl)biphenyl (abbreviation: CBP), 1,3-bis(N-carbazolyl)benzene (abbreviation: mCP), or 1,3,5-tris(N-carbazolyl)benzene (abbreviation: TCzB) can be used. Further, a high molecular compound such as poly(4-vinyltriphenylamine) (abbreviation: PVTPA) can also be used as such an aromatic amine compound. As a carbazole derivative, a high molecular compound such as poly(N-vinylcarbazole) (abbreviation: PVK) can also be used. The triplet excitation energy of the fifth organic compound as described above is preferably larger than that of a pyrazine-based organometallic complex.

On the other hand, the sixth organic compound is a compound having an electron-transporting property. In specific, a heteroaromatic compound such as 9-[4-(5-phenyl-1,3,4-oxadiazol-2-yl)phenyl]carbazole (abbreviation: CO11), 1,3-bis[5-(p-tert-butylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), 2,2',2"-(1,3,5-benzenetriyl)tris(1-phenyl-1H-benzimidazole) (abbreviation: TPBI), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9"-[1,3,5-triazine-2,4,6-triyl]tricarbazole (abbreviation: TCzTRZ), 2,2',2"-(1,3,5-benzenetriyl)tris(6,7-dimethyl-3-phenylquinoxaline) (abbreviation: TriMeQn), 9,9'-(quinoxaline-2,3-diyldi-4,1-phenylene)di(9H-carbazole) (abbreviation: CzQn), 3,3',6,6'-tetraphenyl-9,9'-(quinoxaline-2,3-diyldi-4,1phenylene)di(9H-carbazole) (abbreviation: DCzPQ), bathophenanthroline (abbreviation: BPhen), or bathocuproine (abbreviation: BCP) can be used. A metal complex such as bis(2-methyl-8-quinolinolato)(4-phenylphenolato)aluminum(III) (abbreviation: BAlq), tris[2-(2-hydroxyphenyl)-5-phenyl-1,3,4-oxadiazolato]aluminum(III) (abbreviation: Al(OXD)$_3$), tris(2-hydroxyphenyl-1-phenyl-1H-benzimidazolato)aluminum(III) (abbreviation: Al(BIZ)$_3$), bis[2-(2-hydroxyphenyl)benzothiazolato]zinc(II) (abbreviation: Zn(BTZ)$_2$), or bis[2-(2-hydroxyphenyl)benzoxazolato]zinc(II) (abbreviation: Zn(PBO)$_2$) can be used. Further, a high molecular compound such as poly(2,5-pyridine-diyl) (abbreviation: PPy) can also be used as such a heteroaromatic compound. It is to be noted that the triplet excitation energy of the sixth organic compound as described above is preferably larger than that of a pyrazine-based organometallic complex.

The high light-emitting substance included in the light-emitting layer 813R can be a substance which emits phosphorescence. For example, bis[2-(2'-benzo[4,5-a]thienyl)pyridinato-N,C$^{3'}$]iridium(III) acetylacetonate (abbreviation: Ir(btp)$_2$(acac)), bis(1-phenylisoquinolinato-N,C$^{2'}$)iridium (III) acetylacetonate (abbreviation: Ir(piq)$_2$(acac)), tris(1-phenylisoquinolinato-N,C$^{2'}$)iridium(III) (abbreviation: Ir(piq)$_3$) and the like can be given. In particular, an organometallic complex which has a ligand of a pyrazine skeleton and whose central metal belongs to Group 9 or 10 (hereinafter referred to a pyrazine-based organometallic complex) emits phosphorescence with much higher efficiency as compared to known phosphorescent organometallic complexes, which is preferable.

Figure 28:
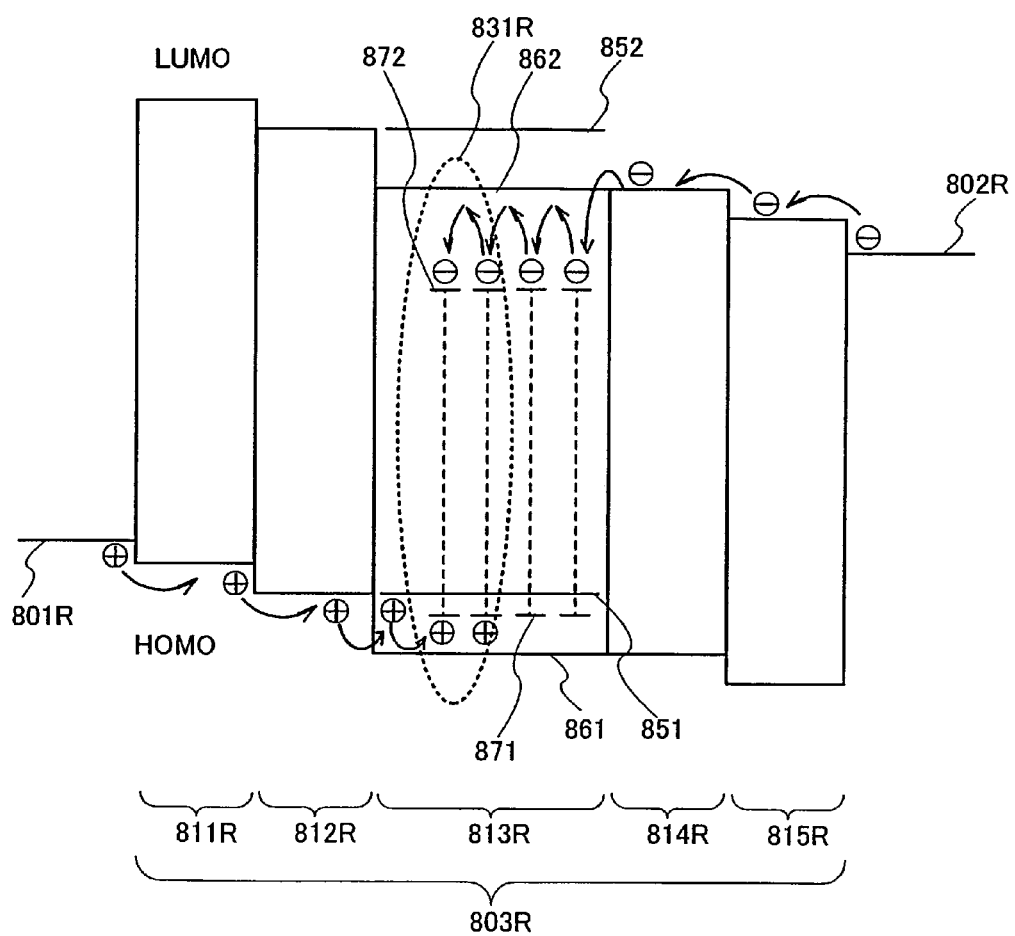
FIG. 28 illustrates an example of a structure of a light-emitting element of a light-emitting device of the present invention.

FIG. 28 exemplarily shows a band diagram of the red-light-emitting element shown in FIG. 25. The light-emitting layer 813R shown in FIG. 28 includes a fifth organic compound having a hole-transporting property, a sixth organic compound having an electron-transporting property, and a pyrazine-based organometallic complex. Since a LUMO level 872 of the pyrazine-based organometallic complex is lower than a LUMO level 852 of the fifth organic compound and a LUMO level 862 of the sixth organic compound, electrons are trapped by the LUMO level 872 of the pyrazine-based organometallic complex. It is to be noted that since the sixth organic compound has an electron-transporting property, some electrons are trapped by the LUMO level 872 of the pyrazine-based organometallic complex, but some electrons are transported through the LUMO level 872 of the pyrazine-based organometallic complex and to the hole-transporting layer 812R side little by little. On the other hand, since the fifth organic compound has a hole-transporting property and also a hole-accepting property, holes are injected into a HOMO level 211 of the fifth organic compound first. Holes are difficult to be injected into the HOMO level 861 of the sixth organic compound. At that time, by controlling the amount of the fifth organic compound, the mobility of the injected holes can be controlled. Thus, the mobility can be adjusted to the mobility of electrons coming from an electron-transporting layer 814R side. In other words, in the light-emitting layer 813R, holes and electrons can be balanced well. Holes are injected into a HOMO level 871 of the pyrazine-based organometallic complex and are recombined with electrons trapped there, so that light is emitted. In the light-emitting element having such a structure, the amounts of the fifth organic compound, the sixth organic compound, and the pyrazine-based organometallic complex which are included in the light-emitting layer 813R are controlled, so that the location of a light-emitting region 831R can be controlled.

As described above, the fifth organic compound, the sixth organic compound, and the pyrazine-based organometallic complex are combined as appropriate to constitute a light-emitting layer.

In the light-emitting layer, preferably, at least one of the fifth organic compound and the sixth organic compound serves as a host material and the pyrazine-based organometallic complex serves as a guest material. This is in order to prevent concentration quenching of the pyrazine-based organometallic complex. Also, this is in order that the carrier balance in the light-emitting layer can be adjusted by the fifth organic compound and the sixth organic compound.

Therefore, in the light-emitting element of this embodiment mode, preferably, the amount of the fifth organic compound and/or the sixth organic compound is larger than that of the pyrazine-based organometallic complex. In specific, its volume fraction or its mass fraction is preferably high. In addition, in terms of prevention of concentration quenching, the ratio of the pyrazine-based organometallic complex to the light-emitting layer is preferably from 1 mass % to 10 mass %, inclusive.

In the light-emitting layer, the mass ratio of the fifth organic compound to the sixth organic compound is preferably in the range of from 1:20 to 20:1. In other words, the mass ratio of the sixth organic compound to the fifth organic compound is preferably from 1/20 to 20, inclusive. If the mass ratio is out of the range, the state of the light-emitting layer may be substantially identical to the state in which only the fifth organic compound and the pyrazine-based organometallic complex are included in the light-emitting layer or the state in which only the sixth organic compound and the pyrazine-based organometallic complex are included in the light-emitting layer.

The mass ratio of the sixth organic compound to the fifth organic compound is more preferably from 1 to 20, inclusive. The range which is extremely effective for obtaining long lifetime is from 5 to 20, inclusive, in particular.

The electron-trapping property of the pyrazine-based organometallic complex used in this embodiment mode is often deeper than the LUMO level of the fifth organic compound and the LUMO level of the sixth organic compound by 0.2 eV or more, specifically. In such a case, the lifetime improvement and the efficiency improvement are significant, and thus one feature of the present invention is that the LUMO level of the pyrazine-based organometallic complex is deeper than the LUMO level of the fifth organic compound and the LUMO level of the sixth organic compound by 0.2 eV or more.

Next, layers other than the light-emitting layer 813R are described. A hole-transporting layer 812R and a hole-injecting layer 811R are not necessarily provided, and they may be provided as necessary. Specific materials for forming these layers are preferably hole-transporting compounds, and NPB, PPB, TPD, DFLDPBi, TDATA, m-MTDATA, TCTA, TPAC, TPAF, YGAO11, YGAF, CBP, mCP, TCzB, PVTPA, PVK or the like as described above can be used. An anthracene derivative having a low triplet excitation energy such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used.

This feature can be explained as below. The light-emitting layer 813R has a good carrier balance as described above, and the light-emitting region does not exist close to the interface between the light-emitting layer 813R and the hole-transporting layer 812R. Therefore, if a substance having lower triplet excitation energy than the pyrazine-based organometallic complex 223 is applied to the hole-transporting layer 812R, the substance is difficult to serve as a quencher to the pyrazine-based organometallic complex 223.

In other words, it is not necessary to consider the triplet excitation energy and thus a material used can be selected from a wider range of choices. Thus, a hole-transporting layer 812R can have a similar structure to the hole-transporting layer 812B. The hole-transporting layer 812R may be formed using the same material as the hole-transporting layer 812B or a different material from the hole-transporting layer 812B. In the case where the hole-transporting layer 812R is formed using the same material as the hole-transporting layer 812B, a light-emitting device can be formed without increasing the number of steps, which is preferable.

A hole-injecting layer 811R can have a similar structure to the hole-injecting layer 811B. The hole-injecting layer 811R may be formed using the same material as the hole-injecting layer 811B or a different material from the hole-injecting layer 811B. In the case where the hole-injecting layer 811R is formed using the same material as the hole-injecting layer 811B, a light-emitting device can be formed without increasing the number of steps, which is preferable.

The electron-transporting layer 814R and an electron-injecting layer 815R are not necessarily required, and may be provided as necessary. As a specific material which forms these layers, an electron-transporting compound is preferable. The above-described CO11, OXD-7, PBD, TPBI, TAZ, p-EtTAZ, TCzTRZ, TriMeQn, CzQn, DCzPQ, BPhen, BCP, BAlq, Al(OXD)$_3$, Al(BIZ)$_3$, Zn(BTZ)$_2$, Zn (PBO)$_2$, PPy, or the like can be used. A substance having a low triplet excitation energy such as tris(8-quinolinolato)aluminum(III) (abbreviation: Alq$_3$), tris(4-methyl-8-quinolinolato)aluminum (III) (abbreviation: Almq$_3$), or bis(10-hydroxybenzo[h]quinolinato)berylium(II) (abbreviation: BeBq$_2$) can be used (for example, it is reported that the phosphorescence spectrum of Alq is about 650 to 700 nm of deep red).

This feature can be explained as below. The light-emitting layer 813R has a good carrier balance as described above, and a light-emitting region does not exist close to the interface between the light-emitting layer 813R and the electron-transporting layer 814R. Therefore, even if a substance having a lower triplet excitation energy than the pyrazine-based organometallic complex is applied to the electron-transporting layer 814R, the substance is difficult to serve as a quencher to the pyrazine-based organometallic complex.

In other words, it is not necessary to consider the triplet excitation energy and thus a material used can be selected from a wider range of choices. The electron-transporting layer 814R can have a similar structure to the electron-transporting layer 814B. The electron-transporting layer 814R may be formed using the same material as the electron-transporting layer 814B or a different material from the electron-transporting layer 814B. In the case where the electron-transporting layer 814R is formed using the same material as the electron-transporting layer 814B, a light-emitting device can be formed without increasing the number of steps, which is preferable.

Similarly, the electron-injecting layer 815R can have a similar structure to the electron-injecting layer 815B. The electron-injecting layer 815R may be formed using the same material as the electron-injecting layer 815B or a different material from the electron-injecting layer 815B. In the case where the electron-injecting layer 815R is formed using the same material as the electron-injecting layer 815B, a light-emitting device can be formed without increasing the number of steps, which is preferable.

A cathode 802R can have a similar structure to the cathode 802B. The cathode 802R may be formed using the same material as the cathode 802B or a different material from the cathode 802B. In the case where the cathode 802R is formed using the same material as the cathode 802B, a light-emitting device can be formed without increasing the number of steps, which is preferable.

The blue-light-emitting element, the green-light-emitting element, and the red-light-emitting element can each have a suitable structure as described above, and thus the light-emitting device can have excellent characteristics.

Figure 29:
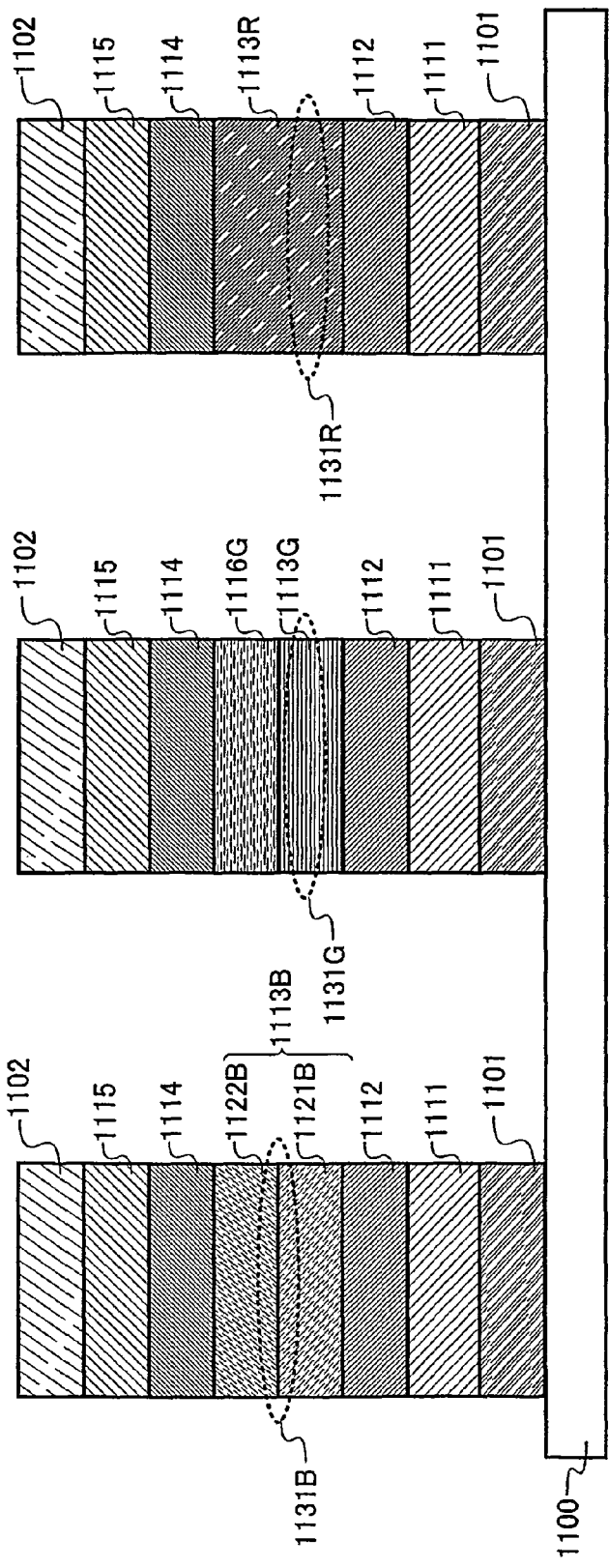
FIG. 29 is a cross-sectional view showing an example of a structure of a light-emitting element of a light-emitting device of the present invention.

Further, in the light-emitting device described in this embodiment mode, layers other than the light-emitting layer of the respective light-emitting devices can be formed in common. In other words, the layers other than the light-emitting layers can have the same structure. FIG. 29 illustrates a light-emitting device in which layers other than the light-emitting layers are formed in common, as an example. First, in each light-emitting element, an anode 1101, a hole-injecting layer 1111, and a hole-transporting layer 1112 are formed over a substrate 1100 in common. Then, a light-emitting layer 1113B, a light-emitting layer 1113G a layer 1116G for controlling carrier transfer, and a light-emitting layer 1113R are formed for the blue-light-emitting element, the green-light-emitting element, and the red-light-emitting element, respectively. Then, an electron-transporting layer 1114, an electron-injecting layer 1115, and a cathode 1802 are formed in each light-emitting element in common. As illustrated in FIG. 29, the layers other than the light-emitting layer have the same structure, thereby making it possible to simplify the manufacturing process of the light-emitting device.

Furthermore, in the light-emitting device described in this embodiment mode, the light-emitting regions of the light-emitting layers in the respective light-emitting elements are different from each other. In specific, it is possible to arrange the respective light-emitting region closer to the electrode serving as an anode in the order of the blue-light-emitting element, the green-light-emitting element, and the red-light-emitting element. As described above, in the blue-light-emitting element, the light-emitting region 1131B exists near the interface between the first light-emitting layer 1121B and the second light-emitting layer 1122B. In the green-light-emitting element, the light-emitting region 1131G exists in a portion from the light-emitting layer 1113G to the vicinity of the interface between the light-emitting layer 1113G and the layer 1116G for controlling carrier transfer. In the red-light-emitting element, the amounts of the fifth organic compound, the sixth organic compound, and the pyrazine-based organometallic complex included in the light-emitting layer 1113R are adjusted, so that the location of the light-emitting region 1131R can be controlled. Accordingly, when a reflective electrode is used as the cathode, the design can be made such that the light-emitting region of the blue-light-emitting element having a short emission wavelength exists closest to the cathode, and as the emission wavelengths of the light-emitting elements are longer, the green-light-emitting element and the red-light-emitting element are arranged in this order in the way that the distance from the cathode is longer. In other words, the structure is suitable for optical design of light-emitting elements. Therefore, the distance to the reflective electrode can be an optical distance which is suitable for the emission wavelength, which leads to increase of extraction efficiency of light.

As a method forming the EL layer, various methods can be used regardless of a dry process or a wet process. For example, a vacuum evaporation method, an ink-jet method, a spin coating method, or the like may be used. Further, different deposition methods may be used for different electrodes or different layers.

For example, among the above-described materials, a high molecular compound may be used to form the EL layer by a wet process. Alternatively, a low molecular organic compound may be used to form the EL layer by a wet process.

Further, it is also possible to form the EL layer by using a low molecular organic compound and using a dry process such as a vacuum evaporation method.

Similarly, the electrodes can be formed by a wet process such as a sol-gel process or by a wet process with a paste of a metal material. Alternatively, the electrodes can be formed by a dry process such as a sputtering method or a vacuum evaporation method.

In the case where the light-emitting element shown in this embodiment mode is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even when a large substrate is used.

In the light-emitting element having the above-described structure which is shown in this embodiment mode, current flows when a voltage is applied between the anode 801 and the cathode 802. At that time, holes and electrons are recombined in the light-emitting layer 813, which is a layer including a high light-emitting substance, so that light is emitted. In other words, the light-emitting region is formed in the light-emitting layer 813.

Light is extracted outside through one or both of the anode 801 and the cathode 802. Therefore, one or both of the anode 801 and the cathode 802 is a light-transmitting electrode. When only the anode 801 is a light-transmitting electrode, light is extracted from the substrate side through the anode 801. Meanwhile, when only the cathode 802 is a light-transmitting electrode, light is extracted from a side opposite to the substrate side through the cathode 802. When both of the anode 801 and the cathode 802 are light-transmitting electrodes, light is extracted from both the substrate side and the side opposite to the substrate side through the anode 801 and the cathode 802.

Figure 30:
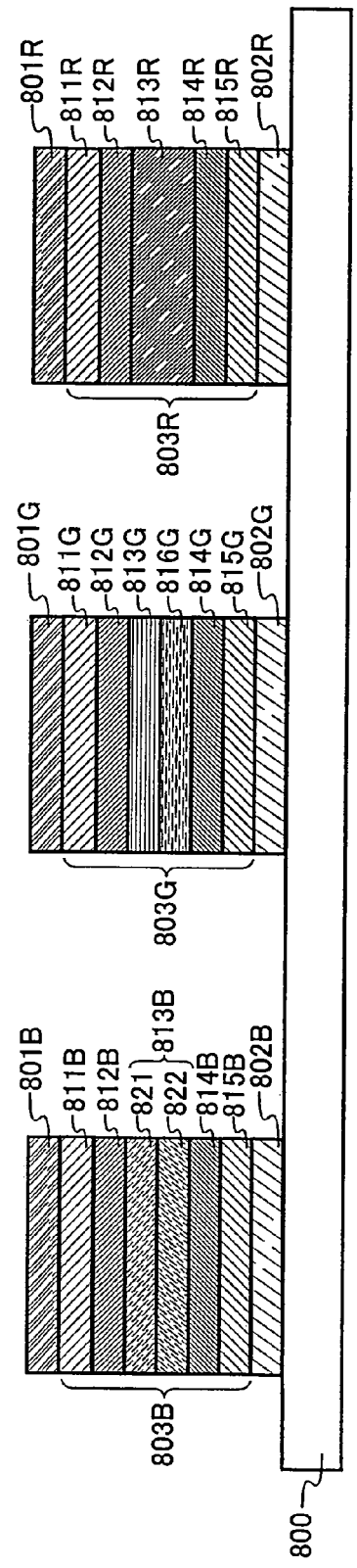
FIG. 30 is a cross-sectional view showing an example of a structure of a light-emitting element of a light-emitting device of the present invention.

Although FIG. 25 illustrates the structure in which the anode 801 is provided on the substrate 800 side, the cathode 802 may be provided on the substrate 800 side. In FIG. 30, the cathode 802, the EL layer 803, and the anode 801 are stacked over the substrate 800 in this order. The layers included in the EL layer 803 are stacked in the inverse order of the structure illustrated in FIG. 25.

This embodiment mode can be combined with the structure of a light-emitting device which is described in any of other embodiment modes in this specification as appropriate.

Embodiment Mode 9

This embodiment mode describes various electric appliances manufactured using a light-emitting device which is manufactured by applying the present invention, with reference to FIGS. 24A to 24E.

Examples of the electric appliances each including a light-emitting device which is manufactured by applying the present invention include: televisions, cameras such as video cameras or digital cameras, goggle displays (head mount displays), navigation systems, audio reproducing devices (e.g., car audio component stereos and audio component stereos), notebook personal computers, game machines, portable information terminals (e.g., mobile computers, mobile phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic appliances are illustrated in FIGS. 24A to 24E.

Figure 24A:
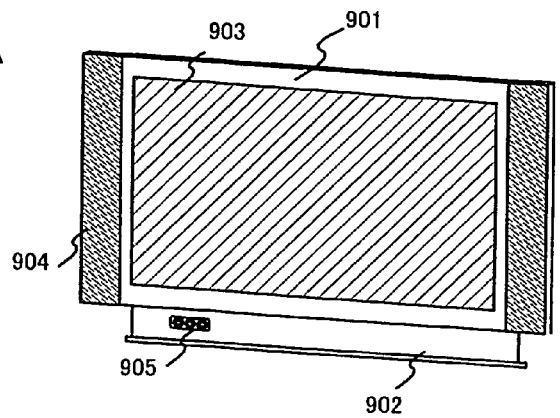
FIGS. 24A to 24E are perspective views each showing an example of a usage pattern of a light-emitting device of the present invention.

FIG. 24A illustrates a display device including a chassis 901, a supporting base 902, a display portion 903, a speaker portion 904, a video input terminal 905, and the like. The display device is manufactured using a light-emitting device manufactured using the film formation apparatus of the present invention, for the display portion 903 or the like. It is to be noted that the display device includes all devices for displaying information, for example, for a personal computer, for receiving TV broadcasting, and for displaying an advertisement. By manufacture of the display portion 903 or the like using the SOI substrate described in Embodiment Mode 1, a display device can be provided in which display unevenness is suppressed.

Figure 24B:
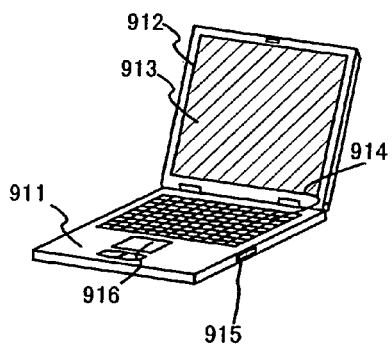

FIG. 24B illustrates a notebook personal computer including a main body 911, a chassis 912, a display portion 913, a keyboard 914, an external connection port 915, a pointing device 916, and the like. The notebook personal computer is manufactured using a light-emitting device formed using the present invention, for the display portion 913. By manufacture using the SOI substrate described in Embodiment Mode 1, a notebook personal computer can be provided in which display unevenness of the display portion 913 is suppressed.

Figure 24C:
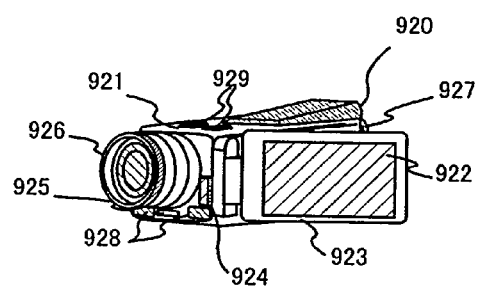

FIG. 24C illustrates a video camera including a main body 921, a display portion 922, a chassis 923, an external connection port 924, a remote control receiving portion 925, an image receiving portion 926, a battery 927, an audio input portion 928, operation keys 929, an eyepiece portion 920, and the like. The video camera is manufactured using a light-emitting device manufactured using the present invention, for the display portion 922. By manufacture using the SOI substrate described in Embodiment Mode 1, a video camera can be provided in which display unevenness of the display portion 922 is suppressed.

Figure 24D:
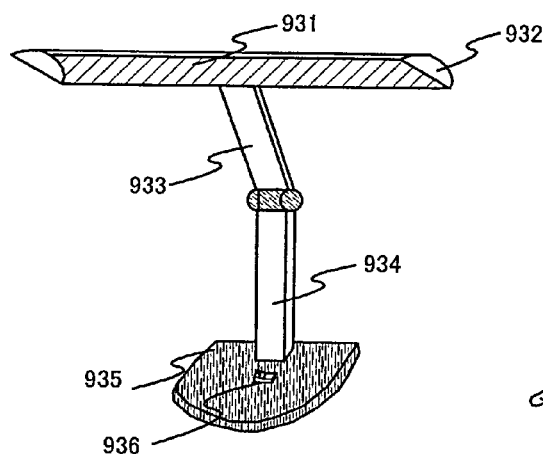

FIG. 24D illustrates a desk lamp including a lighting portion 931, a shade 932, an adjustable arm 933, a support 934, a base 935, and a power supply 936. The desk lamp is manufactured using a light-emitting device formed using the present invention, for the lighting portion 931. It is to be noted that the lighting equipment includes a ceiling light, a wall light, and the like.

Figure 24E:
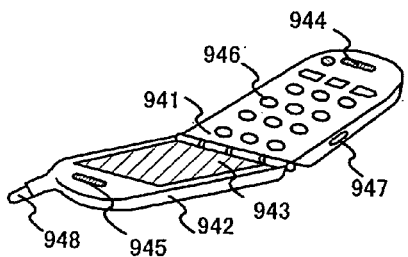

FIG. 24E illustrates a mobile phone including a main body 941, a chassis 942, a display portion 943, an audio input portion 944, an audio output portion 945, operation keys 946, an external connection port 947, an antenna 948, and the like. By manufacture using the SOI substrate described in Embodiment Mode 1 for the display portion 943, a mobile phone can be provided in which display unevenness of the display portion 943 is suppressed.

In the above-described manner, electric appliances (electronic devices, lighting equipment, or the like) using the light-emitting device formed using the present invention can be obtained. The applicable range of the light-emitting device formed using the present invention is so wide that the light-emitting device can be applied to electric appliances in various fields besides the electric appliances described here.

This application is based on Japanese Patent Application serial no. 2007-132803 filed with Japan Patent Office on May 18, 2007, the entire contents of which are hereby incorporated by reference.

What is claimed is:

1. A light-emitting device comprising:
    a substrate;
    a silicon oxide layer over the substrate;
    a nitrogen-containing layer over the silicon oxide layer;
    an oxide film over the nitrogen-containing layer, the oxide film comprising a halogen element;
    a pixel portion comprising:
        a first transistor comprising a first semiconductor layer comprising a first channel formation region, a first impurity region and a second impurity region between the first impurity region and the first channel formation region wherein a concentration of impurity elements in the second impurity region is lower than a concentration of impurity elements in the first impurity region;
        a light-emitting element electrically connected to the first impurity region, the light-emitting element being configured to emit white light;
        a black matrix over the first transistor, the black matrix overlapping with at least a part of the first semiconductor layer; and
        a color filter over the light-emitting element; and
    a driver circuit configured to output an analog video signal into a gate electrode of the first transistor such that an amount of a current flowing in the light-emitting element is changed in accordance with a potential applied to the gate electrode of the first transistor, the driver circuit comprising a second transistor comprising a second semiconductor layer comprising a second channel formation region,
    wherein each of the first semiconductor layer and the second semiconductor layer is a single-crystal semiconductor layer provided over the substrate with the silicon oxide layer, the nitrogen-containing layer and the oxide film provided therebetween.

2. The light-emitting device according to claim 1, wherein the single-crystal semiconductor layer is provided by separating from, a single-crystal semiconductor substrate.

3. The light-emitting device according to claim 1, wherein the silicon oxide layer is provided by a chemical vapor deposition method using an organosilane as a source gas.

4. The light-emitting device according to claim 1, wherein the substrate is a glass substrate.

5. The light-emitting device according to claim 1, wherein the first semiconductor layer comprises a halogen element.

6. A light-emitting device comprising:
    a substrate;
    a silicon oxide layer over the substrate;
    a nitrogen-containing layer over the silicon oxide layer;
    an oxide film over the nitrogen-containing layer, the oxide film comprising a halogen element;
    a scanning line provided over the substrate;
    a signal line provided over the substrate;
    a power supply line provided over the substrate;
    a pixel portion comprising:
        a first transistor comprising:
            a first semiconductor layer comprising a first channel formation region, the first semiconductor layer being electrically connected to the signal line; and
            a first gate electrode electrically connected to the scanning line;
        a second transistor comprising:
            a second semiconductor layer comprising a second channel formation region, a first impurity region and a second impurity region between the first impurity region and the second channel formation region wherein a concentration of impurity elements in the second impurity region is lower than a concentration of impurity elements in the first impurity region, electrically connected to the power supply line; and a second gate electrode electrically connected to the first semiconductor layer;

a light-emitting element electrically connected to the first impurity region, the light-emitting element being configured to emit white light;

a black matrix over the second transistor, the black matrix overlapping with at least a part of the second semiconductor layer; and a color filter over the light-emitting element; and a driver circuit configured to output an analog video signal into the second gate electrode of the second transistor such that an amount of a current flowing in the light-emitting element is changed in accordance with a potential applied to the second gate electrode of the second transistor, the driver circuit comprising a third transistor comprising a third semiconductor layer comprising a third channel formation region, wherein each of the first semiconductor layer, the second semiconductor layer and the third semiconductor layer is a single-crystal semiconductor layer provided over the substrate with the silicon oxide layer, the nitrogen-containing layer and the oxide film provided therebetween.

7. The light-emitting device according to claim 6, wherein the pixel portion further comprises a capacitor electrically connected between the second gate electrode and the power supply line.

8. The light-emitting device according to claim 6, wherein the single-crystal semiconductor layer is provided by separating from a single-crystal semiconductor substrate.

9. The light-emitting device according to claim 6, wherein the silicon oxide layer is provided by a chemical vapor deposition method using an organosilane as a source gas.

10. The light-emitting device according to claim 6, wherein the substrate is a glass substrate.

11. The light-emitting device according to claim 6 wherein the first semiconductor layer comprises a halogen element.

12. A light-emitting device comprising:
a substrate;
a silicon oxide layer over the substrate;
a nitrogen-containing layer over the silicon oxide layer;
an oxide film over the nitrogen-containing layer, the oxide film comprising a halogen element;
a first scanning line provided over the substrate;
a second scanning line provided over the substrate;
a signal line provided over the substrate;
a power supply line provided over the substrate;
a pixel portion comprising:
 a first transistor comprising:
  a first semiconductor layer comprising a first channel formation region, the first semiconductor layer being electrically connected to the signal line; and
  a first gate electrode electrically connected to the first scanning line;
 a second transistor comprising:
  a second semiconductor layer comprising a second channel formation region, a first impurity region and a second impurity region between the first impurity region and the second channel formation region wherein a concentration of impurity elements in the second impurity region is lower than a concentration of impurity elements in the first impurity region, electrically connected to the power supply line; and
  a second gate electrode electrically connected to the first semiconductor layer;
 a third transistor comprising:
  a third semiconductor layer comprising a third channel formation region electrically connected between the power supply line and the second gate electrode; and
  a third gate electrode electrically connected to the second scanning line;
a light-emitting element electrically connected to the first impurity region, the light-emitting element being configured to emit white light;
a black matrix over the second transistor, the black matrix overlapping with at least a part of the second semiconductor layer; and
a color filter over the light-emitting element; and
a driver circuit configured to output an analog video signal into the second gate electrode of the second transistor such that an amount of a current flowing in the light-emitting element is changed in accordance with a potential applied to the second gate electrode of the second transistor, the driver circuit comprising a fourth transistor comprising a fourth semiconductor layer comprising a fourth channel formation region, wherein each of the first semiconductor layer, the second semiconductor layer, the third semiconductor layer and the fourth semiconductor layer is a single-crystal semiconductor layer provided over the substrate with the silicon oxide layer, the nitrogen-containing layer and the oxide film provided therebetween.

13. The light-emitting device according to claim 12, wherein the pixel portion further comprises a capacitor electrically connected between the second gate electrode and the power supply line.

14. The light-emitting device according to claim 12, wherein the single-crystal semiconductor layer is provided by separating from a single-crystal semiconductor substrate.

15. The light-emitting device according to claim 12, wherein the silicon oxide layer is provided by a chemical vapor deposition method using an organosilane as a source gas.

16. The light-emitting device according to claim 12, wherein the substrate is a glass substrate.

17. The light-emitting device according to claim 12, wherein the first semiconductor layer comprises a halogen element.

18. A light-emitting device comprising:
a silicon oxide layer over a first substrate;
a nitrogen-containing layer over the silicon oxide layer;
an oxide film over the nitrogen-containing layer, the oxide film comprising a halogen element;
a transistor over the oxide film, the transistor comprising a single-crystal semiconductor layer and a gate electrode overlapping with the single-crystal semiconductor layer;
a light-emitting element over the first substrate, the light-emitting element being electrically connected to the single-crystal semiconductor layer;
a black matrix over the transistor, the black matrix overlapping with at least a part of the single-crystal semiconductor layer; and
a color filter over the light-emitting element,
wherein the light-emitting element is configured to emit white light.

19. The light-emitting device according to claim 18, further comprising a driver circuit configured to output an analog video signal into the gate electrode of the transistor such that an amount of a current flowing in the light-emitting element is changed in accordance with a potential applied to the gate electrode of the transistor.

20. The light-emitting device according to claim 18, further comprising a bonding layer over the first substrate,
wherein the single-crystal semiconductor layer is bonded to the first substrate with the bonding layer arranged between the first substrate and the single-crystal semiconductor layer.

21. The light-emitting device according to claim 18, wherein the first substrate is a glass substrate.

22. The light-emitting device according to claim 18, further comprising a second substrate with the color filter arranged between the second substrate and the light-emitting element,
wherein the white light is emitted in a direction toward the second substrate.

23. A light-emitting device comprising:
a silicon oxide layer over a first substrate;
a nitrogen-containing layer over the silicon oxide layer;
an oxide film over the nitrogen-containing layer, the oxide film comprising a halogen element;
a first transistor over the oxide film, the first transistor comprising a single-crystal semiconductor layer and a gate electrode overlapping with the single-crystal semiconductor layer;
a light-emitting element over the first substrate, the light-emitting element being electrically connected to the single-crystal semiconductor layer;
a black matrix over the first transistor, the black matrix overlapping with at least a part of the single-crystal semiconductor layer;
a color filter over the light-emitting element;
a second transistor;
a capacitor,
wherein one of a source and a drain of the first transistor is electrically connected to the light-emitting element,
wherein one of a source and a drain of the second transistor is electrically connected to the gate electrode of the first transistor,
wherein one electrode of the capacitor is electrically connected to the gate electrode of the first transistor, and
wherein the light-emitting element is configured to emit white light.

24. The light-emitting device according to claim 23, further comprising a driver circuit configured to output an analog video signal into the gate electrode of the first transistor such that an amount of a current flowing in the light-emitting element is changed in accordance with a potential applied to the gate electrode of the first transistor.

25. The light-emitting device according to claim 23, further comprising a bonding layer over the first substrate,
wherein the single-crystal semiconductor layer is bonded to the first substrate with the bonding layer arranged between the first substrate and the single-crystal semiconductor layer.

26. The light-emitting device according to claim 23, wherein the first substrate is a glass substrate.

27. The light-emitting device according to claim 23, further comprising a second substrate with the color filter arranged between the second substrate and the light-emitting element,
wherein the white light is emitted in a direction toward the second substrate.

* * * * *